United States Patent
Kim

(10) Patent No.: US 10,490,554 B2
(45) Date of Patent: Nov. 26, 2019

(54) SEMICONDUCTOR DEVICE AND METHOD OF FABRICATING THE SAME

(71) Applicant: Samsung Electronics Co., Ltd., Suwon-si, Gyeonggi-do (KR)

(72) Inventor: Seongho Kim, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/281,846

(22) Filed: Feb. 21, 2019

(65) Prior Publication Data

US 2019/0189616 A1 Jun. 20, 2019

Related U.S. Application Data

(63) Continuation of application No. 15/196,612, filed on Jun. 29, 2016, now Pat. No. 10,217,747, which is a (Continued)

(30) Foreign Application Priority Data

Aug. 30, 2012 (KR) ..................... 10-2012-0095799

(51) Int. Cl.
*H01L 27/108* (2006.01)
*H01L 27/088* (2006.01)

(52) U.S. Cl.
CPC ...... *H01L 27/10814* (2013.01); *H01L 27/088* (2013.01); *H01L 27/10823* (2013.01); (Continued)

(58) Field of Classification Search
CPC ............... H01L 27/10855; H01L 27/10814
See application file for complete search history.

(56) References Cited

U.S. PATENT DOCUMENTS 8,053,341 B2  11/2011  Kim
2001/0025973 A1  10/2001  Yamada et al.
(Continued)

FOREIGN PATENT DOCUMENTS

KR  10-1075526  10/2011
KR  10-1076780  10/2011
(Continued)

OTHER PUBLICATIONS

Sung-Young Lee, et al. "Three-Dimensional Multi-Bridge-Channel MOSFET (MBCFET) Fabricated on Bulk Si-substrate". Device Research Conference, 2004. 62nd DRC Congerence Digest. pp. 119-120.
(Continued)

*Primary Examiner* — Amar Movva
(74) *Attorney, Agent, or Firm* — Harness, Dickey & Pierce, P.L.C.

(57) ABSTRACT

According to example embodiments, a semiconductor device may include a substrate having an upper surface defining a groove and an active region, a device isolation layer in the groove, and a contact structure on the active region. The device isolation exposes the active region and may have a top surface that is higher than a top surface of the active region. The contact structure may include a first portion filling a gap region delimited by a sidewall of the device isolation layer and the top surface of the active region, the contact structure may include and a second portion on the device isolation layer so the second portion overlaps with the device isolation layer in a plan view.

12 Claims, 59 Drawing Sheets

Related U.S. Application Data continuation of application No. 13/967,158, filed on Aug. 14, 2013, now abandoned.

(52) U.S. Cl.
CPC .. *H01L 27/10855* (2013.01); *H01L 27/10876* (2013.01); *H01L 27/10885* (2013.01); *H01L 27/10894* (2013.01)

(56) References Cited

U.S. PATENT DOCUMENTS

| | | |
|---|---|---|
| 2003/0015675 A1 | 1/2003 | Yutani |
| 2010/0081395 A1 | 4/2010 | Woo et al. |
| 2011/0147833 A1 | 6/2011 | Cho |
| 2011/0156262 A1 | 6/2011 | Shin et al. |
| 2012/0153383 A1 | 6/2012 | Shin et al. |

FOREIGN PATENT DOCUMENTS

| | | |
|---|---|---|
| KR | 10-1094400 B1 | 12/2011 |
| KR | 10-1095063 B1 | 12/2011 |
| KR | 20110132753 A | 12/2011 |
| KR | 20120003720 A | 1/2012 |
| KR | 10-1120179 B1 | 2/2012 |
| KR | 20120012222 A | 2/2012 |
| KR | 20120042575 A | 5/2012 |

OTHER PUBLICATIONS

Final Office Action in corresponding U.S. Appl. No. 13/967,158 dated Jun. 30, 2016.

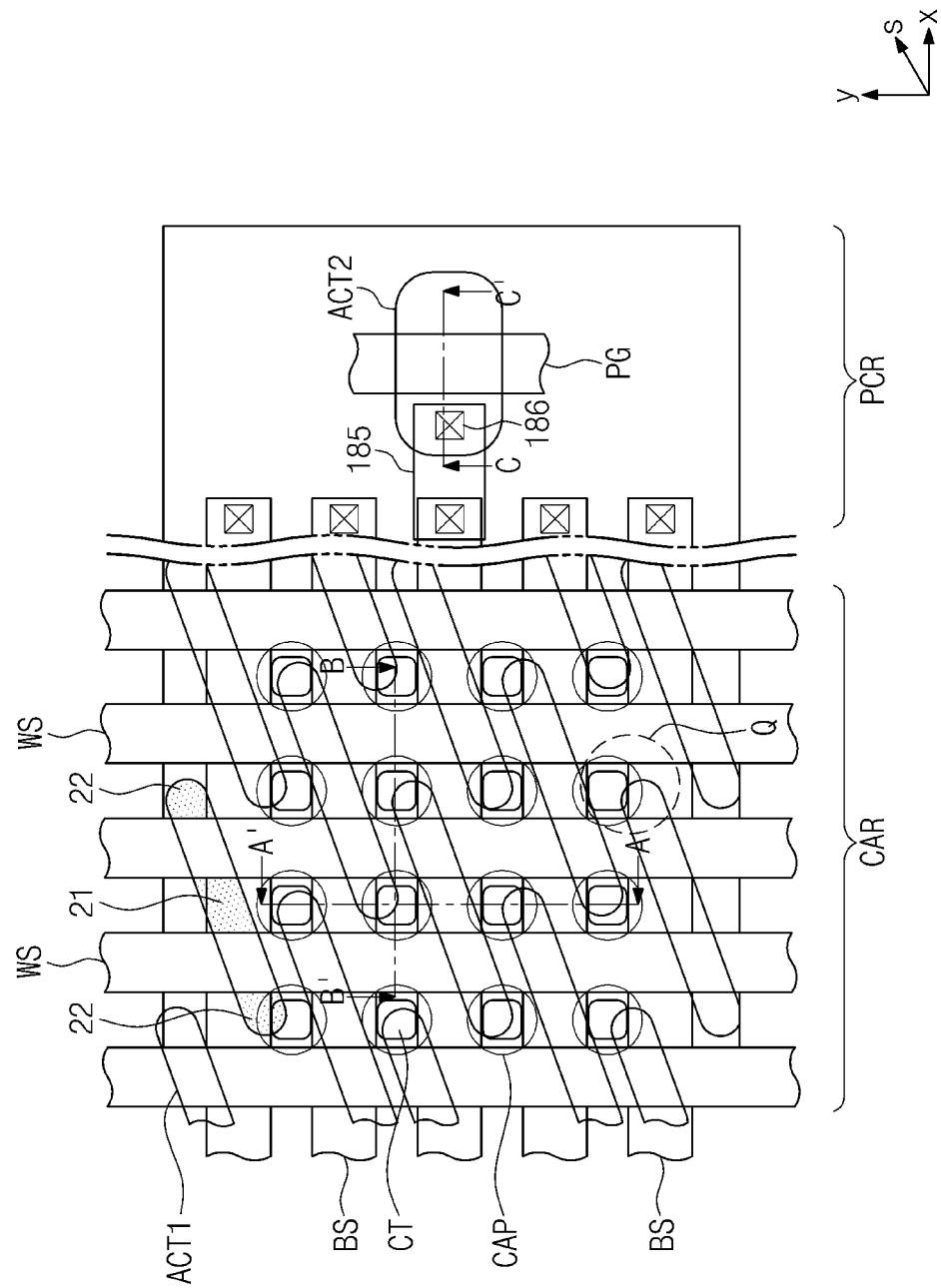

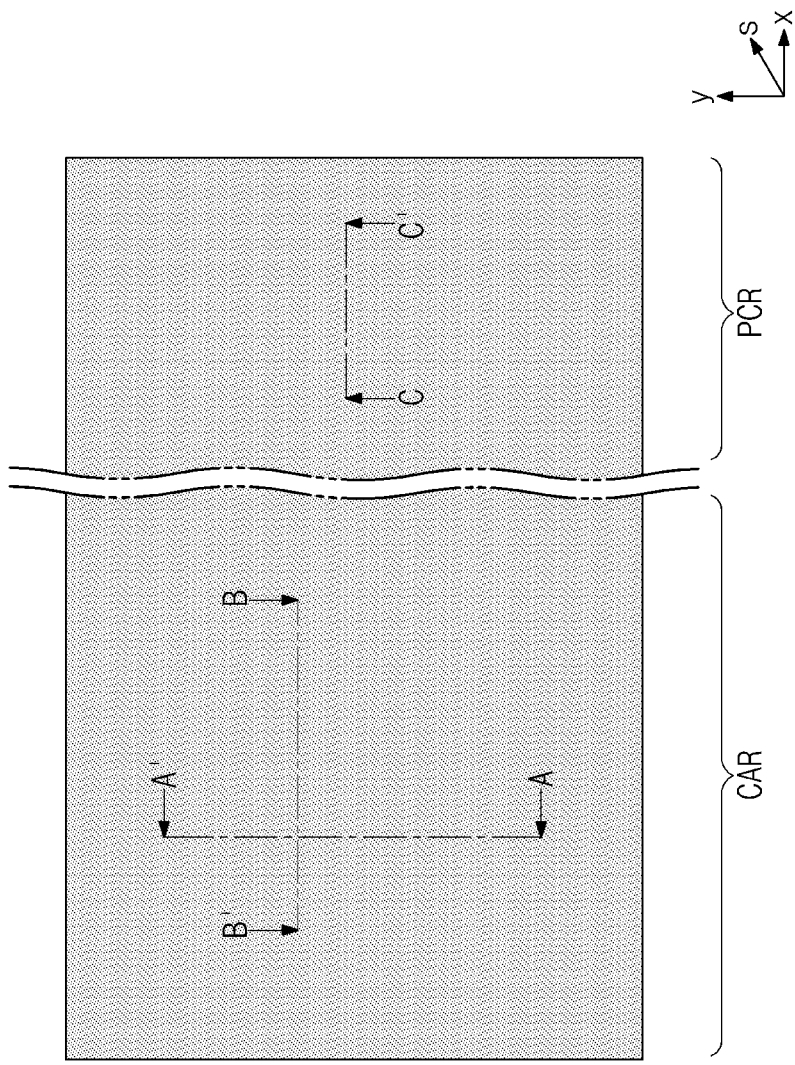

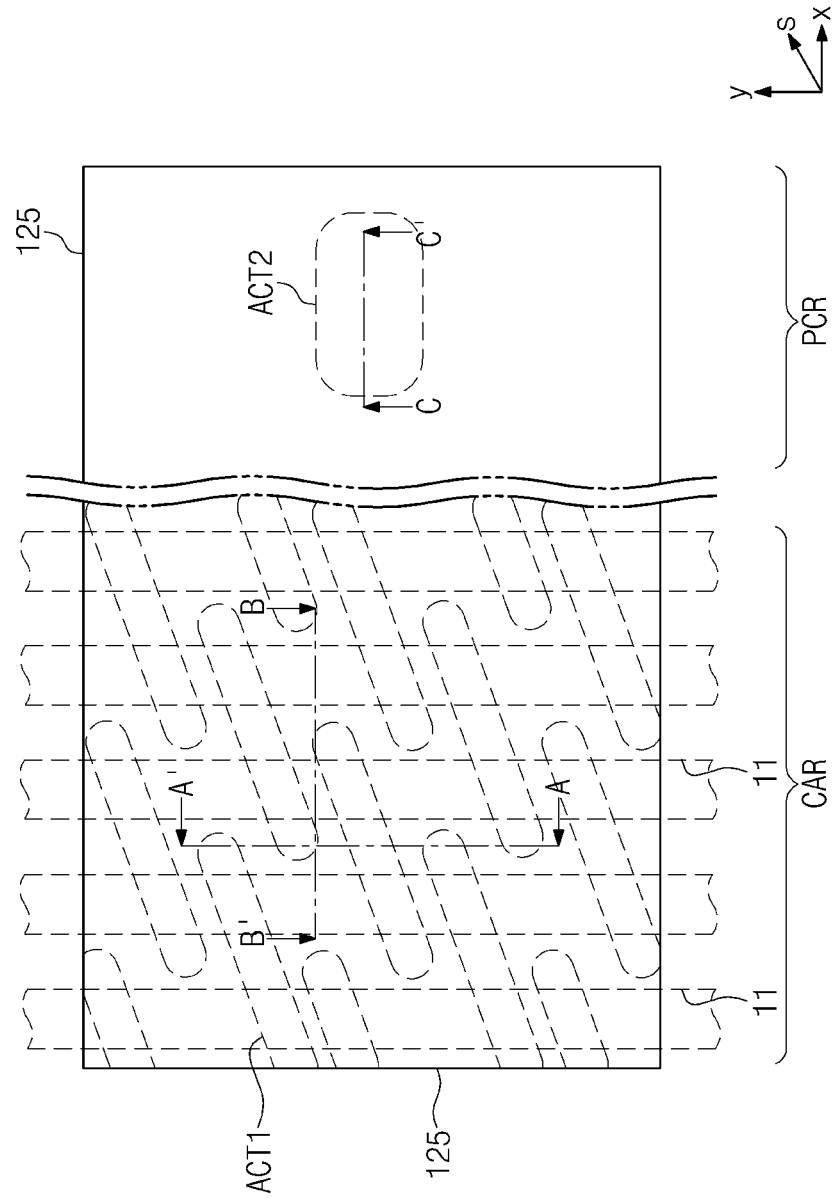

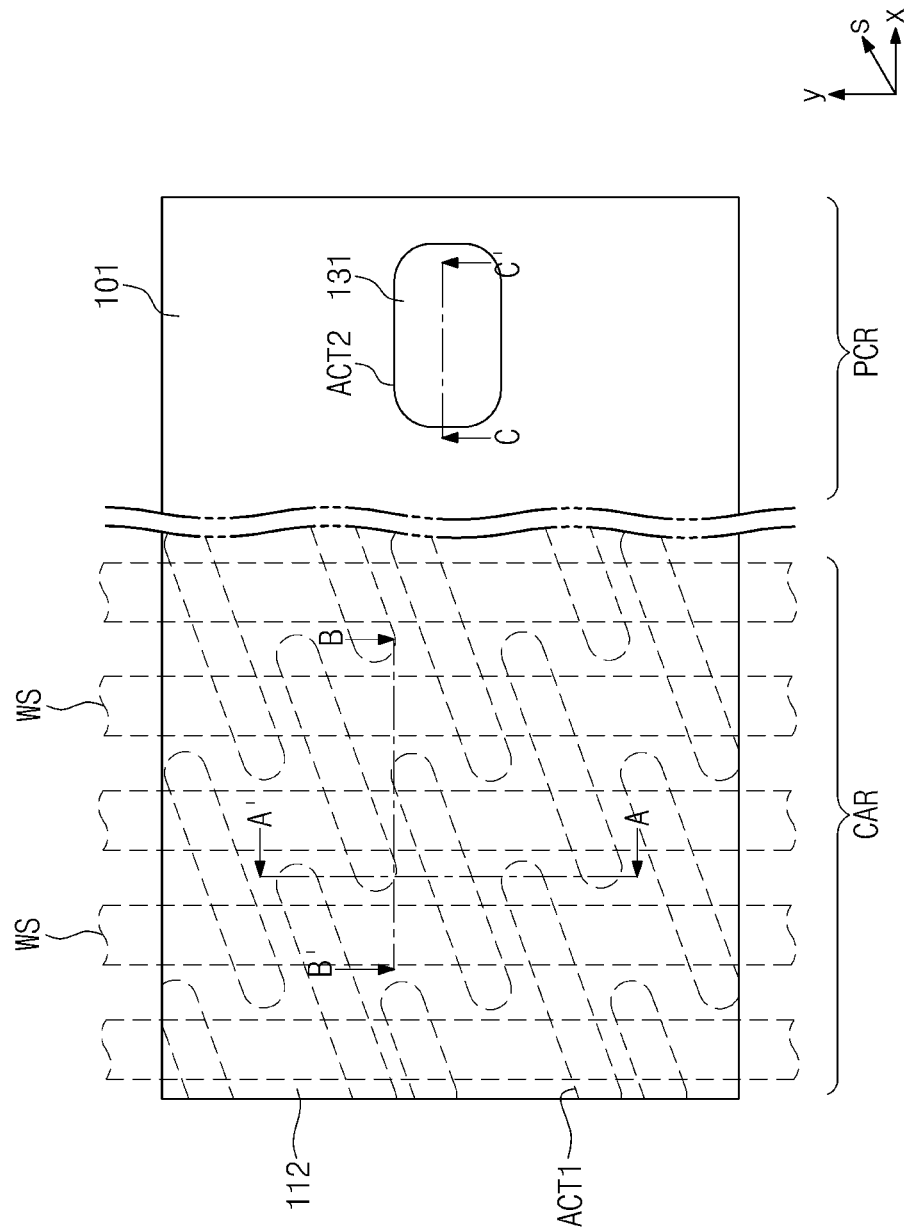

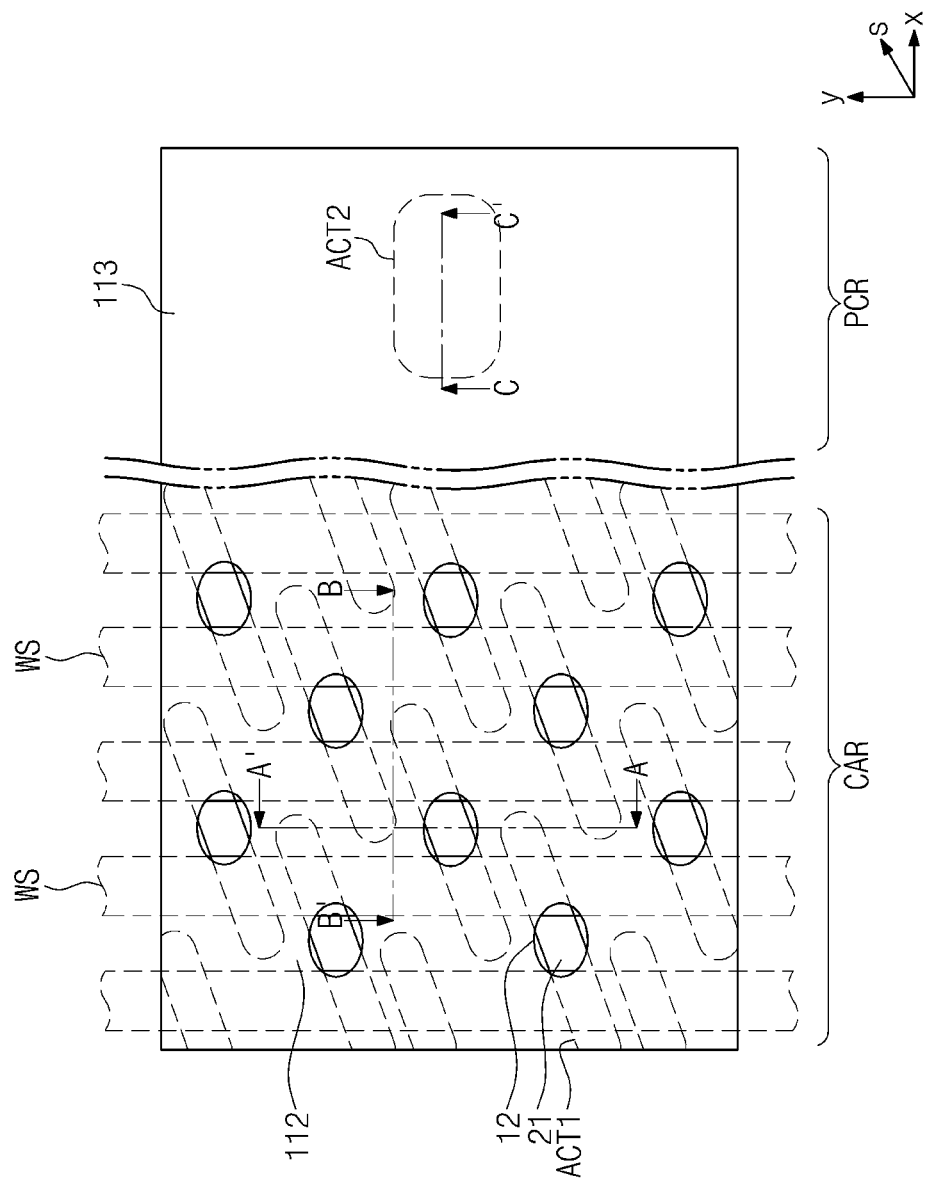

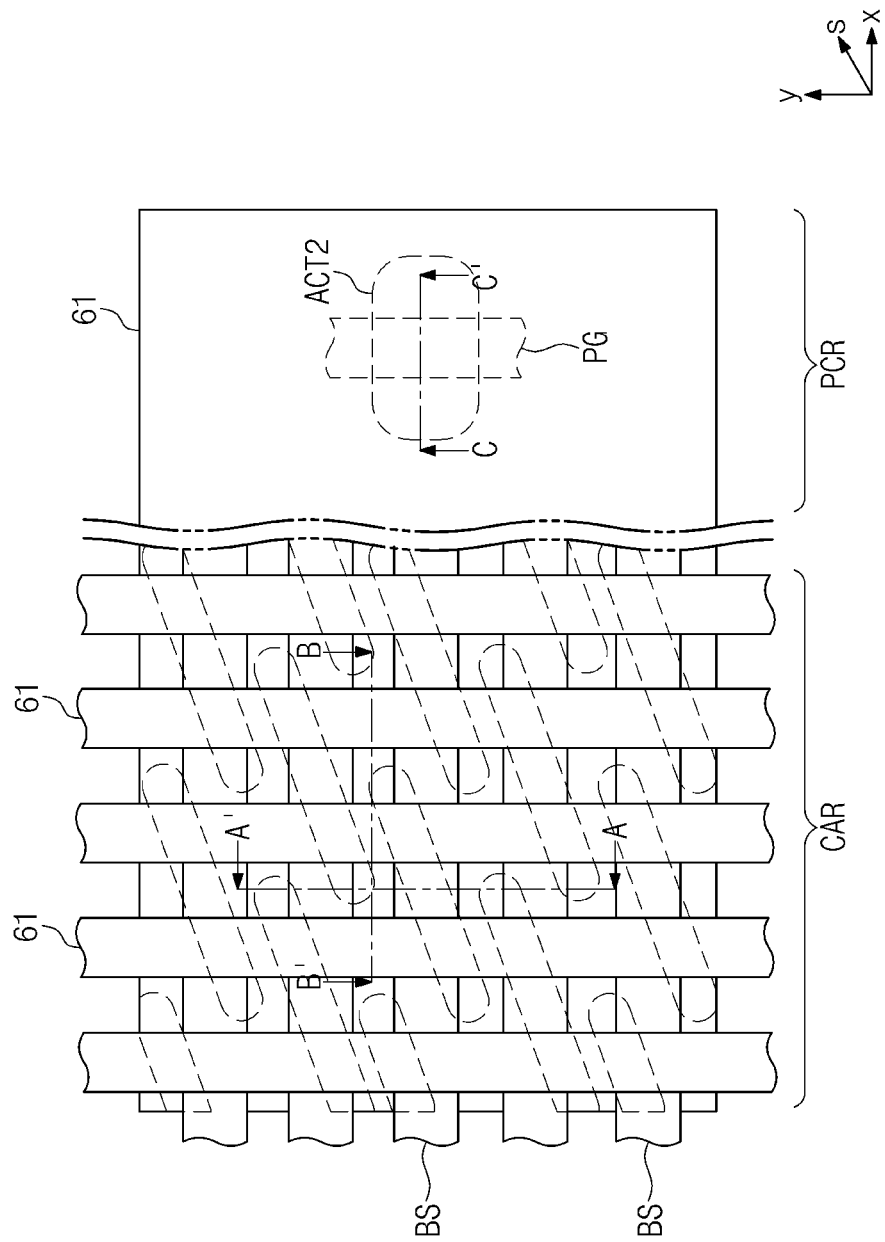

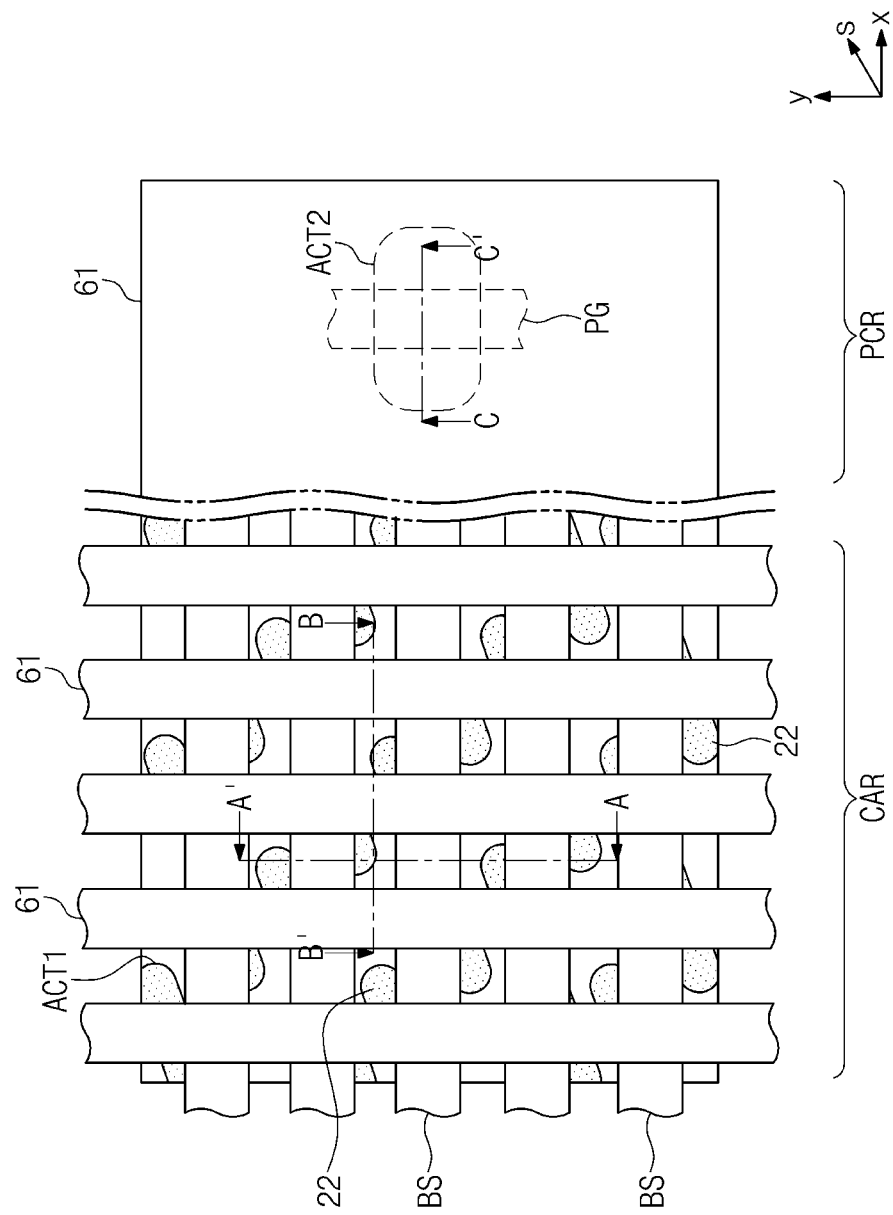

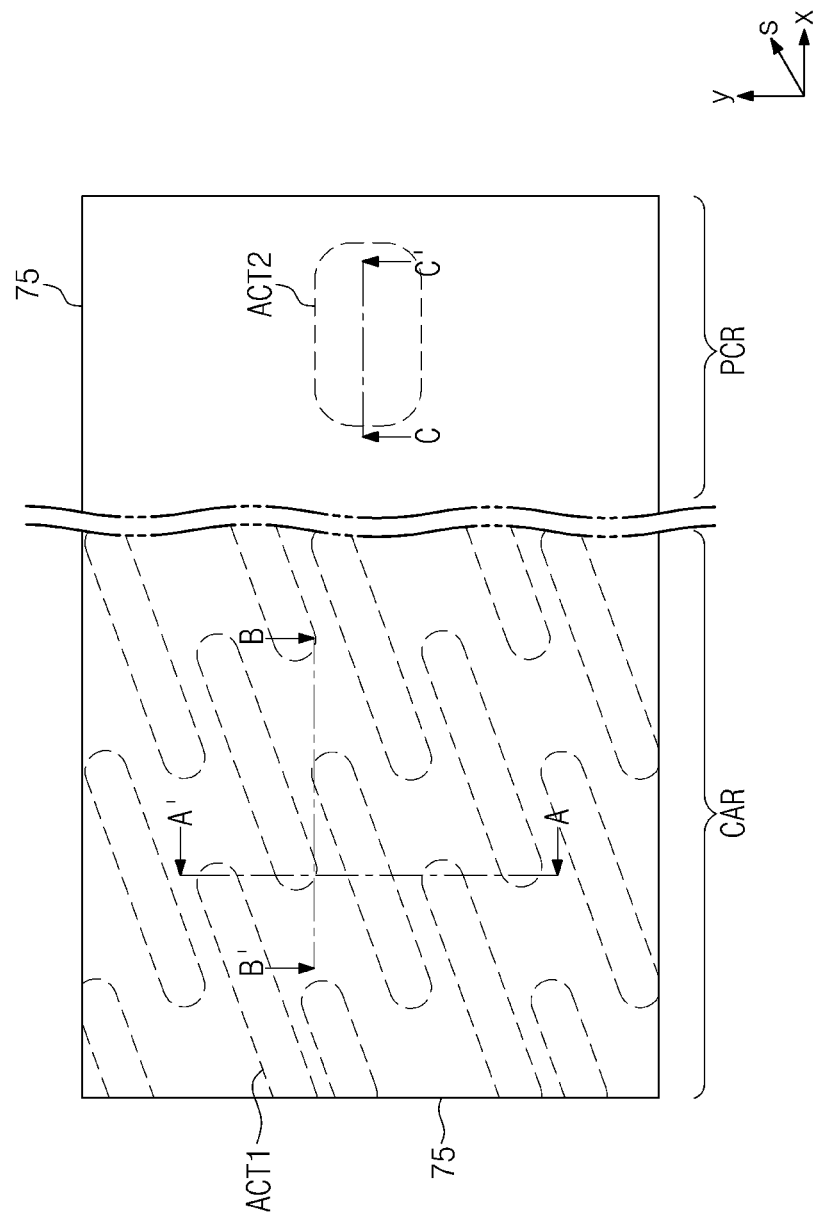

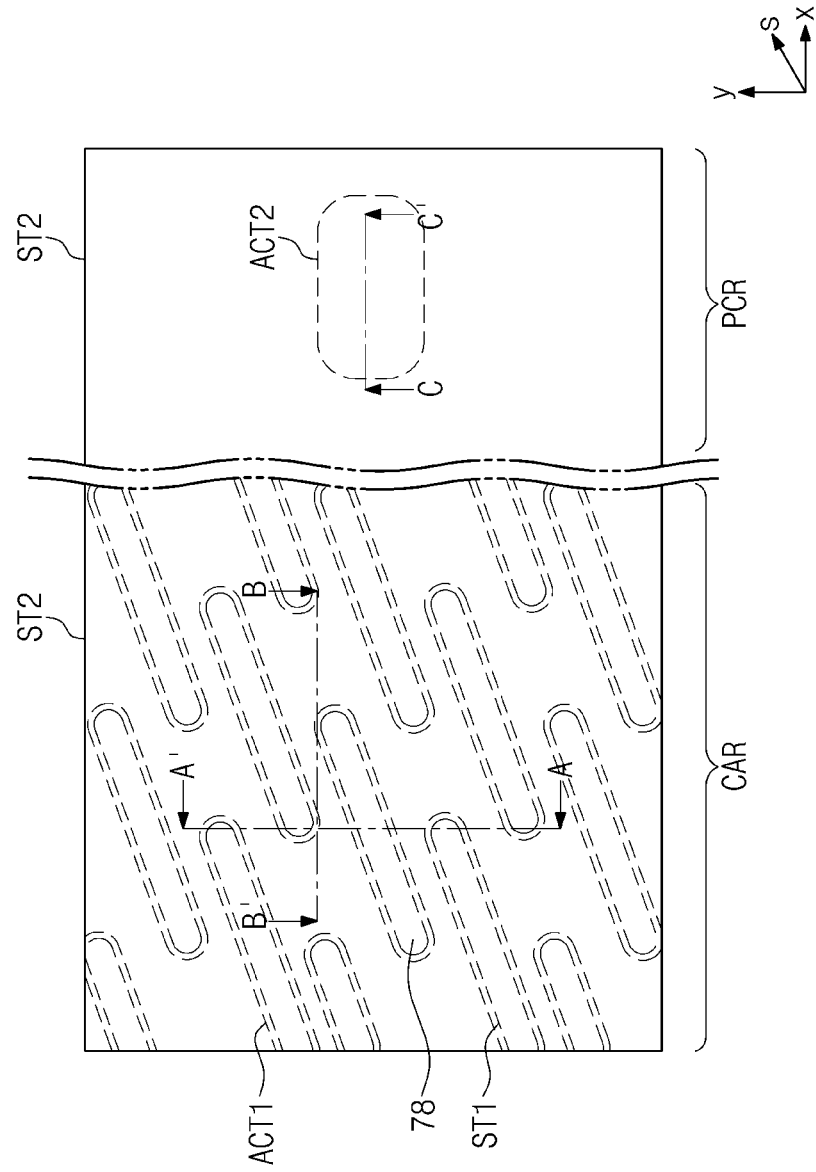

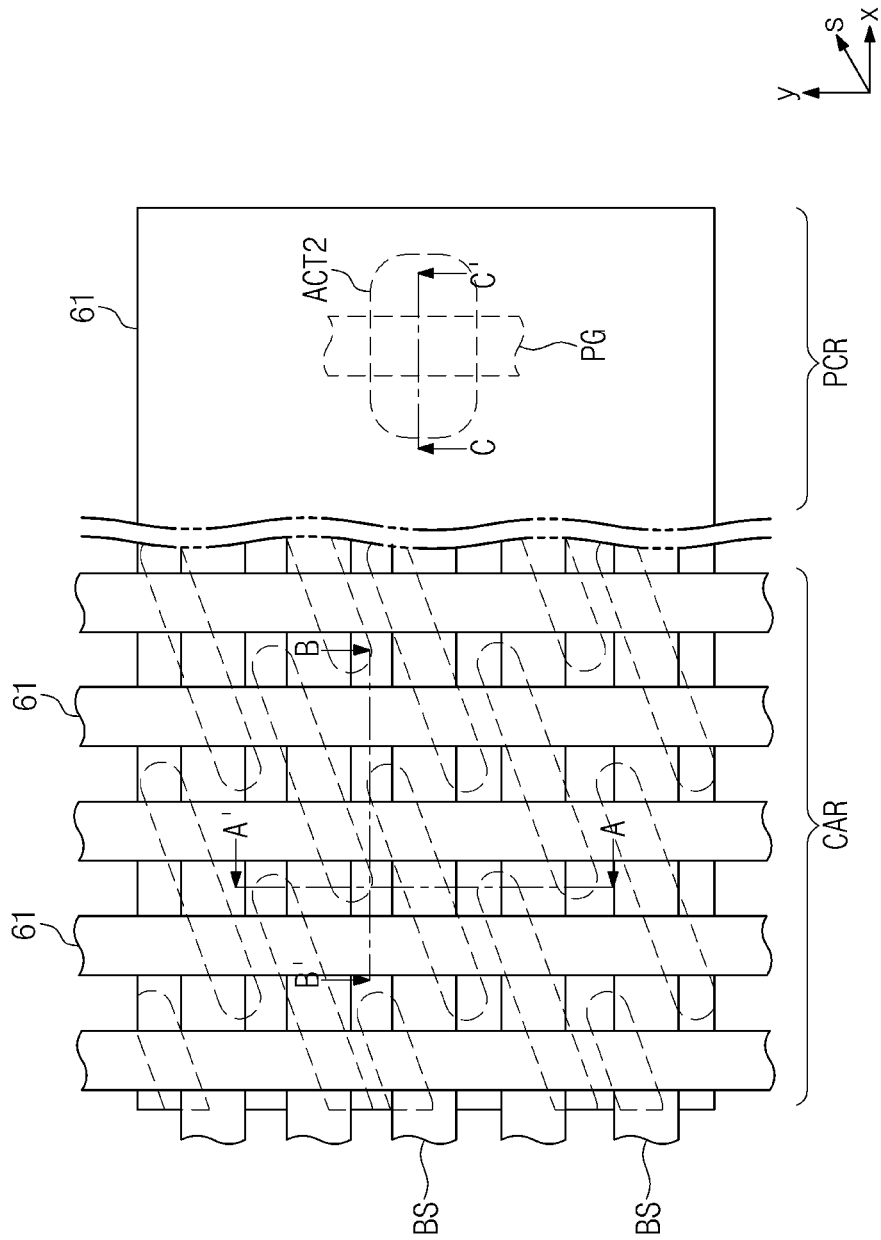

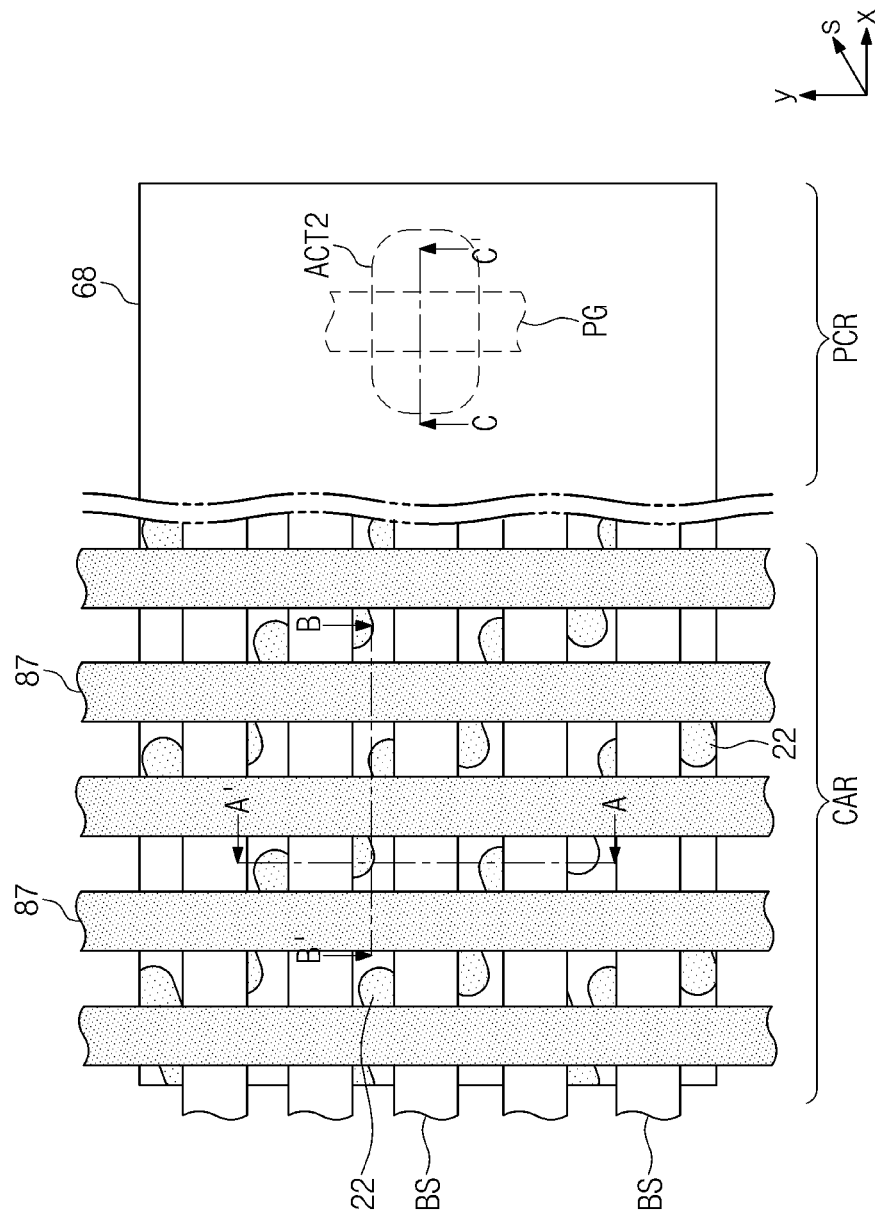

SEMICONDUCTOR DEVICE AND METHOD OF FABRICATING THE SAME

CROSS-REFERENCE TO RELATED APPLICATIONS

This application is a continuation of U.S. application Ser. No. 15/196,612, filed on Jun. 29, 2016, which is a continuation of U.S. application Ser. No. 13/967,158, filed on Aug. 14, 2013, which claims priority under 35 U.S.C. § 119 to Korean Patent Application No. 10-2012-0095799, filed on Aug. 30, 2012, in the Korean Intellectual Property Office, the entire contents of each of which are hereby incorporated by reference.

BACKGROUND

Example embodiments of inventive concepts relate to a semiconductor device and/or a method of fabricating the same.

Due to their small-sized, multifunctional, and/or low-cost characteristics, semiconductor devices are being esteemed as important elements in the electronic industry. Higher integration of semiconductor devices, such as semiconductor memory devices, is desired to satisfy consumer demands for superior performance and inexpensive prices. In the case of semiconductor memory devices, increased integration is especially desired, because their integration is an important factor in determining product prices. However, expensive process equipment for increasing pattern fineness sets a practical limitation on increasing integration for semiconductor memory devices. Thus, a variety of studies have been recently done on new technology for increasing integration density of a semiconductor device.

SUMMARY

Example embodiments of inventive concepts relate to a semiconductor device with improved electric characteristics.

According to example embodiments of inventive concepts, a semiconductor device may include: a substrate having an upper surface, the upper surface of the substrate defining a groove and an active region; a device isolation layer in the groove of the substrate, the device isolation layer exposing the active region and having a top surface that is higher than a top surface of the active region of the substrate; and a contact structure on the active region. The contact structure may include a first portion filling a gap region delimited by a sidewall of the device isolation layer and a top surface of the active region, and a second portion on the device isolation layer so the second portion overlaps with the device isolation layer in a plan view.

In example embodiments, the first portion may contact the sidewall of the device isolation layer, and the first portion may contact the top surface of the active region.

In example embodiments, the active region may include a first active region in a cell array region of the substrate. The first active region may include a first impurity region and a second impurity region, and a bottom surface of the first portion may cover an entire area of a top surface of the second impurity region in the first active region.

In example embodiments, the device may further include conductive lines on the substrate. The second portion may be between the conductive lines, and the first portion may extend below the conductive lines.

In example embodiments, the device may further include a cell gate structure buried in the substrate. A portion of the gap region may be delimited by a sidewall of the cell gate structure.

In example embodiments, a sidewall of the first portion may be in contact with the sidewall of the cell gate structure.

In example embodiments, the active region may include a first impurity region and a second impurity region, the first impurity region and the second impurity region may be at both sides of the cell gate structure, and the contact structure may be connected to the second impurity region.

In example embodiments, the device may further include a data storing element connected to the contact structure.

In example embodiments, the data storing element may include a lower electrode, an upper electrode and an insulating layer, and the insulating layer may be between the lower and upper electrodes.

In example embodiments, the device may further include conductive lines on the substrate. The conductive lines may cross the cell gate structure. The first impurity region may be connected to the conductive lines.

In example embodiments, the conductive lines may include a third portion and a fourth portion. The third portion may overlap with the device isolation layer in a plan view. The fourth portion may extend from the third portion toward the substrate and fill a region delimited by the sidewall of the device isolation layer and a top surface of the first impurity region.

In example embodiments, the device may further include a first interlayered insulating pattern between the conductive lines; and an etch stop layer. The first interlayered insulating pattern may delimit the second portion along with the conductive lines. The etch stop layer may be between the device isolation layer and the conductive lines, and the etch stop layer may include a material having an etch selectivity with respect to the first interlayered insulating pattern.

In example embodiments, the top surface of the device isolation layer may define a trench. The cell gate structure may include a gate insulating layer in the trench, a gate conductive layer in the trench and on the gate insulating layer, and a capping layer on top surfaces of the gate insulating layer and the gate conductive layer. The capping layer may fill the trench.

In example embodiments, the device may further include a peripheral gate structure, the substrate may include a cell region and a peripheral circuit region, the cell gate structure may be on the cell region of the substrate, and the peripheral gate structure may be on the peripheral circuit region of the substrate. The upper surface of the substrate on the peripheral circuit region may be lower than an upper surface of the capping layer.

In example embodiments, the contact structure may further include a conductive etch stop layer between the first portion and the active region, and the conductive etch stop layer may extend along the sidewall of the device isolation layer.

According to example embodiments of inventive concepts, a semiconductor device may include a device isolation on the substrate; conductive lines; and a contract structure. The device isolation layer may expose an active region of the substrate. The contact structure may be between the conductive lines and connected to the active region. The contact structure may include a lower portion that extends below the conductive lines.

In example embodiments, the lower portion of the contact structure may fill a gap region delimited by a sidewall of the device isolation layer and a top surface of the active region.

In example embodiments, the contact structure may include an upper portion, and the upper portion may overlap with the device isolation layer in a plan view.

In example embodiments, the device may further include a cell gate structure buried in the substrate. A portion of the gap region may be delimited by a sidewall of the cell gate structure.

In example embodiments, the device may further include a first impurity region and a second impurity region. The first impurity region and the second impurity region may be at both sides of the cell gate structure. The contact structure may be connected to the second impurity region and each of the conductive lines may be connected to the first impurity region.

According to example embodiments of inventive concept, a method of fabricating a semiconductor device may include: forming a sacrificial pattern on an active region of a substrate; forming conductive lines on the sacrificial pattern, the conductive lines crossing the active region; forming a preliminary contact hole between the conductive lines, the preliminary contact hole exposing the sacrificial pattern; selectively removing the sacrificial pattern to extend the preliminary contact hole toward the substrate, thereby forming a contact hole; and forming a contact structure in the contact hole.

In example embodiments, the forming of the sacrificial pattern may include: forming a sacrificial layer on the substrate; patterning the sacrificial layer to form a preliminary sacrificial pattern on the substrate; and forming a device isolation layer in areas of the substrate that are exposed by the preliminary sacrificial pattern. The device isolation layer may expose the active region.

In example embodiments, a material of the sacrificial layer may have an etch selectivity with respect to the device isolation layer and the substrate.

In example embodiments, the sacrificial layer may include at least one of a silicon-germanium compound, silicon nitride, silicon oxynitride, or a silicon-metal compound.

In example embodiments, an upper surface of the substrate may include a cell array region and a peripheral circuit region, and forming the sacrificial layer on the substrate may include forming the sacrificial layer on the cell array region and the peripheral circuit region of the substrate.

In example embodiments, the method may further include removing a portion of the sacrificial layer on the peripheral circuit region; and sequentially forming a peripheral gate insulating layer and a peripheral gate electrode on the peripheral circuit region after the portion of the sacrificial layer on the peripheral circuit region is removed.

In example embodiments, the forming the preliminary contact hole may include exposing a top surface of the device isolation layer.

In example embodiments, the conductive lines may overlap the sacrificial pattern in a plan view, and the forming the contact structure in the contact hole may include forming a portion of the contact structure that extends below the conductive lines.

In example embodiments, the method may further include: forming an impurity region in an upper portion of the substrate, the impurity region including a first impurity region and a second impurity region; and forming a cell gate structure buried in the substrate. The first impurity region and the second impurity region may be separated by the cell gate structure, and the sacrificial pattern may include a first sacrificial pattern and a second sacrificial pattern separated by the cell gate structure.

In example embodiments, the forming the preliminary contact hole may include exposing the second sacrificial pattern, the forming the contact hole may include exposing the second impurity region.

In example embodiments, the forming the impurity region may include forming a plurality of impurity region, the forming the contact hole may include forming a plurality of contact holes, and the forming the preliminary contact hole may include forming a plurality of preliminary contact holes. Each of the plurality of the preliminary contact holes may be formed to have two or more different depths.

In example embodiments, each of the plurality of the contact holes may be formed to have a substantially same depth.

In example embodiments, the forming the conductive lines may include removing the first sacrificial pattern to expose the first impurity region.

In example embodiments, the forming the conductive lines may further include forming a semiconductor layer to cover the first and second sacrificial patterns, and the removing the first sacrificial pattern may include forming a through hole to penetrate the semiconductor layer and expose the first impurity region.

In example embodiments, the forming the through hole may include etching the semiconductor layer to expose the first sacrificial pattern, and selectively removing the first sacrificial pattern.

In example embodiments, the forming of the sacrificial pattern may include: forming a device isolation layer on the substrate, the device isolation layer exposing an active layer of the substrate; forming a recess region in the substrate by etching an upper portion of the exposed upper surface in a cell array region of the substrate; forming the sacrificial pattern in the recess region.

In example embodiments, the method may further include forming a first etch stop layer in the recess region, before the forming the sacrificial pattern in the recess region.

In example embodiments, the first etch stop layer may include a conductive material.

In example embodiments, the method may further include forming an etch stop layer between the sacrificial pattern and the conductive lines.

In example embodiments, the forming the preliminary contact hole may include an etching process that exposes an upper surface of the etch stop layer.

According to example embodiments of inventive concepts, a semiconductor device may include: a substrate having an upper surface; and a plurality of contact structures that are spaced apart from each other. The upper surface of the substrate may define first active region that protrude from the substrate and are separated by a groove, each one of the first active regions may include a first impurity region between a pair of second impurity regions. The plurality of contact structure may each include a first portion on a corresponding one of the second impurity regions and a second portion that extends vertically from a part of an upper surface of the first portion. Each second portion may include a lower surface that partially overlaps the groove in a plan view.

In example embodiments, the device may further include a device isolation layer in the groove. The device isolation layer may expose the first active regions, and the device isolation layer may include a top surface that is higher than a top surface of the first active regions.

In example embodiments, the device may further include a plurality of bit lines that are spaced apart from each other on the substrate. The bit lines may extend in a first direction.

Each one of the bit lines may be electrically connected to the first impurity region and electrically isolated from the second impurity regions of at least two adjacent first active regions.

In example embodiments, the device may further include a plurality of word line structures embedded in the device isolation layer, wherein the plurality of word line structures may extend in a second direction crossing the first direction.

In example embodiments, the device may further include a peripheral gate structure. The substrate may include a cell array region and a peripheral circuit region. The first active regions may be in the cell array region of the substrate. The upper surface of the substrate may further define a second active region in the peripheral circuit region of the substrate. The second active region may be spaced apart from the first active regions. The peripheral gate structure may be on the second active region.

BRIEF DESCRIPTION OF THE DRAWINGS

Example embodiments will be more clearly understood from the following brief description taken in conjunction with the accompanying drawings. The accompanying drawings represent non-limiting example embodiments as described herein. In the drawings:

FIGS. 1A through 11A are plan views illustrating semiconductor devices and methods of fabricating the same, according to example embodiments of inventive concepts.

FIGS. 1B through 11B are sectional views taken along line A-A' of FIGS. 1A through 11A, respectively.

FIGS. 1C through 11C are sectional views taken along lines B-B' and C-C' of FIGS. 1A through 11A, respectively.

FIGS. 12A through 14A are sectional views taken along the line A-A' of FIG. 1A and illustrate semiconductor devices and methods of fabricating the same according to example embodiments of inventive concepts.

FIGS. 12B through 14B are sectional views taken along the lines B-B' and C-C' of FIG. 1A.

FIGS. 15A through 23A are plan views illustrating methods of fabricating a semiconductor device according to example embodiments of inventive concepts.

FIGS. 15B through 23B are sectional views taken along line A-A' of FIGS. 15A through 23A, respectively.

FIGS. 15C through 23C are sectional views taken along lines B-B' and C-C' of FIGS. 15A through 23A, respectively.

FIGS. 25A through 29A are plan views illustrating methods of fabricating a semiconductor device according to example embodiments of inventive concepts.

FIGS. 25B through 29B are sectional views taken along line A-A' of FIGS. 25A through 29A, respectively.

FIGS. 25C through 29C are sectional views taken along lines B-B' and C-C' of FIGS. 25A through 29A, respectively.

Figure 1B:
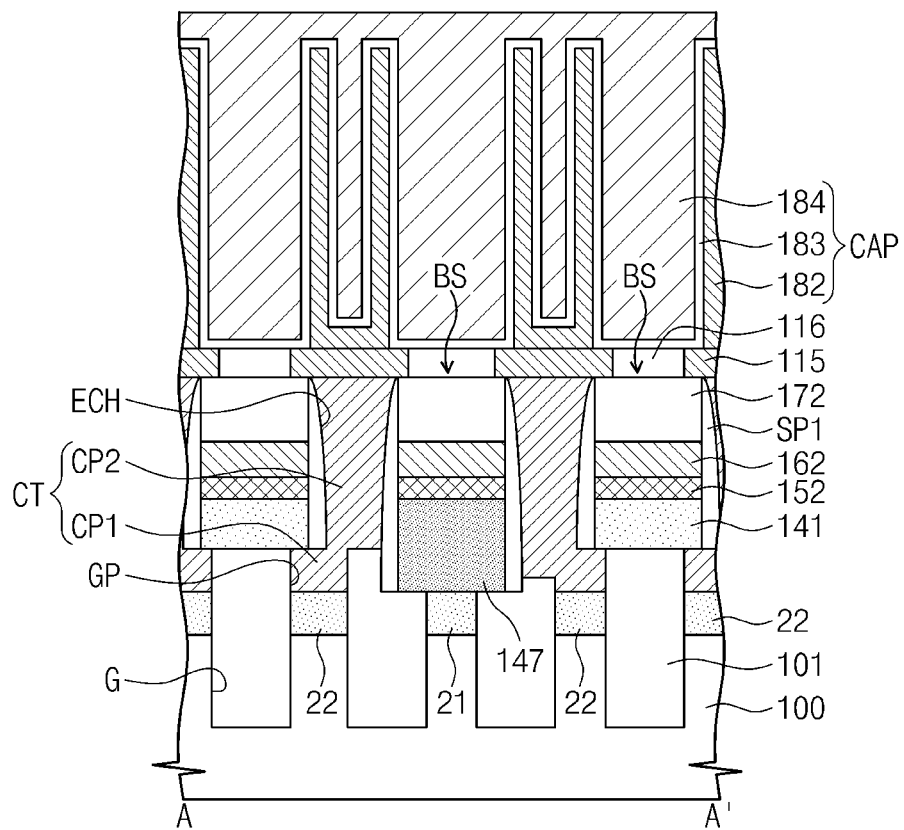

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concept will now be described more fully with reference to the accompanying drawings, in which example embodiments are shown. Example embodiments of inventive concept may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments of inventive concept are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concept should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concept belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A dynamic random access memory (DRAM) will be described as an example of a semiconductor device according to example embodiments of inventive concepts, but example embodiments of inventive concepts are limited thereto. For example, example embodiments of inventive concepts may include a magnetic memory device (MRAM), a phase-changeable memory device (PRAM), ferroelectric memory device (FRAM), a resistive memory device (RRAM), and so forth.

Figure 1C:
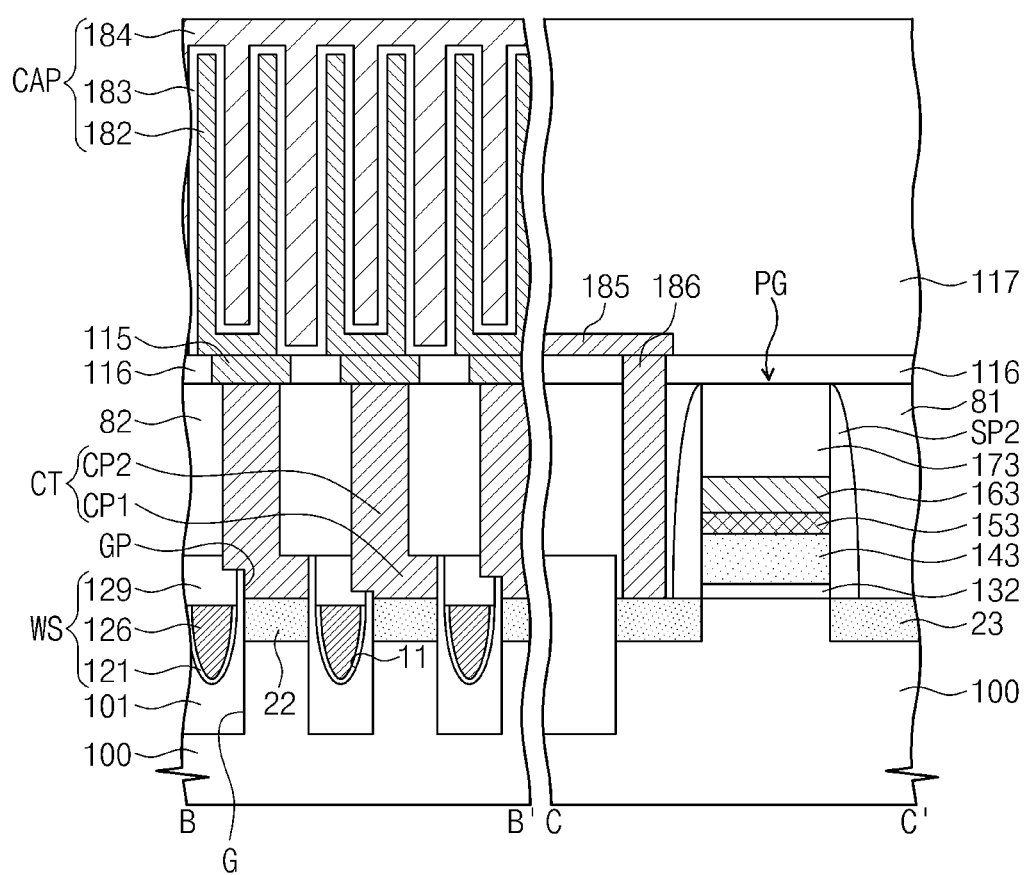
Figure 1D:
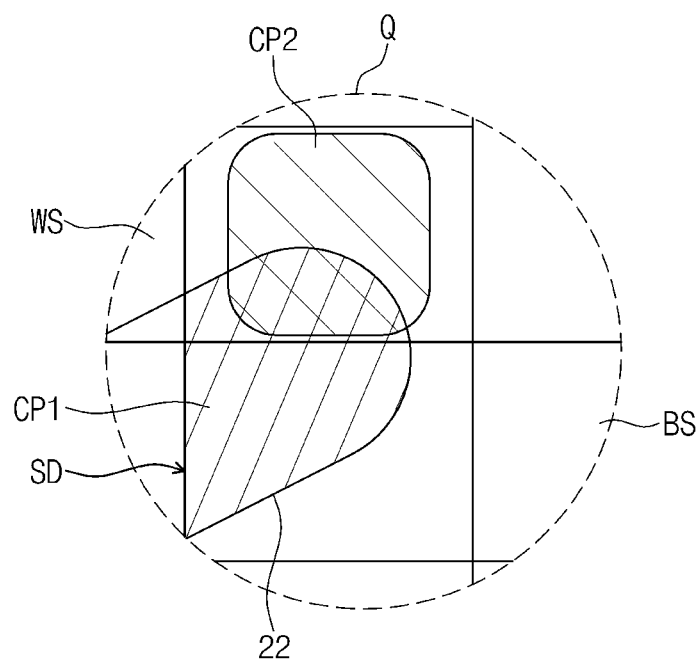
FIG. 1D is an enlarged plan view of a region Q of FIG. 1A.

FIG. 1A is a plan view illustrating a semiconductor device according to example embodiments of inventive concepts. FIG. 1B is a sectional view taken along line A-A' of FIG. 1A, and FIG. 1C is a sectional view taken along lines B-B' and C-C' of FIG. 1A. FIG. 1D is an enlarged plan view of a region Q of FIG. 1A.

Referring to FIGS. 1A through 1D, a substrate 100 may be provided to include a cell array region CAR and a peripheral circuit region PCR. The substrate 100 may be, for example, a semiconductor substrate (e.g., of silicon, germanium, silicon-germanium). In example embodiments, memory cells may be provided on the cell array region CAR. A word line driver, a sense amplifier, row and column decoders, and control circuits may be provided on the peripheral circuit region PCR. An upper surface of the substrate 100 may define first active regions ACT1 in the cell array region CAR and second active region ACT2 in the peripheral circuit region PCR, and a groove G. A device isolation layer 101 may be formed in the groove G. The device isolation layer 101 may have a top surface that is higher than top surfaces of the active regions ACT1 and ACT2 adjacent thereto. The first active regions ACT1 may be horizontally separated from each other to have a bar-shaped structure and extend along a third direction (hereinafter, s direction) at an angle to a first direction (hereinafter, x direction) and a second direction (hereinafter, y direction). In example embodiments, the first active regions ACT1 may be spaced apart from each other with two or more y-directional distances.

First and second impurity regions 21 and 22 may be provided on the first active regions ACT1. The impurity regions 21 and 22 may be regions doped with impurities having a different conductivity type from the substrate 100. In each first active region ACT1, the first impurity region 21 may be provided between a pair of the second impurity regions 22, and the first impurity region 21 and the second impurity regions 22 may be separated from each other by trenches 11 and/or the groove G in the substrate 100.

Cell gate structures may be provided in the cell array region CAR to be buried in the substrate 100. In other words, the cell gate structures may include word line structures WS of the semiconductor device, and the word line structures WS may be provided in the trenches 11 and extend along the y direction. Each of the word line structures WS may include a gate insulating layer 121, a gate electrode 126 and a gate capping pattern 129, which are sequentially stacked in a corresponding one of the trenches 11.

Conductive lines may be provided on the cell array region CAR. In example embodiments, the conductive lines may be connected to the first impurity regions 21 and extend along the x direction. The conductive lines may serve as bit line structures BS. A peripheral gate structure PG may be provided on the peripheral circuit region PCR. Each of the bit line structures BS and the peripheral gate structure PG may include a first conductive pattern, a second conductive pattern, and a barrier pattern between the first and second conductive patterns. For example, each of the bit line structures BS may include a first conductive pattern 147 connected to the first impurity region 21, and a barrier pattern 152, a second conductive pattern 162, and a capping pattern 172 that are sequentially stacked on the first conductive pattern 147. The bit line structures BS may include separation patterns between the first conductive patterns 147. For example, the separation patterns may be first semiconductor patterns 141. The first semiconductor patterns 141 may include an undoped poly silicon layer. The barrier pattern 152 on the cell array region CAR may extend along the x direction and have a bottom surface that is alternatingly in contact with the first conductive patterns 147 and the first semiconductor patterns 141.

Although FIG. 1B illustrates a bottom surface of the first conductive pattern 147 is at about the same height as a top surface of the second impurity region, example embodiments of inventive concepts are not limited thereto. For example, a bottom surface of the first conductive pattern 147 may be lower than top surfaces of the second impurity regions 22. Although the separation patterns may be first semiconductor patterns 141, example embodiments are not limited thereto. For example, in example embodiments of inventive concepts, the separation patterns may alternatively be an insulating pattern such as a silicon oxide layer or a silicon oxynitride layer instead of the first semiconductor patterns 141.

The structural features of semiconductor device according to example embodiments of inventive concepts will be explained in more detail with reference to a fabricating method according to example embodiments of inventive concepts to be described below.

The peripheral gate structure PG may include a gate insulating layer 132, a first conductive pattern 143, a barrier pattern 153, a second conductive pattern 163 and a capping pattern 173 sequentially formed on the substrate 100. The bit line structures BS and the peripheral gate structure PG may further include a first spacer SP1 and a second spacer SP2, respectively.

The first conductive patterns 147 on the cell array region CAR and the first conductive pattern 143 on the peripheral circuit region PCR may include a same material. For example, the first conductive patterns 147 and 143 may be formed of a doped polysilicon layer. The first conductive patterns 147 on the cell array region CAR may have a conductivity type that is identical to or different than a conductivity type of the first conductive pattern 143 on the peripheral circuit region PCR.

The second conductive pattern 162 on the cell array region CAR may be formed to include the same material as the second conductive pattern 163 on the peripheral circuit region PCR. For example, the second conductive patterns 162 and 163 may include at least one of W, Ti, or Ta. The capping patterns 172 and 173 and the spacers SP1 and SP2 may include a dielectric material such as at least one of silicon oxide, silicon nitride or silicon oxynitride.

The barrier pattern 152 on the cell array region CAR may be formed to include a same material as the barrier pattern 153 on the peripheral circuit region PCR. In example embodiments, the barrier patterns 152 and 153 may include at least one of metal-silicon compounds and/or conductive metal nitrides. For example, the barrier patterns 152 and 153 may include at least one of WN and/or WSi.

Data storing elements may be provided to be connected to the second impurity regions 22. In the case that the semiconductor device is a dynamic random access memory (DRAM) device, capacitors CAP electrically connected to the second impurity regions 22 may be provided as the data storing elements. The capacitors CAP may include lower electrodes 182, an upper electrode 184, and a dielectric layer 183 interposed between the lower electrodes and the upper electrode 184.

The capacitors CAP may be connected to the second impurity regions 22 through contact structures CT. The contact structures CT may be provided in contact holes ECH that are formed between the bit line structures BS. Each of the contact structures CT may include a first portion CP1 filling a gap region GP that is delimited by a sidewall of the device isolation layer 101 and a top surface of the first active region ACT1 (or a top surface of the second impurity regions 22). As shown in FIG. 1D, the gap region GP may be delimited by a sidewall SD of the word line structure WS. In other words, the gap region GP may be defined by the sidewall of the device isolation layer 101 and the sidewall SD of the word line structure WS. The contact structures CT may further include a second portion CP2 extending from the first portion CP1 and being overlapped with the device isolation layer 101, when viewed from a plan view.

The first portion CP1 may be in contact with the sidewall of the device isolation layer 101 and the top surface of the second impurity regions 22. The first portion CP1 may be in contact with the sidewall SD of the word line structure WS. The bottom surface of the first portion CP1 may be formed to cover fully the top surfaces of cover the second impurity regions 22. For example, as shown in FIG. 1D, the bottom surface of the first portion CP1 may have substantially the same area as that of the top surface of the second impurity region 22. The first portion CP1 may be overlapped with the bit line structures BS, in plan view, and the first portion CP1 may extend below the bit line structures BS.

The second portion CP2 may extend between the bit line structures BS. For example, the second portion CP2 may be in contact with the sidewall of the bit line structures BS and a sidewall of a first interlayered insulating pattern 82. The first interlayered insulating patterns 82 may include at least one of a silicon oxide layer, a silicon oxynitride layer, or a silicon nitride layer. The contact structures CT may include at least one of a doped polysilicon layer, metals, conductive metal nitride layers, or metal-semiconductor compounds.

Contact pads 115 may be provided between the contact structures CT and the capacitors CAP. The contact pads 115 may be provided in a second interlayered insulating layer 116 and connect the contact structures CT electrically to the lower electrodes 182. The second interlayered insulating layer 116 may include at least one of a silicon oxide layer, a silicon oxynitride layer, or a silicon nitride layer.

A peripheral contact 186 may be provided through a first interlayered insulating layer 81 and the second interlayered insulating layer 116 and be connected to a third impurity region 23 of the peripheral circuit region PCR. The peripheral contact 186 may be connected to a peripheral conductive line 185. A third interlayered insulating layer 117 may be provided on the peripheral conductive line 185. The peripheral conductive line 185 may be electrically connected to the bit line structures BS, but example embodiments of inventive concept may not be limited thereto.

According to example embodiments of inventive concepts, the contact structures CT may be in contact with the second impurity regions 22 in a uniform contact area. In addition, the contact structures CT may be provided to have a uniform depth to the top surface of the second impurity regions 22. Accordingly, it is possible to limit (and/or prevent) an increase in leakage current or contact resistance that may occur when the contact holes ECH are misaligned to the second impurity region 22.

FIGS. 2A through 11A are plan views illustrating a method of fabricating a semiconductor device according to example embodiments of inventive concepts. FIGS. 2B through 11B are sectional views taken along line A-A' of FIGS. 2A through 11A, respectively. FIGS. 2C through 11C are sectional views taken along lines B-B' and C-C' of FIGS. 2A through 11A, respectively.

Figure 2B:
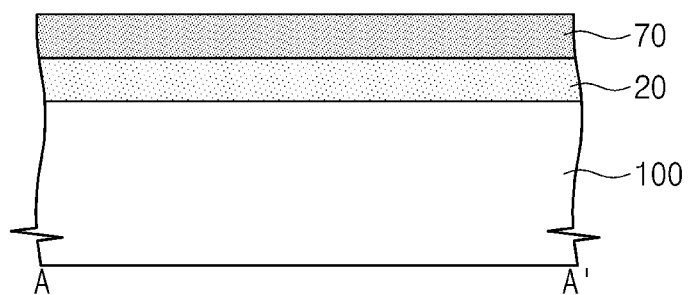
Figure 2C:
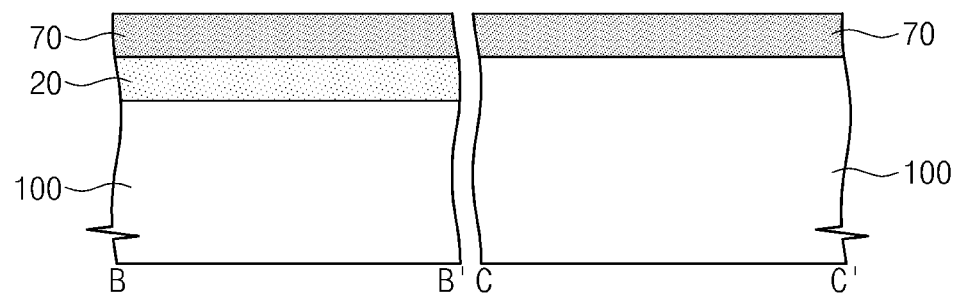

Referring to FIGS. 2A, 2B and 2C, impurity region 20 may be formed in the cell array region CAR of the substrate 100. The substrate 100 may be, for example, a semiconductor substrate (e.g., of silicon, germanium, silicon-germanium). The impurity region 20 may be formed by an ion implantation process injecting impurities ions with a different conductivity type from the substrate 100 into an upper portion of the substrate 100. In other embodiments, the impurity region 20 may be formed in a subsequent process. A mask pattern (not shown) may be formed on the peripheral circuit region PCR, and this limits (and/or prevents) the impurity region 20 from being formed in the peripheral circuit region PCR. The mask pattern may be removed after the ion implantation process.

A sacrificial layer 70 may be formed on the substrate 100. The sacrificial layer 70 may be formed on the cell array region CAR and the peripheral circuit region PCR. The sacrificial layer 70 may be formed of a material having an etch selectivity with respect to the substrate 100 and a device isolation layer to be described below. In other words, the sacrificial layer 70 may be formed of a material that may be etched at a different (e.g., slower) rate than an etch rate of the substrate 100 using a desired etchant. For example, the sacrificial layer 70 may be formed of at least one of silicon-germanium compounds, a silicon nitride layer, a silicon oxynitride layer, or silicon-metal compounds.

Figure 3A:
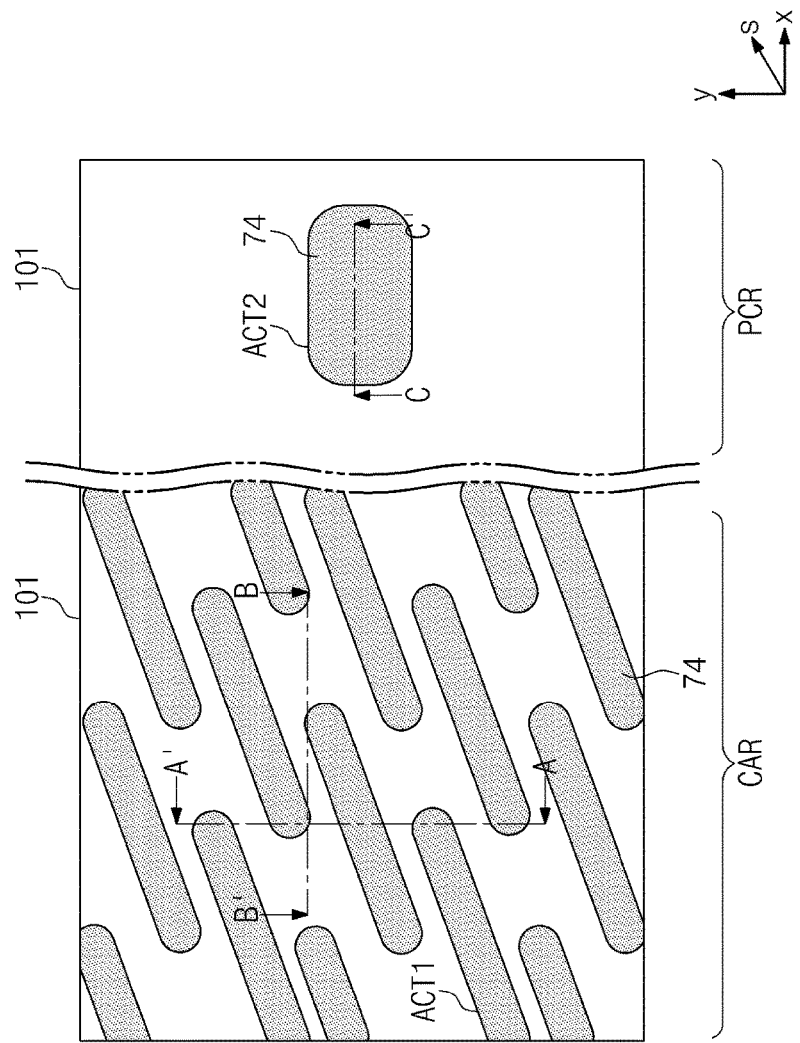
Figure 3B:
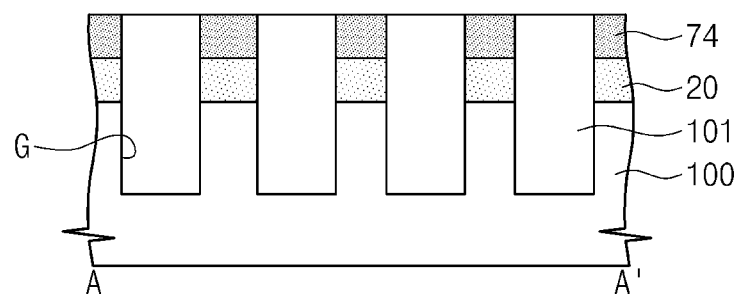
Figure 3C:
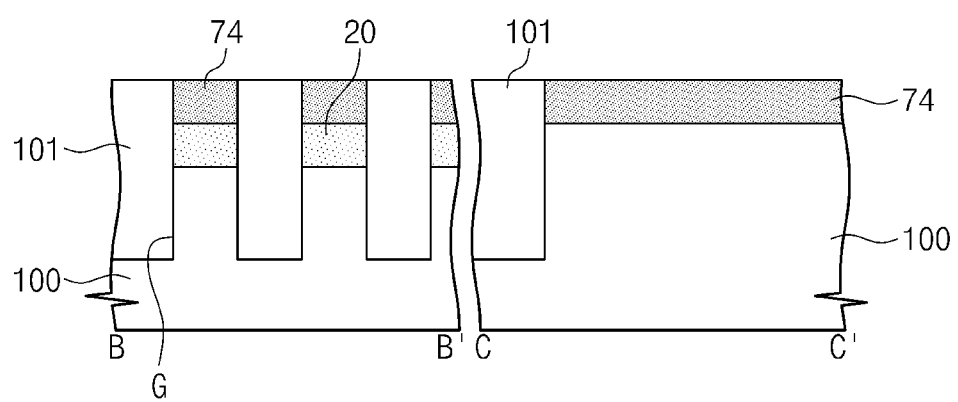

Referring to FIGS. 3A, 3B and 3C, the device isolation layers 101 may be formed on the substrate 100 to delimit the first active regions ACT1 in the cell array region CAR and the second active region ACT2 in the peripheral circuit region PCR. The first active regions ACT1 may be horizontally separated from each other to have a bar-shaped structure and extend along a third direction (hereinafter, s direction) at an angle to both of the first direction (hereinafter, x direction) and the second direction (hereinafter, y direction). Here, the x direction and the y direction may be directions crossing each other. The sacrificial layer 70 may be patterned along with the upper portion of the substrate 100, thereby forming preliminary sacrificial patterns 74 provided on the first active regions ACT1 and the second active region ACT2, respectively.

Figure 4B:
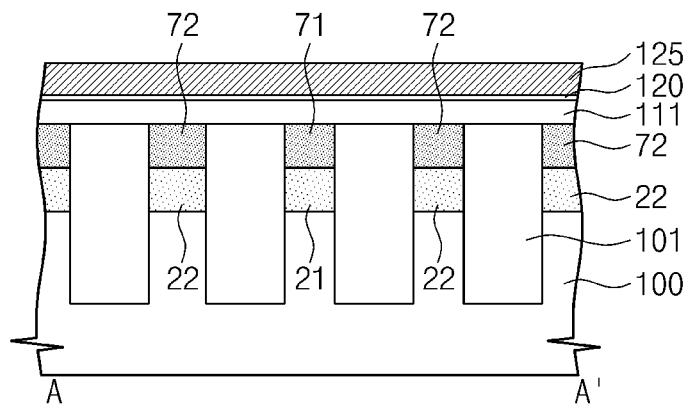
Figure 4C:
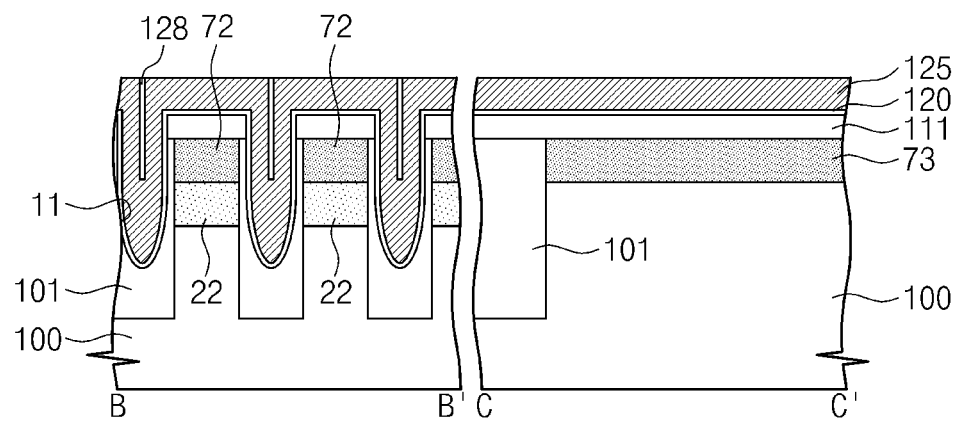

Referring to FIGS. 4A, 4B and 4C, the trenches 11 may be formed in the cell array region CAR of the substrate 100. The trenches 11 may extend along they direction and be spaced apart from each other in the x direction, such that the impurity region 20 may be separated into the first impurity regions 21 and the second impurity regions 22. In other words, in each of the first active region ACT1, the first impurity region 21 may be provided between a pair of the second impurity regions 22, and the first impurity region 21 and the second impurity regions 22 may be separated from each other by the trenches 11. The trenches 11 may separate the preliminary sacrificial pattern 74 into a plurality of sacrificial patterns. Hereinafter, sacrificial patterns on the first impurity regions 21 will be referred to as "first sacrificial patterns 71" and sacrificial patterns on the second impurity regions 22 will be referred to as "second sacrificial patterns 72". Sacrificial patterns on the peripheral circuit region PCR will be referred to as "third sacrificial pattern 73".

The trenches 11 may be formed by forming a mask pattern 111 on the substrate 100 and performing a dry and/or wet etching process using the mask pattern 111 as an etch mask. In example embodiments, the mask pattern 111 may include at least one of a photo resist layer, a silicon nitride layer, or a silicon oxide layer. A depth of the trench 11 may be less than that of the device isolation layer 101.

A first insulating layer 120, a conductive layer 125, and a filling layer 128 may be sequentially formed on the resulting structure provided with the trenches 11. The first insulating layer 120 and the conductive layer 125 may be formed in the trenches 11, and then, the filling layer 128 may be formed to fill the trenches 11 provided with the first insulating layer 120 and the conductive layer 125. The formation of the filling layer 128 may include forming an insulating layer on the conductive layer 125 and then performing a planarization process.

In example embodiments, the first insulating layer 120 may include at least one of a silicon oxide layer, a silicon nitride layer, or a silicon oxynitride layer. The conductive layer 125 may include at least one of doped semiconductor materials, conductive metal nitrides, metals, or metal-semiconductor compounds. The filling layer 128 may include at least one of a silicon oxide layer, a silicon nitride layer, or a silicon oxynitride layer. Each of the first insulating layer 120, the conductive layer 125, and the filling layer 128 may be formed using at least one of a chemical vapor deposition (CVD), a physical vapor deposition (PVD), or an atomic layer deposition (ALD).

Figure 5A:
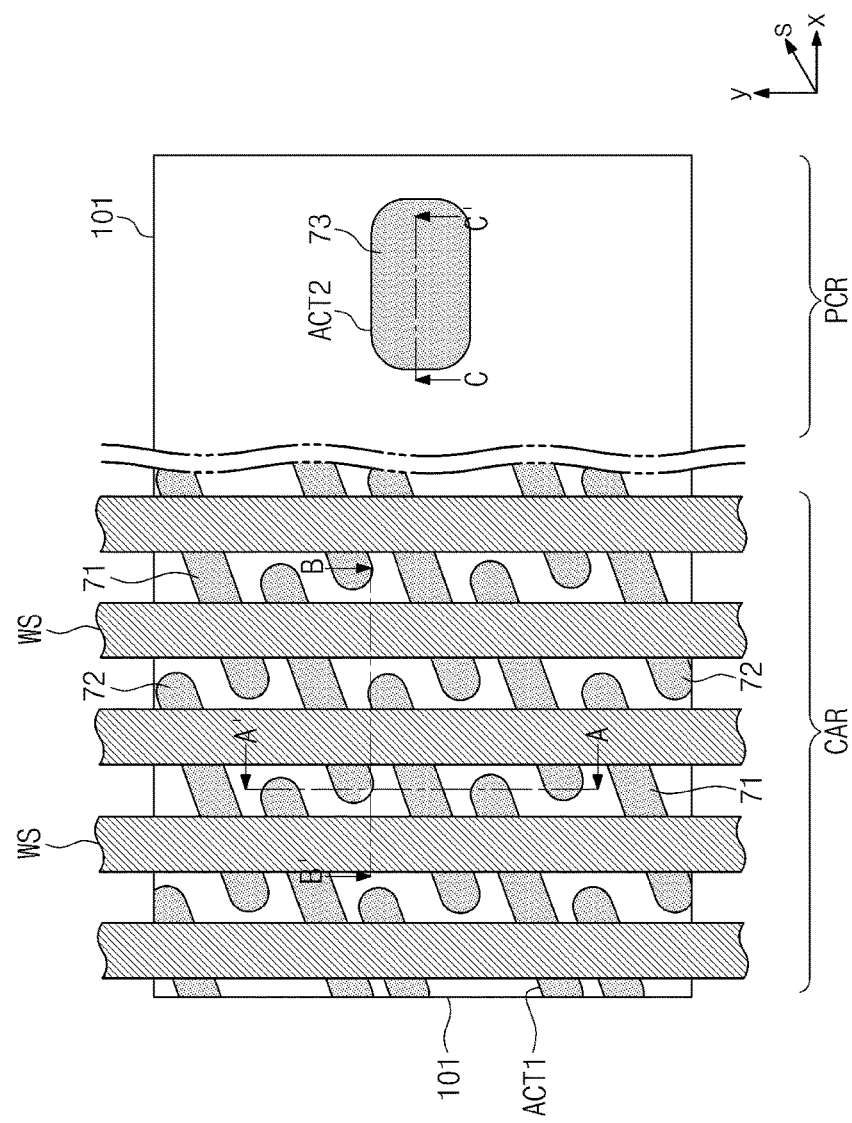
Figure 5B:
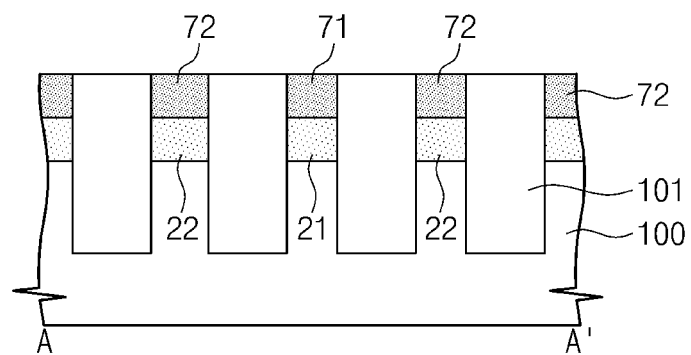
Figure 5C:
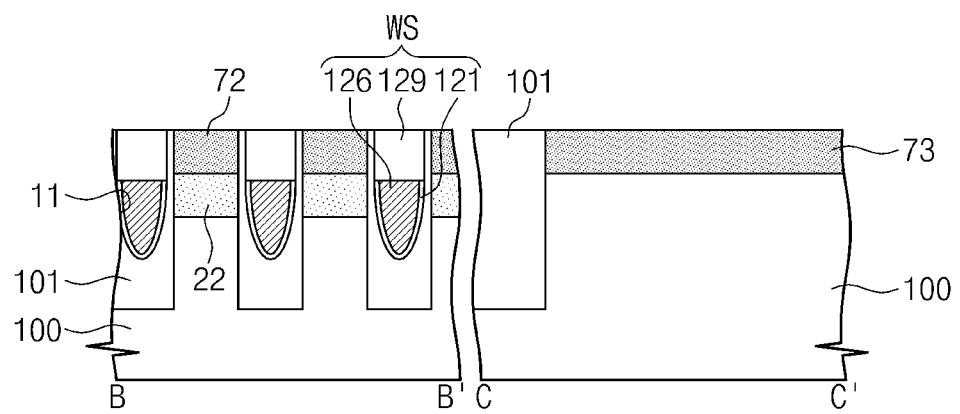

Referring to FIGS. 5A, 5B, and 5C, the first insulating layer 120 and the conductive layer 125 may be etched and localized into the trenches 11. As the result of the etching process, the first insulating layer 120 may form the gate insulating layers 121 separated from each other and the conductive layer 125 may form the gate electrodes 126 separated from each other. The etching process may be performed until the filling layer 128 is removed, and thus, the gate insulating layers 121 and the gate electrodes 126 may have top surfaces that are lower than top surfaces of the trenches 11. The mask pattern 111 may be removed during the etching process. The first insulating layer 120 and the conductive layer 125 provided on the peripheral circuit region PCR may be removed during the etching process.

The gate capping patterns 129 may be formed on the gate electrodes 126. The gate capping patterns 129 may be formed by forming an insulating layer to fill remaining portions of the trenches 11 provided with the gate electrodes 126 and performing a planarization process to expose the top surface of the substrate 100. The insulating layer provided on the peripheral circuit region PCR may be removed by the planarization process. The gate capping patterns 129 may include at least one of a silicon nitride layer, a silicon oxide layer, or a silicon oxynitride layer. As the result of the formation of the gate capping patterns 129, cell gate structures may be formed in the trenches 11. The cell gate structures may serve as word line structures WS of the semiconductor device.

Figure 6B:
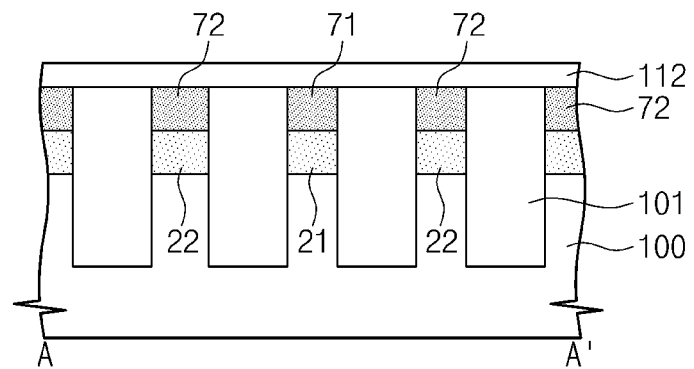
Figure 6C:
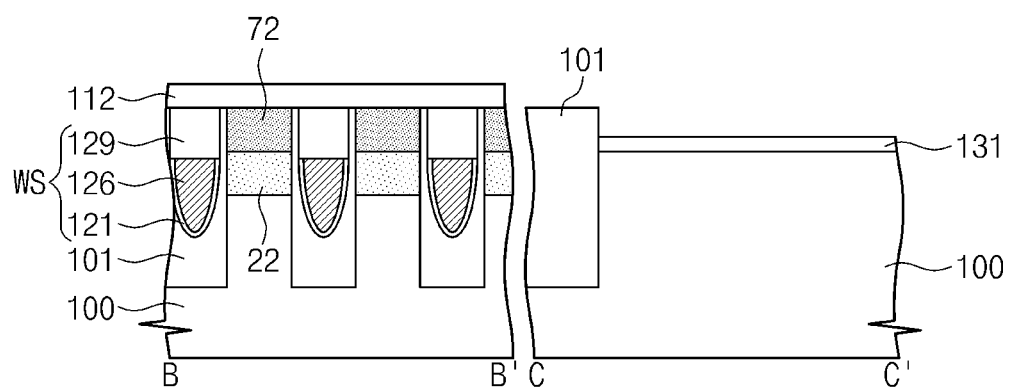

Referring to FIGS. 6A, 6B, and 6C, the third sacrificial pattern 73 may be removed from the peripheral circuit region PCR. As the result of the removal of the third sacrificial pattern 73, the exposed top surface of the substrate 100 of the peripheral circuit region PCR may be lower than the top surface of the gate capping patterns 129 of the cell array region CAR. The removal of the third sacrificial pattern 73 may include forming a mask pattern 112 to cover the cell array region CAR and then selectively etching the third sacrificial pattern 73 exposed by the mask pattern 112. In example embodiments, the mask pattern 112 may include at least one of a photo resist layer, a silicon nitride layer, or a silicon oxide layer. The selective etching process of the third sacrificial pattern 73 may be performed using an etching solution or an etching gas, which is selected to suppress the substrate 100 and the device isolation layer 101 from being etched and to selectively remove the third sacrificial pattern 73. For example, in the case where the third sacrificial pattern 73 includes silicon-germanium, the selective removal of the third sacrificial pattern 73 may be performed using an etching solution containing peracetic acid. The etching solution may further contain hydrofluoric acid (HF) solution and deionized water. In example embodiments, in the case where the third sacrificial pattern 73 includes a silicon nitride layer, the selective removal of the third sacrificial pattern 73 may be performed using an etching solution containing phosphoric acid ($H_3PO_4$).

After the removal of the third sacrificial pattern 73, a second insulating layer 131 may be formed on the peripheral circuit region PCR. The second insulating layer 131 may include at least one of silicon oxide, silicon oxynitride, or high-k dielectrics having a higher dielectric constant than silicon oxide. In example embodiments, the second insulating layer 131 may be formed using a thermal oxidation process.

Figure 7B:
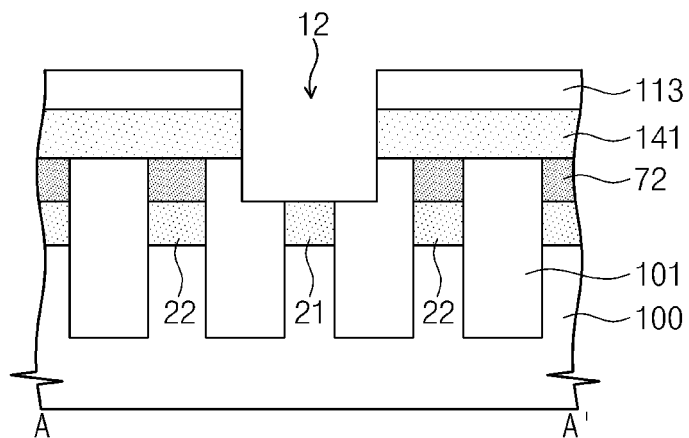
Figure 7C:
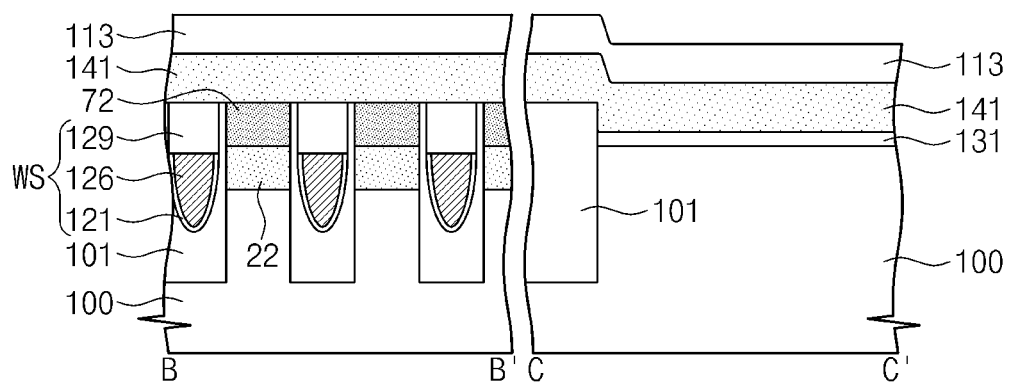

Referring to FIGS. 7A, 7B, and 7C, after the removal of the mask pattern 112, the first semiconductor patterns 141 may be formed on the cell array region CAR and the peripheral circuit region PCR. For example, the first semiconductor patterns 141 may be formed of an un-doped silicon layer. Through holes 12 may be formed to expose the first impurity regions 21 through the first semiconductor patterns 141. The first sacrificial patterns 71 may be removed by the formation of the through holes 12. In example embodiments, the through holes 12 may be formed to have a section shaped like a circle or an ellipse, in plan view. The formation of the through holes 12 may include forming a mask pattern 113 on the first semiconductor patterns 141, and then, performing a dry and/or wet etching process using the mask pattern 113 as an etch mask. The first semiconductor patterns 141 on the peripheral circuit region PCR may be doped with impurities ions, before or after the formation of the through holes 12. In example embodiments, a mask pattern (not shown) may be formed to cover the cell array region CAR, and an ion implantation process may be performed to the first semiconductor patterns 141 on the peripheral circuit region PCR. The first semiconductor patterns 141 doped with impurities may have a conductivity type of p- or n-type, depending on whether the transistor on the peripheral circuit region PCR is a PMOS transistor or an NMOS transistor.

Figure 8B:
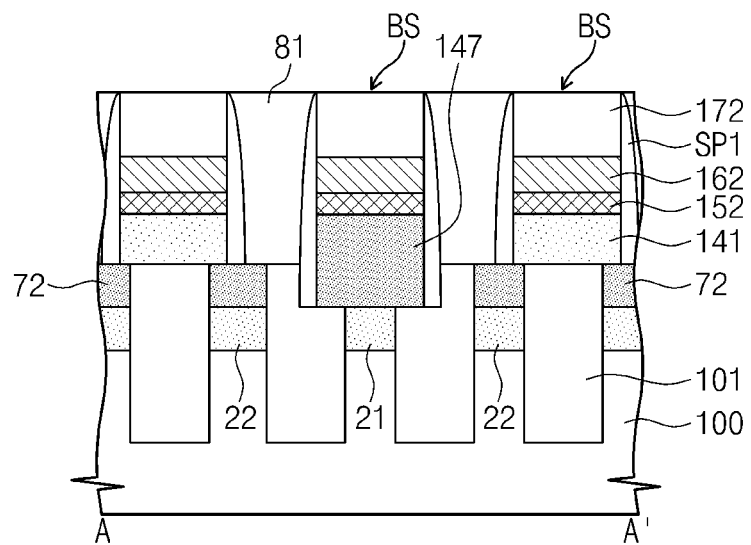
Figure 8C:
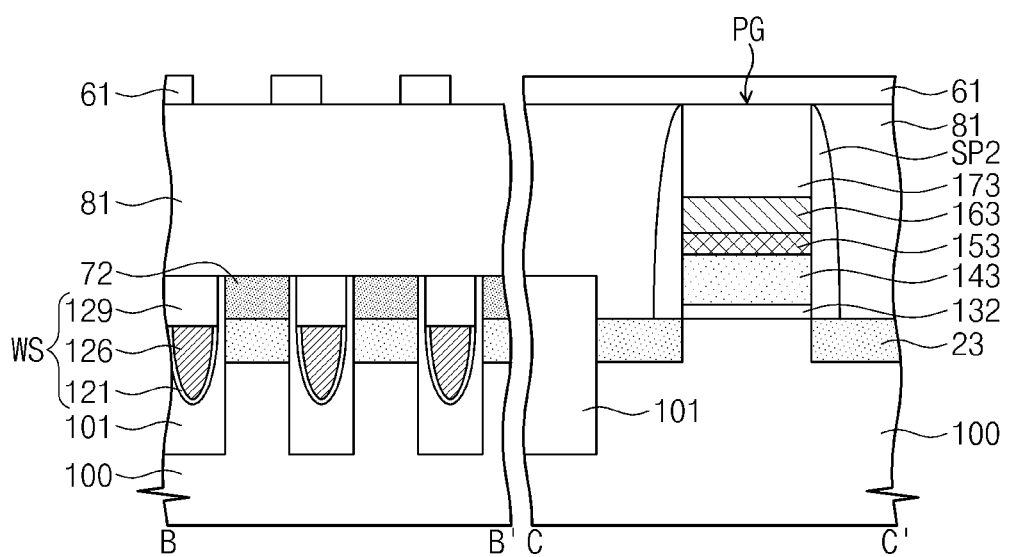

Referring to FIGS. 8A, 8B, and 8C, the first conductive patterns 147 may be formed to fill the through holes 12. In example embodiments, the first conductive patterns 147 may be a doped silicon layer. The first conductive patterns 147 may be formed by removing the mask pattern 113, forming a semiconductor layer to fill the through holes 12, and then, performing a planarization process. The first conductive patterns 147 may be doped in an in-situ manner and have the same conductivity type as the first impurity regions 21.

A barrier layer, a second conductive layer and a capping layer may be sequentially formed on the resulting structure provided with the first conductive patterns 147. The first semiconductor patterns 141, the barrier layer, the second conductive layer and the capping layer may be patterned to form conductive lines on the cell array region CAR and a peripheral gate structure PG on the peripheral circuit region PCR. The conductive lines may serve as bit line structures BS of the semiconductor device. The bit line structures BS may include a plurality of first conductive patterns 147 coupled to the first impurity regions 21, respectively, and the barrier pattern 152, the second conductive pattern 162, and the capping pattern 172 sequentially stacked on the first conductive patterns 147. The peripheral gate structure PG may include the gate insulating layer 132, the first conductive pattern 143, the barrier pattern 153, the second conductive pattern 163 and the capping pattern 173 that are sequentially stacked on the substrate 100. The formation of the bit line structures BS and the peripheral gate structure PG may include forming first spacers SP1 and second spacers SP2 on sidewalls of the bit line structures BS and the peripheral gate structure PG, respectively.

In example embodiments, the barrier patterns 152 and 153 may be configured to limit (and/or prevent) metal atoms in the second conductive patterns 162 and 163 from being diffused into the first conductive patterns 147 and 143 or to realize an ohmic contact property between the first conductive patterns 147 and 143 and the second conductive patterns 162 and 163. For example, the barrier patterns 152 and 153 may include at least one of conductive metal nitrides and/or metal-silicon compounds. The barrier patterns 152 and 153 may be formed using a CVD or ALD process.

The second conductive patterns 162 and 163 may include at least one of metals, conductive metal nitrides, or metal-silicon compounds. For example, the second conductive patterns 162 and 163 may include at least one of W, Ti, or Ta. The capping patterns 172 and 173 may include at least one of silicon oxide, silicon nitride or silicon oxynitride. The second conductive patterns 162 and 163 and the capping patterns 172 and 173 may be formed by a sputtering or CVD method.

The third impurity region 23 may be formed in the substrate 100 of the peripheral circuit region PCR to be adjacent to the peripheral gate structure PG. The formation of the third impurity region 23 may include an ion implantation process to be performed on the substrate 100 exposed by the peripheral gate structure PG, and the ion implantation process may be performed using impurities having the same conductivity type as the first conductive pattern 143. During the formation of the third impurity region 23, the cell array region CAR may be protected by a mask pattern provided thereon, but impurities provided to form the third impurity region 23 may also be injected into the second impurity region 22.

The first interlayered insulating layer 81 may be formed on the resulting structure provided with the bit line structures BS and the peripheral gate electrode PG. The first interlayered insulating layer 81 may be formed to fill empty spaces between the bit line structures BS. For example, the first interlayered insulating layer 81 may include a silicon oxide layer and/or a silicon oxynitride. As the result of the planarization process, the first interlayered insulating layer 81 may be formed to expose top surfaces of the capping patterns 172 and 173. A mask pattern 61 may be formed on the first interlayered insulating layer 81. In the cell array region CAR, the mask pattern 61 may be formed to cross the bit line structures BS. In example embodiments, the mask pattern 61 may be formed to have a line shape extending parallel to the word line structures WS. The peripheral circuit region PCR may be covered with the mask pattern 61.

Figure 9A:
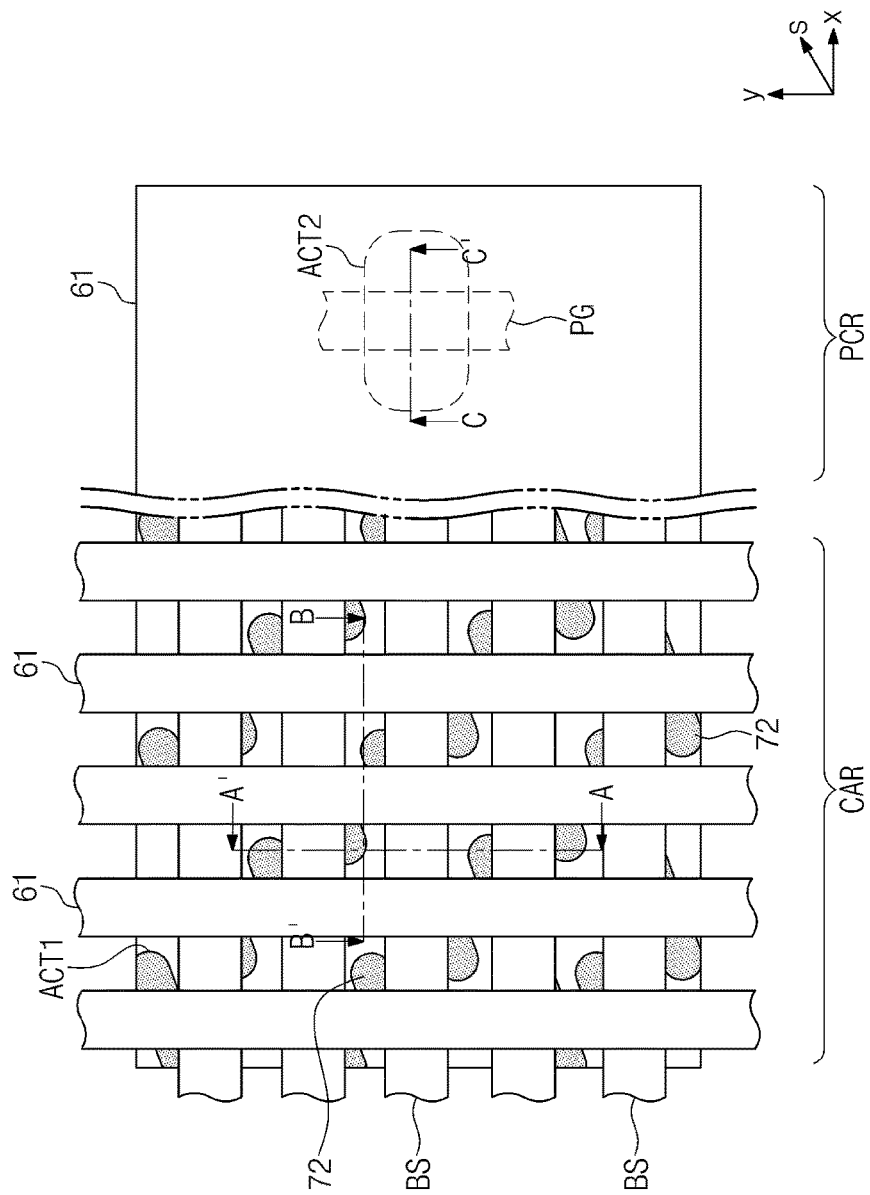
Figure 9B:
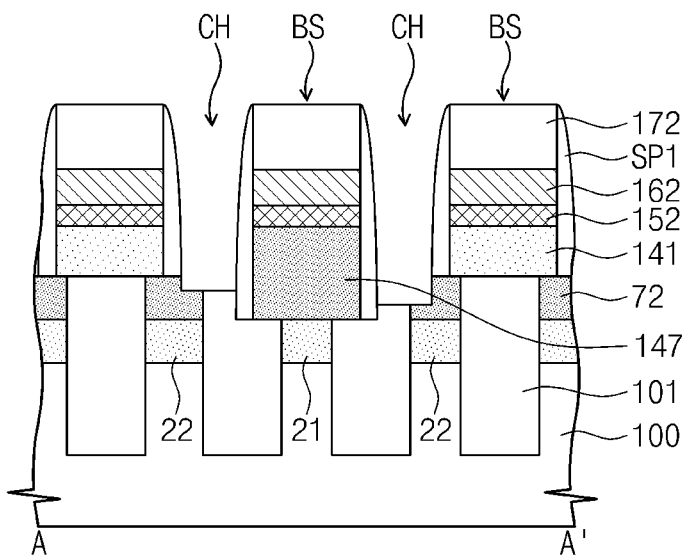
Figure 9C:
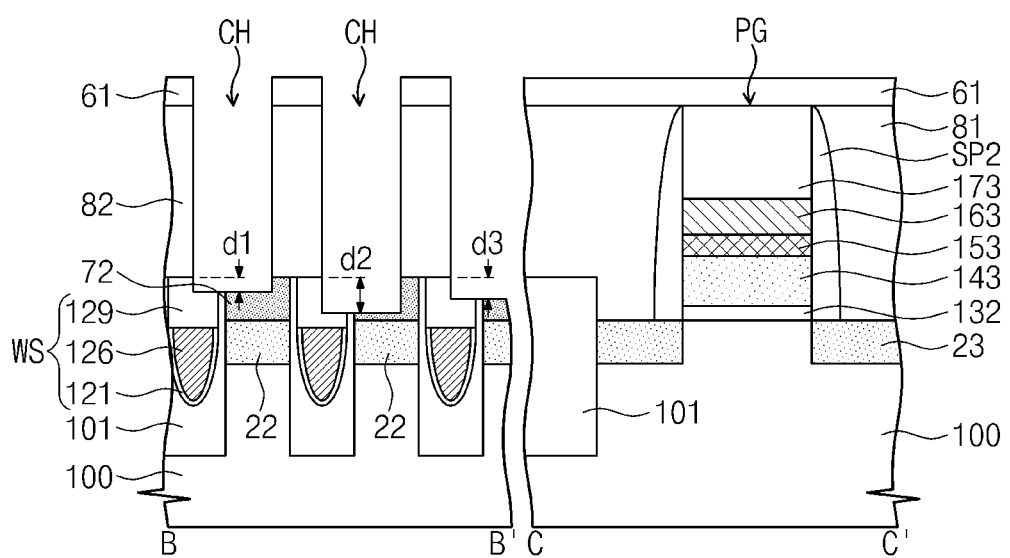

Referring to FIGS. 9A, 9B, and 9C, the first interlayered insulating layer 81 exposed by the mask pattern 61 may be etched to form preliminary contact holes CH. The etching process may be performed using a dry and/or wet etching process. During the etching process, the bit line structures BS exposed by the mask pattern 61 may be protected by the capping pattern 172 and the first spacer SP1. As the result of the etching process, the first interlayered insulating layer 81 on the cell array region CAR may be separated into the first interlayered insulating patterns 82 spaced apart from each other. Alternatively, the first interlayered insulating layer 81 on the peripheral circuit region PCR may be protected by the mask pattern 61. The preliminary contact holes CH may be delimited by sidewalls of the bit line structures BS and sidewalls of the first interlayered insulating patterns 82. In example embodiments, upper portions of the second sacrificial patterns 72, the device isolation layer 101, and the gate capping patterns 129 may also be etched during the formation of the preliminary contact holes CH.

At least some of the preliminary contact holes CH may be formed to have a different depth from others of the preliminary contact holes CH. For example, a distance from the top surfaces of the gate capping patterns 129 to the top surfaces of the second sacrificial patterns 72 exposed by the preliminary contact holes CH may have several different values (e.g., d1, d2, and d3, where d2>d3>d1), as shown in FIG.

9C. Areas of the top surfaces of the second sacrificial patterns 72 exposed by the preliminary contact holes CH may be different from each other. The variation in shape or structure of the preliminary contact holes CH may result from a difference in portion and relative configuration of the preliminary contact holes CH and neighboring layers and structures (e.g., the bit line structures BS or the word line structures WS).

Figure 10B:
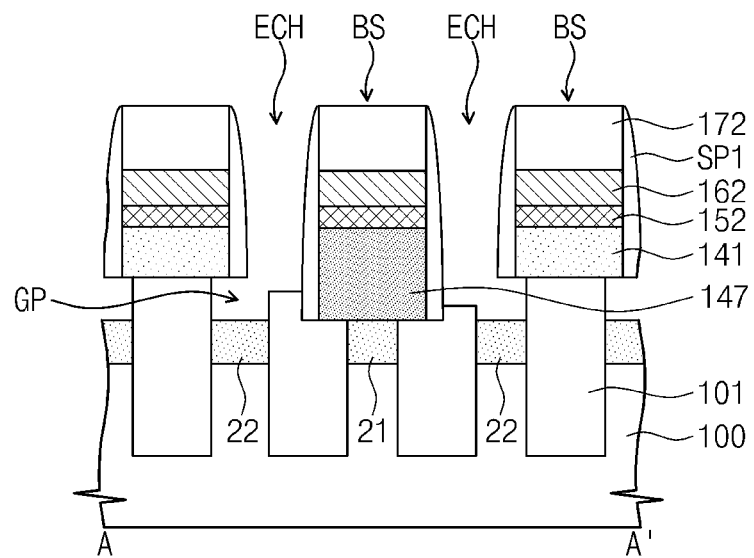
Figure 10C:
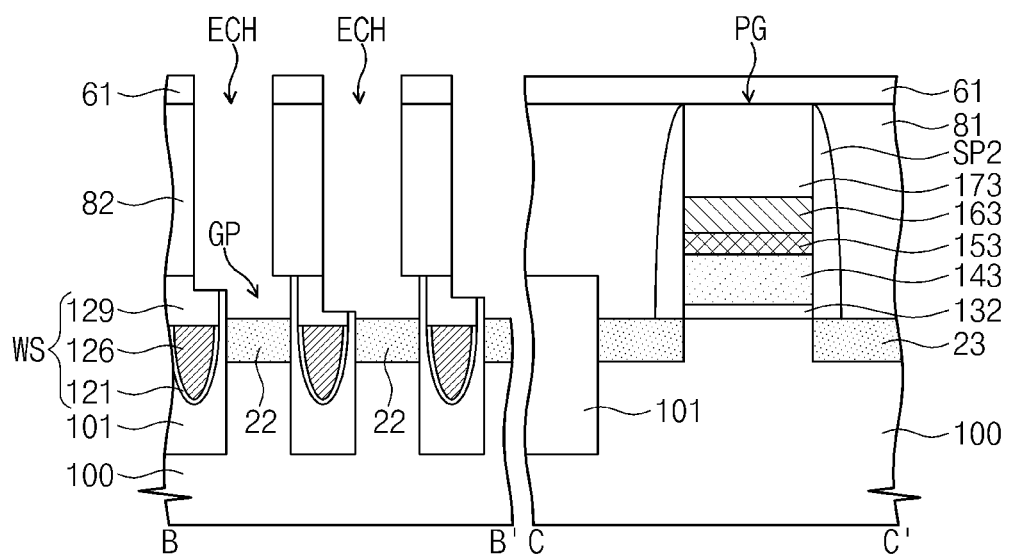

Referring to FIGS. 10A, 10B, and 10C, the second sacrificial patterns 72 exposed by the preliminary contact holes CH may be removed to form the gap regions GP exposing the second impurity regions 22. The gap regions GP may be delimited by the sidewall of the device isolation layer 101 and the top surfaces of the second impurity regions 22. As the result of the formation of the gap regions GP, the preliminary contact holes CH may extend toward the substrate 100 and form the contact holes ECH. The removal of the second sacrificial patterns 72 may include a selective etching process. For example, the selective etching process of the second sacrificial patterns 72 may be performed using an etching solution or an etching gas capable of suppressing the substrate 100 and the device isolation layer 101 from being etched and of selectively removing the second sacrificial patterns 72. For example, in the case where the second sacrificial patterns 72 include silicon-germanium, the selective removal of the second sacrificial patterns 72 may be performed using an etching solution containing peracetic acid. The etching solution may further contain hydrofluoric acid (HF) solution and deionized water. In example embodiments, in the case where the second sacrificial patterns 72 include a silicon nitride layer, the selective removal of the second sacrificial patterns 72 may be performed using an etching solution containing phosphoric acid ($H_3PO_4$). In spite of the difference in depth between the preliminary contact holes CH described with reference to FIG. 9C, the second impurity regions 22 exposed by the contact holes ECH may be exposed at the substantially same level, as the result of the selective removal of the second sacrificial patterns 72.

Figure 11A:
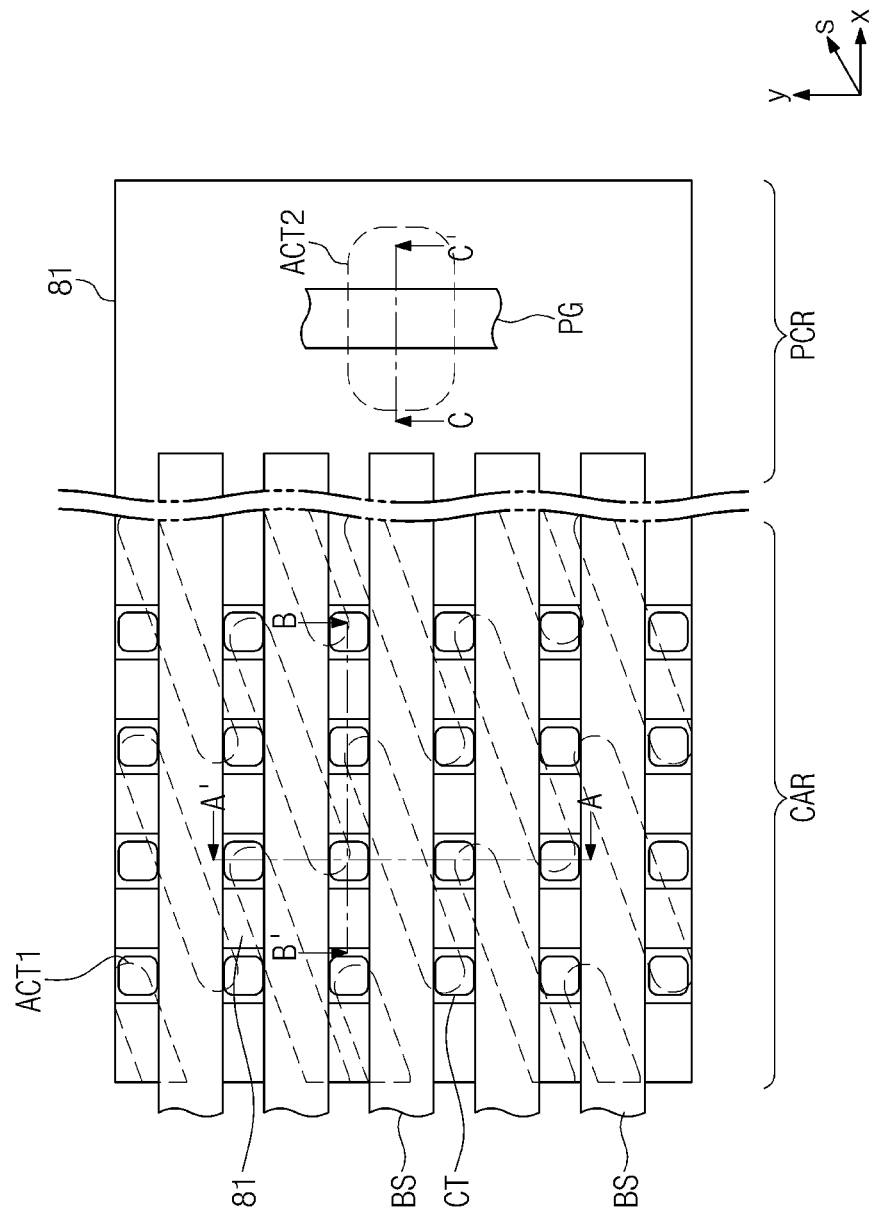
Figure 11B:
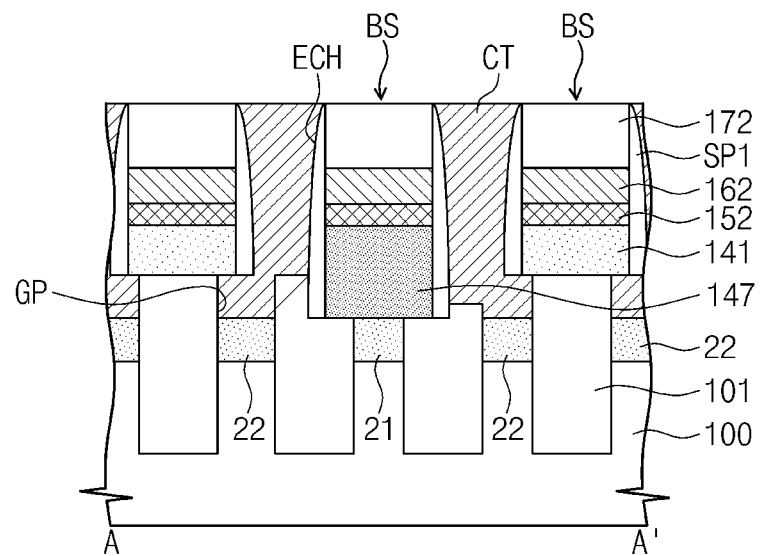
Figure 11C:
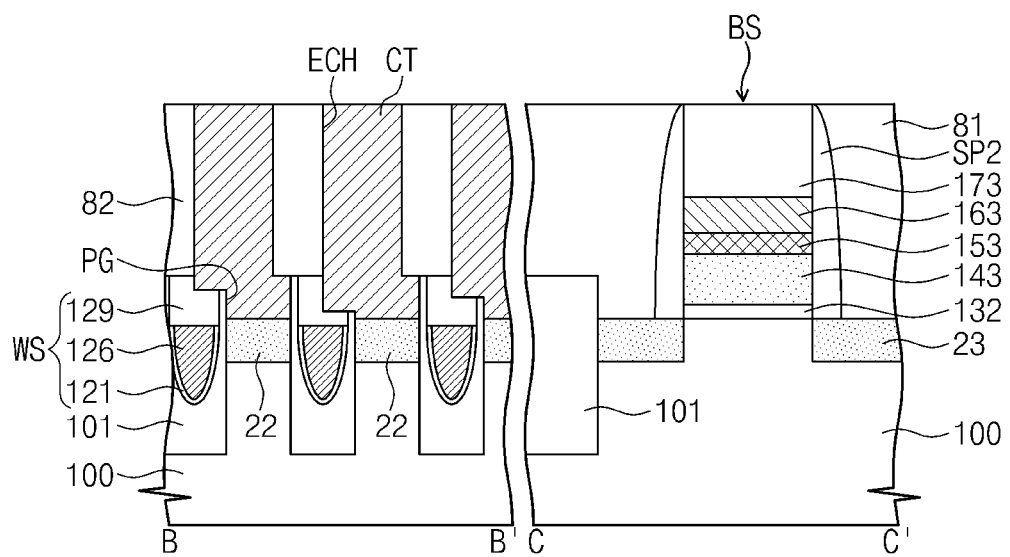

Referring to FIGS. 11A, 11B, and 11C, the contact structures CT may be formed to fill the contact holes ECH. The contact structures CT may be formed by forming a conductive layer to fill the contact holes ECH and performing an etch-back process. After the formation of the contact structures CT, the mask pattern 61 may be removed from the peripheral circuit region PCR. The contact structures CT may include at least one of a doped polysilicon layer, metals, conductive metal nitride layers, or metal-semiconductor compounds. Due to the presence of the gap regions GP, the contact structures CT may be formed to have a uniform contact area with the second impurity regions 22.

Referring back to FIGS. 1A, 1B, and 1C, the second interlayered insulating layer 116 may be formed to cover the bit line structures BS and the peripheral gate structure PG, and the contact pads 115 may be connected to the contact structures CT through the second interlayered insulating layer 116. The contact pads 115 may be formed on a corresponding one of the contact structures CT and separated from each other.

The peripheral contact 186 may be formed to be connected to the third impurity region 23 of the peripheral circuit region PCR. The peripheral contact 186 may be formed to connect the peripheral conductive line 185 provided on the second interlayered insulating layer 116 electrically to the third impurity region 23. The peripheral conductive line 185 may be electrically connected to the bit line structures BS, but example embodiments of inventive concepts may not be limited thereto.

The third interlayered insulating layer 117 may be formed on the second interlayered insulating layer 116, and then, the lower electrodes 182 may be formed through the third interlayered insulating layer 117 and be connected to the contact pads 115. In example embodiments, each of the lower electrodes 182 may be shaped like a bottom-closed cylinder. The formation of the lower electrodes 182 may include forming a sacrificial layer (not shown) to expose the contact pads 115, conformally forming a conductive layer on the sacrificial layer, and then, forming a gap-filling layer on the conductive layer. Thereafter, an etching process may be performed to the conductive layer to form the lower electrodes 182, each of which is connected to a corresponding one of the contact pads 115, and then, the sacrificial layer and the gap-filling layer may be removed.

The contact pads 115 and the lower electrodes 182 may be formed of at least one of metals, conductive metal compounds or doped semiconductors. The interlayered insulating layers 116 and 117 may be formed of at least one of silicon oxide, silicon nitride, or silicon oxynitride. The contact pads 115, the lower electrodes 182, and the interlayered insulating layers 116 and 117 may be formed by a sputtering or CVD process.

The dielectric layer 183 and the upper electrode 184 may be sequentially formed on the lower electrodes 182. The lower electrodes 182, the dielectric layer 183 and the upper electrode 184 may constitute the capacitors CAP serving as memory elements of the semiconductor device. The upper electrode 184 may be formed of the substantially same material as the lower electrodes 182.

In example embodiments, by using the etching process using the sacrificial pattern, it is possible to reduce the variation in depth of the contact holes and to maintain or increase a contact area between the contact structures and the second impurity regions. Accordingly, it is possible to limit (and/or prevent) a misalignment between the contact structures and the impurity region or to suppress an increase of leakage current or contact resistance, which may occur by variation in depth of the contact structures.

FIGS. 12A through 14A are sectional views taken along the line A-A' of FIG. 1A and illustrate semiconductor devices and methods of fabricating the same according to example embodiments of inventive concepts. FIGS. 12B through 14B are sectional views taken along the lines B-B' and C-C' of FIG. 1A. For the sake of brevity, the elements and features of this example that are similar to those previously shown and described will not be described in much further detail.

Figure 12A:
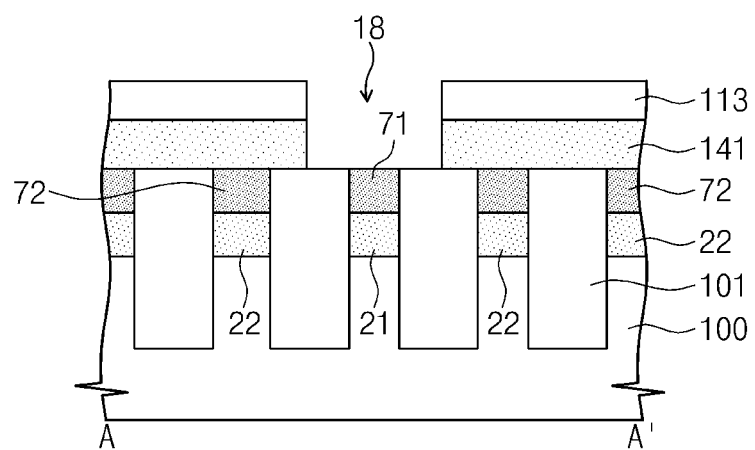
Figure 12B:
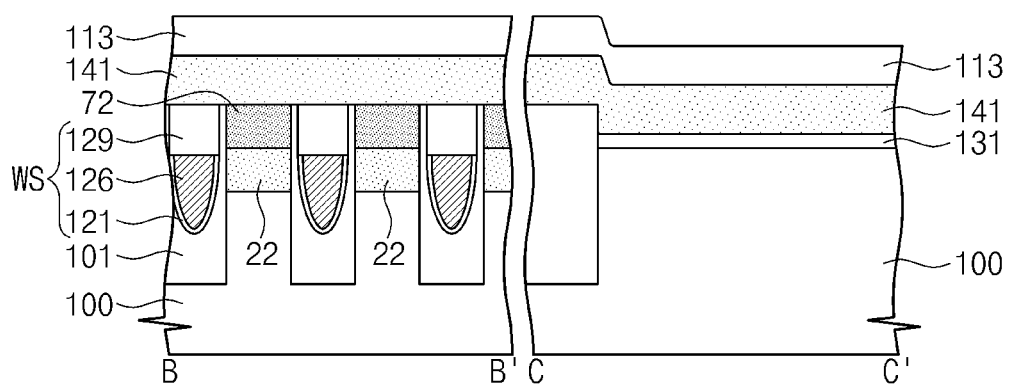

Referring to FIGS. 1A, 12A and 12B, the mask pattern 112 may be removed from the resulting structure described with reference to FIGS. 6A, 6B, and 6C, and then, first semiconductor patterns 141 may be formed on the cell array region CAR and the peripheral circuit region PCR. For example, the first semiconductor patterns 141 may be formed of a undoped silicon layer. A mask pattern 113 may be formed on the first semiconductor patterns 141, and by using the mask pattern 113 as an etch mask, through holes 18 may be formed to expose the first impurity regions 21 through the first semiconductor patterns 141. In example embodiments, the through holes 18 may be formed to have a section shaped like a circle or an ellipse, in plan view. The through holes 18 may be formed to expose top surface of the first sacrificial patterns 71. For example, the formation of the through holes 18 may be performed by an etching process using the first sacrificial patterns 71 as an etch stop layer.

Figure 13A:
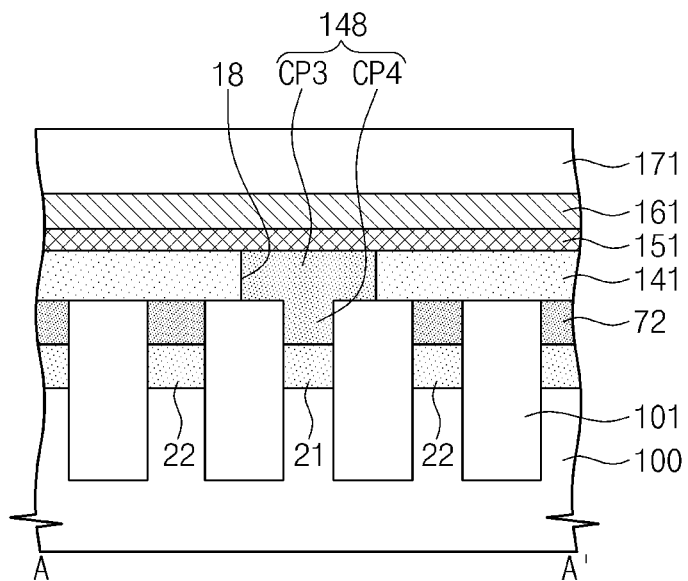
Figure 13B:
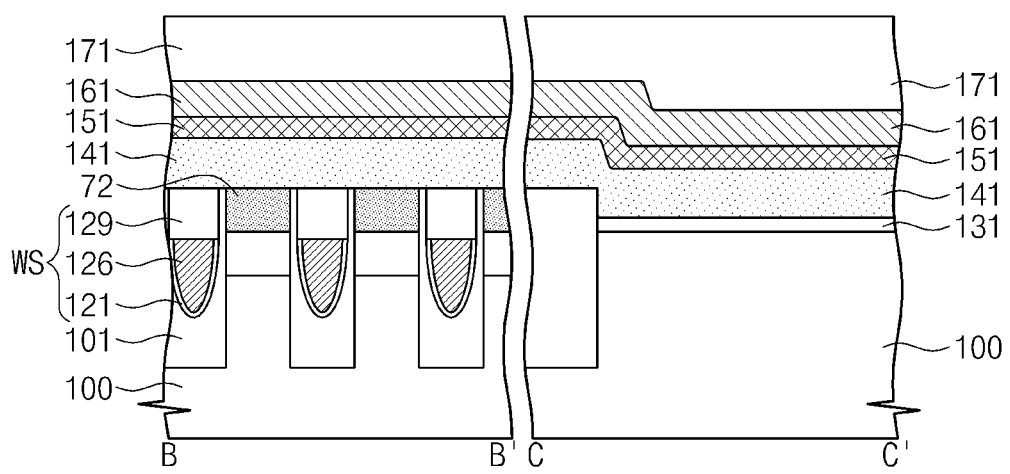

Referring to FIGS. 1A, 13A, and 13B, the first sacrificial patterns 71 exposed by the through holes 18 may be selectively etched or removed. The first impurity regions 21 may be exposed by the removal of the first sacrificial patterns 71. The selective etching process of the first sacrificial patterns 71 may be performed using an etching solution or an etching gas, which is selected to suppress the substrate 100 and the device isolation layer 101 from being etched and to remove selectively the first sacrificial patterns 71. For example, in the case where the first sacrificial patterns 71 include silicon-germanium, the selective removal of the first sacrificial patterns 71 may be performed using an etching solution containing peracetic acid. The etching solution may further contain hydrofluoric acid (HF) solution and deionized water. In example embodiments, in the case where the first sacrificial pattern 71 includes a silicon nitride layer, the selective removal of the first sacrificial patterns 71 may be performed using an etching solution containing phosphoric acid (H3PO4).

First conductive patterns 148 may be formed on the resulting structure, in which the first sacrificial patterns 71 are removed, to fill the through holes 18. Each of the first conductive patterns 148 may include a third portion CP3, which is overlapped with and spaced apart from the device isolation layer 101 in plan view, and a fourth portion CP4, which extends from the third portion CP3 toward the substrate 100 and fill a region delimited by a top surface of the first impurity region 21 and a sidewall of the device isolation layer 101. The fourth portion CP4 may be shaped like a plug protruding from the third portion CP3 toward the substrate 100.

A barrier layer 151, a second conductive layer 161 and a capping layer 171 may be sequentially formed on the resulting structure provided with the first conductive patterns 148. The barrier layer 151 may include at least one of conductive metal nitrides and/or metal-silicon compounds. The barrier layer 151 may be formed using a CVD or ALD process. The second conductive layer 161 may include at least one of metals, conductive metal nitrides, or metal-silicon compounds. For example, the second conductive layer 161 may include at least one of W, Ti, or Ta. The capping layer 171 may include at least one of silicon oxide, silicon nitride or silicon oxynitride. The second conductive layer 161 and the capping layer 171 may be formed by a sputtering or CVD method.

Figure 14A:
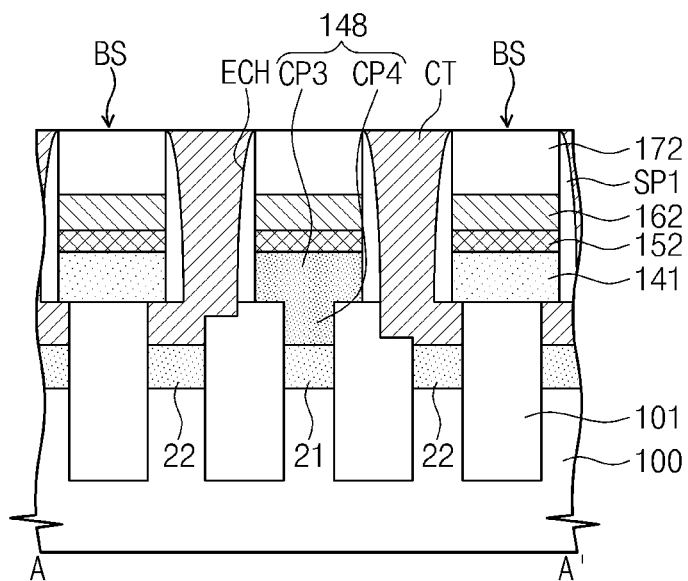
Figure 14B:
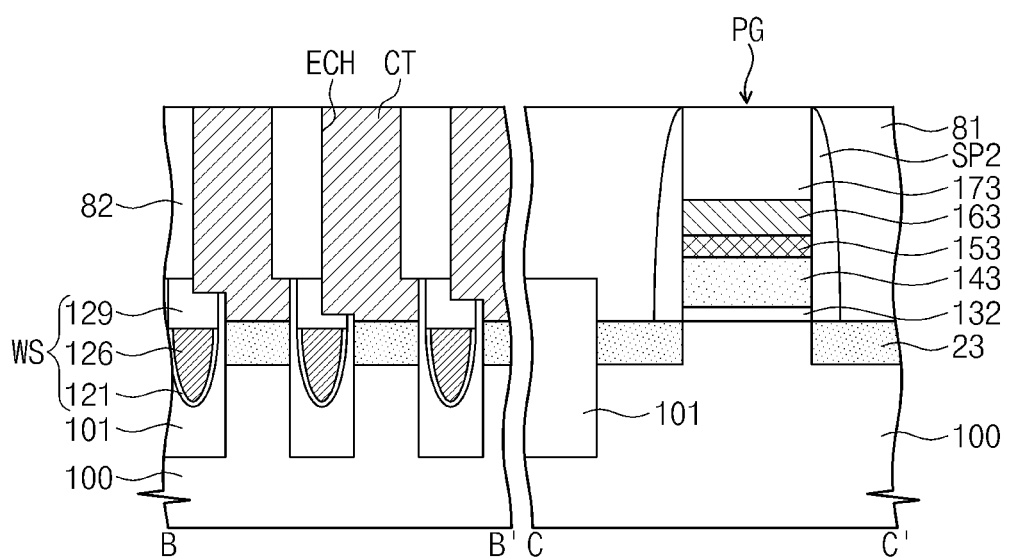

Referring to FIGS. 1A, 14A, and 14B, bit line structures BS may be formed on the cell array region CAR, and a peripheral gate structure PG may be formed on the peripheral circuit region PCR. Contact structures CT may be formed to fill contact holes ECH and be connected to the second impurity regions 22, respectively. In example embodiments, the bit line structures BS, the peripheral gate structure PG, and the contact structures CT may be formed using substantially the same process previously described with reference to FIGS. 8A through 11C.

FIGS. 15A through 23A are plan views illustrating methods of fabricating a semiconductor device according to example embodiments of inventive concepts. FIGS. 15B through 23B are sectional views taken along line A-A' of FIGS. 15A through 23A, respectively, and FIGS. 15C through 23C are sectional views taken along lines B-B' and C-C' of FIGS. 15A through 23A, respectively.

Figure 15A:
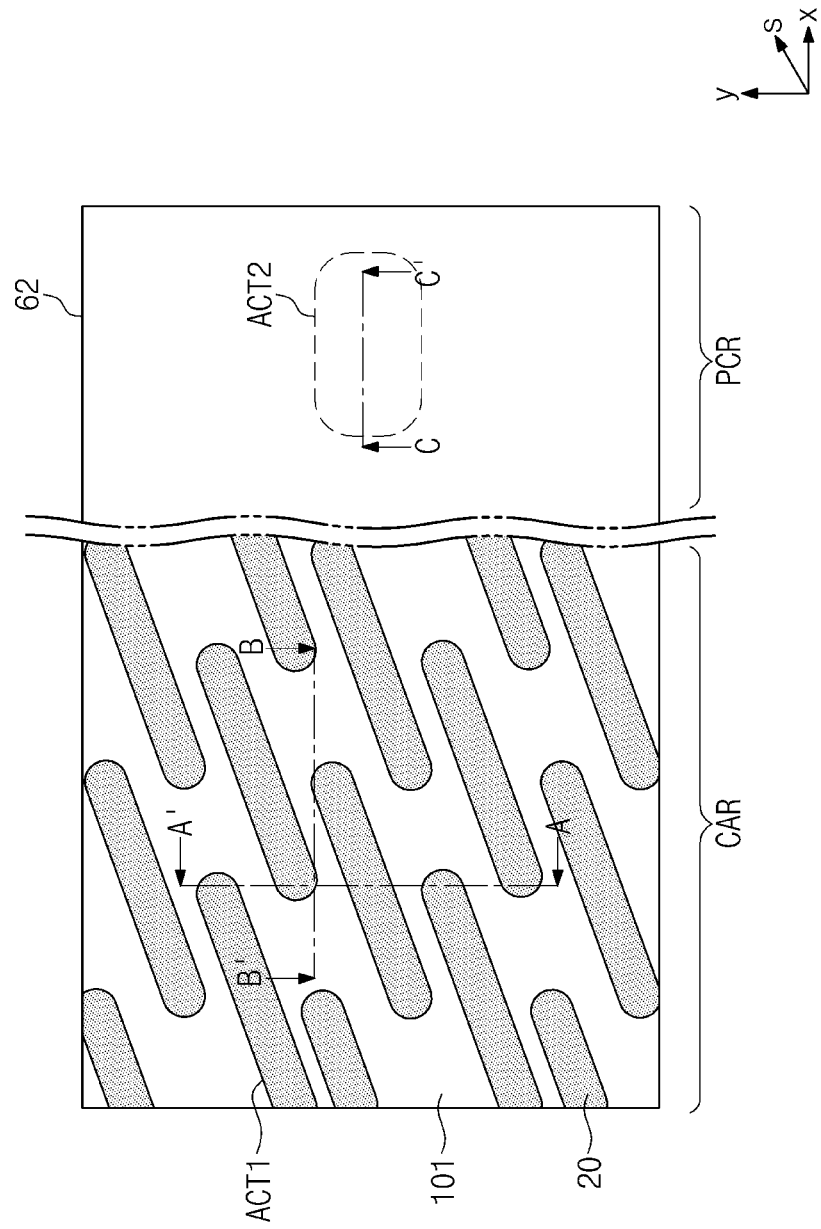
Figure 15B:
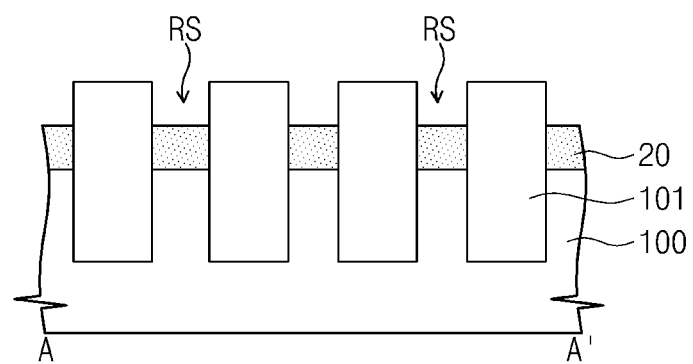
Figure 15C:
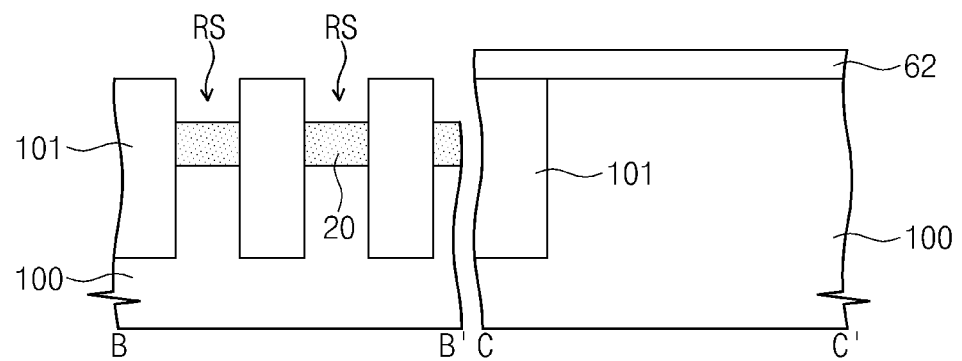

Referring to FIGS. 15A, 15B and 15C, the device isolation layers 101 may be formed on the substrate 100 to delimit the first active regions ACT1 in the cell array region CAR and the second active region ACT2 in the peripheral circuit region PCR. The first active regions ACT1 may be horizontally separated from each other to have a bar-shaped structure and extend along a third direction (hereinafter, s direction) at an angle to both of the first direction (hereinafter, x direction) and the second direction (hereinafter, y direction). Here, the x direction and the y direction may be directions crossing each other.

A mask pattern 62 may be formed to cover the peripheral circuit region PCR, and then, upper portions of the first active regions ACT1 exposed by the device isolation layer 101 may be etched to form recess regions RS. In example embodiments, the mask pattern 62 may include a silicon oxide layer or a silicon nitride layer. The recess regions RS may be delimited by the sidewall of the device isolation layer 101 and the top surface of the substrate 100. The formation of the recess regions RS may include a dry and/or wet etching process.

After the formation of the recess regions RS, impurity regions 20 may be formed in the upper portions of the first active regions ACT1. The impurity region 20 may be formed by an ion implantation process injecting impurities ions with a different conductivity type from the substrate 100 into the upper portions of the substrate 100. In other embodiments, the impurity region 20 may be formed before the formation of the device isolation layer 101 or between the formation of the device isolation layer 101 and the formation of the recess regions RS.

Figure 16B:
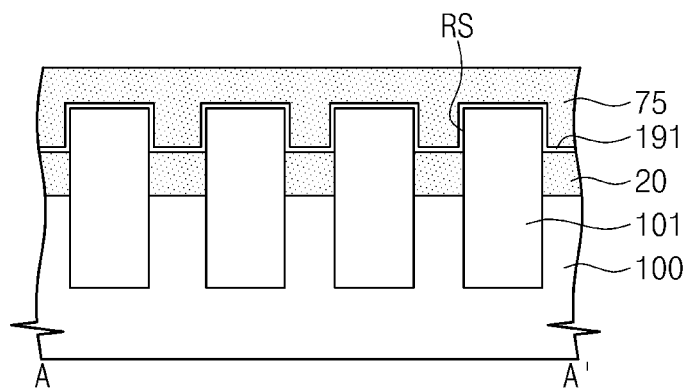
Figure 16C:
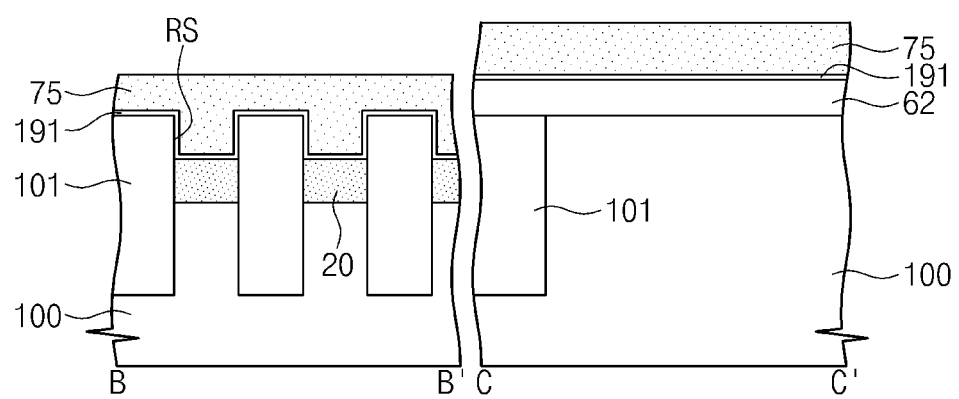

Referring to FIGS. 16A, 16B, and 16C, a first etch stop layer 191 and a sacrificial layer 75 may be sequentially formed on the resulting structure provided with the recess regions RS. The sacrificial layer 75 may be formed of a material having an etch selectivity with respect to the substrate 100 and the device isolation layer 101. For example, the sacrificial layer 75 may be formed of at least one of silicon-germanium compounds, a silicon nitride layer, a silicon oxynitride layer, or silicon-metal compounds. The first etch stop layer 191 may include at least one material that is selected from a group consisting of a silicon nitride layer, a silicon oxynitride layer, metals, metal-silicon compounds, and conductive metal nitrides but is different from a material for the sacrificial layer 75.

Figure 17B:
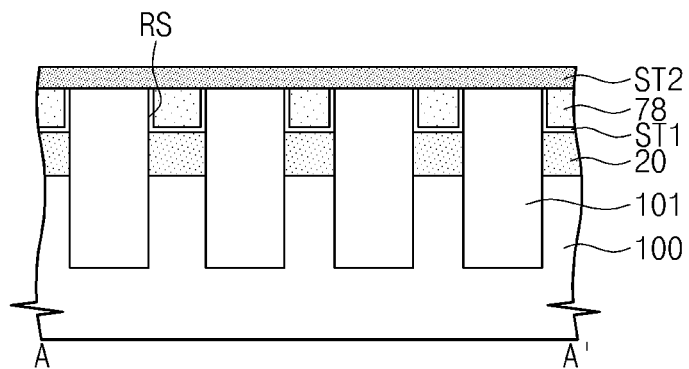
Figure 17C:
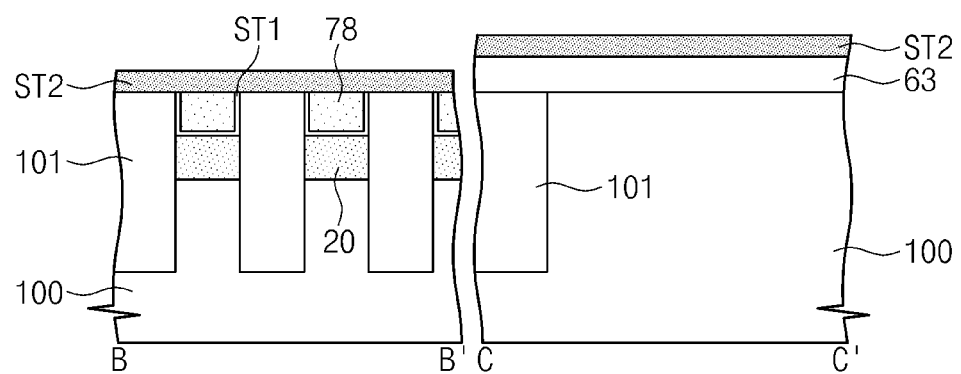

Referring to FIGS. 17A, 17B, and 17C, a planarization process may be performed to confine or localize the first etch stop layer 191 and the sacrificial layer 75 into the recess regions RS. Accordingly, a first etch stop pattern ST1 and a preliminary sacrificial pattern 78 may be locally formed in each of the recess regions RS. During the planarization process, the mask pattern 62 may be removed from the peripheral circuit region PCR.

A mask pattern 63 may be formed to cover the peripheral circuit region PCR, and then, a second etch stop pattern ST2 may be formed on the substrate 100. The second etch stop pattern ST2 may include at least one material that is selected from a group consisting of a silicon nitride layer, a silicon oxynitride layer, metals, metal-silicon compounds, and conductive metal nitrides but is different from a material for the sacrificial layer 75.

Figure 18A:
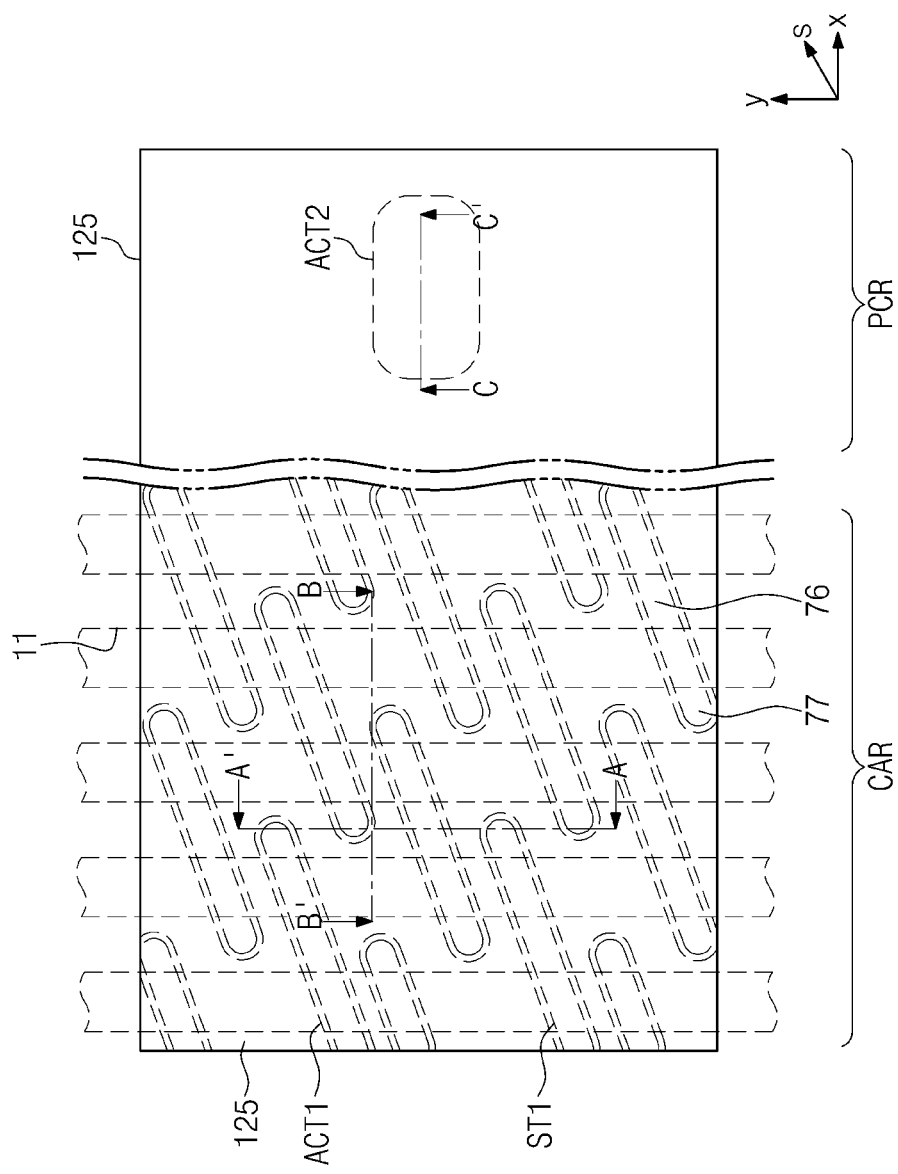
Figure 18B:
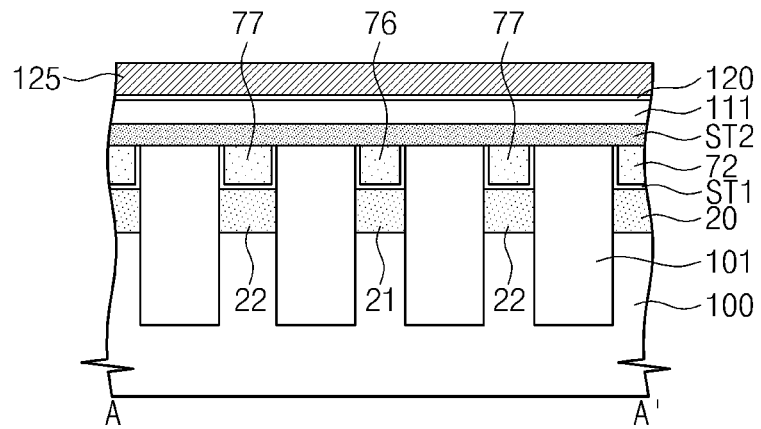
Figure 18C:
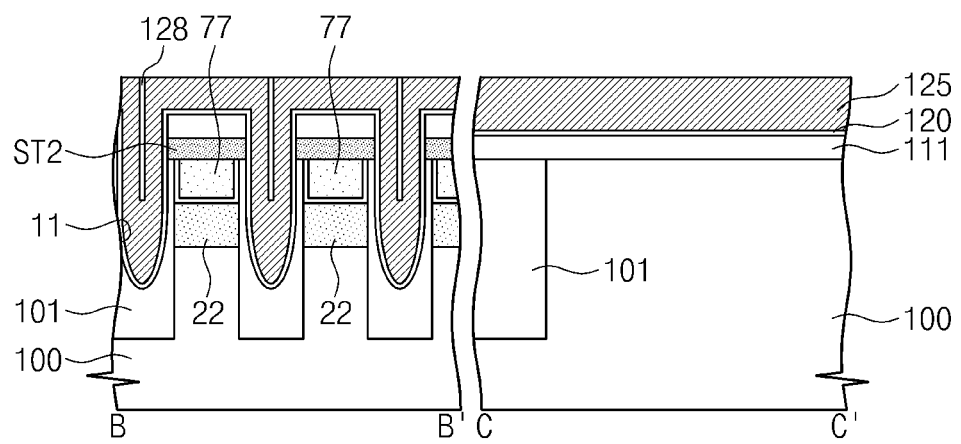

Referring to FIGS. 18A, 18B and 18C, trenches 11 may be formed to extend toward the top surface of the substrate 100 through the second etch stop pattern ST2 of the cell array region CAR. The trenches 11 may be formed by an etching process using a mask pattern 111 as an etch mask. The trenches 11 may extend along the y direction and be spaced apart from each other in the x direction, such that the impurity region 20 may be separated into the first impurity regions 21 and the second impurity regions 22. In other words, in each of the first active region ACT1, the first impurity region 21 may be provided between a pair of the second impurity regions 22, and the first impurity region 21 and the second impurity regions 22 may be separated from each other by the trenches 11. The trenches 11 may separate the preliminary sacrificial pattern 78 into a plurality of sacrificial patterns. The sacrificial patterns may include first sacrificial patterns 76 on the first impurity regions 21 and second sacrificial patterns 77 on the second impurity regions 22.

A first insulating layer 120, a conductive layer 125, and a filling layer 128 may be sequentially formed on the resulting structure provided with the trenches 11. The first insulating layer 120 and the conductive layer 125 may be formed in the trenches 11, and then, the filling layer 128 may be formed to fill the trenches 11 provided with the first insulating layer 120 and the conductive layer 125. The formation of the filling layer 128 may include forming an insulating layer on the conductive layer 125 and then performing a planarization process.

Figure 19A:
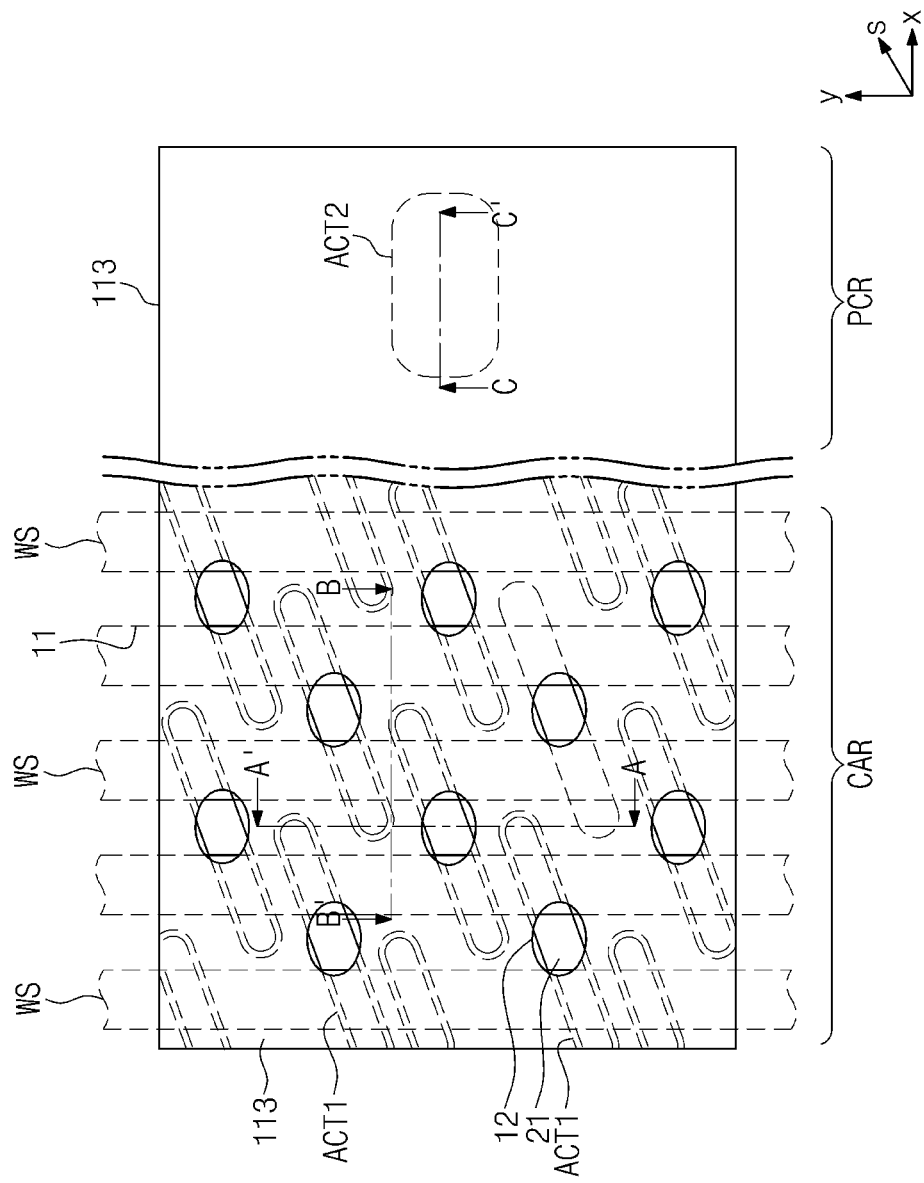
Figure 19B:
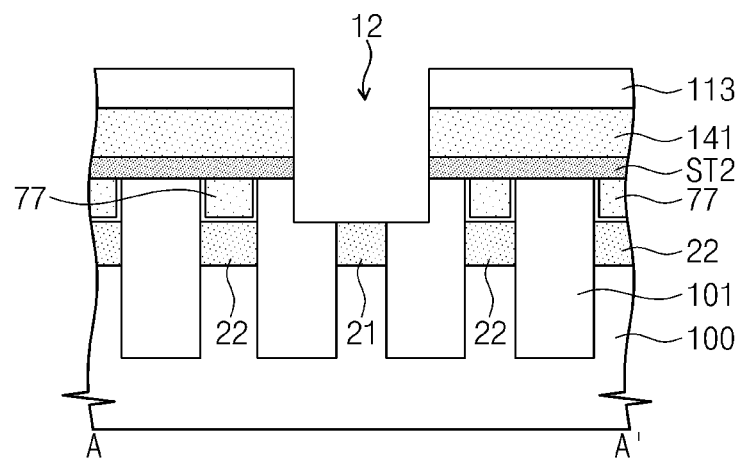
Figure 19C:
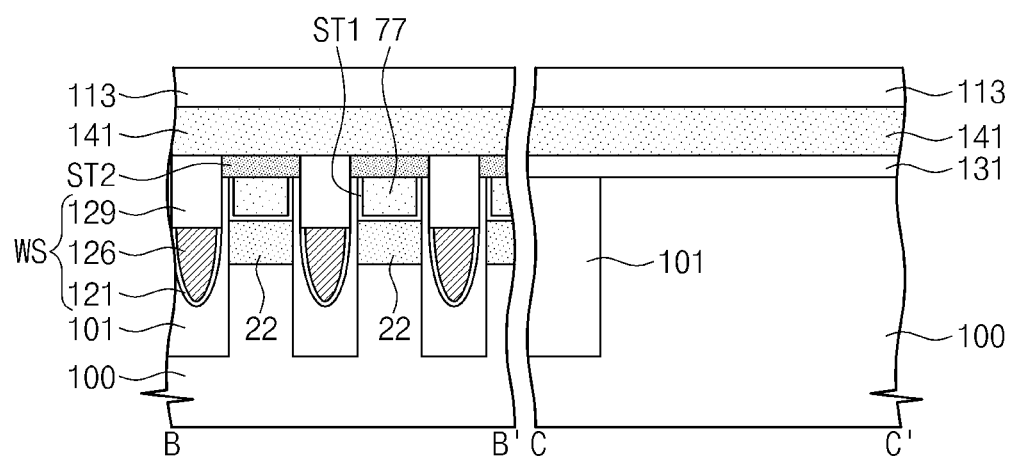

Referring to FIGS. 19A, 19B, and 19C, the first insulating layer 120 and the conductive layer 125 may be etched and localized into the trenches 11. As the result of the etching process, the first insulating layer 120 may form the gate insulating layers 121 separated from each other and the conductive layer 125 may form the gate electrodes 126 separated from each other. The etching process may be performed until the filling layer 128 is removed, and thus, the gate insulating layers 121 and the gate electrodes 126 may have top surfaces that are lower than top surfaces of the trenches 11. The mask pattern 111 may be removed during the etching process. The first insulating layer 120 and the conductive layer 125 provided on the peripheral circuit region PCR may be removed during the etching process.

The gate capping patterns 129 may be formed on the gate electrodes 126. The gate capping patterns 129 may be formed by forming an insulating layer to fill remaining portions of the trenches 11 provided with the gate electrodes 126 and performing a planarization process to expose the top surface of the substrate 100. The insulating layer provided on the peripheral circuit region PCR may be removed by the planarization process. The gate capping patterns 129 may include at least one of a silicon nitride layer, a silicon oxide layer, or a silicon oxynitride layer. As the result of the formation of the gate capping patterns 129, cell gate structures may be formed in the trenches 11. The cell gate structures may serve as word line structures WS of the semiconductor device.

A second insulating layer 131 may be formed on the peripheral circuit region PCR. The second insulating layer 131 may include at least one of silicon oxide, silicon oxynitride, or high-k dielectrics having a higher dielectric constant than silicon oxide.

The first semiconductor patterns 141 may be formed on the cell array region CAR and the peripheral circuit region PCR. For example, the first semiconductor patterns 141 may be formed of an un-doped silicon layer. Through holes 12 may be formed to expose the first impurity regions 21 through the first semiconductor patterns 141. The first sacrificial patterns 76 may be removed by the formation of the through holes 12. In example embodiments, the through holes 12 may be formed to have a section shaped like a circle or an ellipse, in plan view. The formation of the through holes 12 may include forming a mask pattern 113 on the first semiconductor patterns 141, and then, performing a dry and/or wet etching process using the mask pattern 113 as an etch mask. The first semiconductor patterns 141 on the peripheral circuit region PCR may be doped with impurities ions, before or after the formation of the through holes 12.

In example embodiments, a mask pattern (not shown) may be formed to cover the cell array region CAR, and an ion implantation process may be performed to the first semiconductor patterns 141 on the peripheral circuit region PCR. The first semiconductor patterns 141 doped with impurities may have a conductivity type of p- or n-type, depending on whether the transistor on the peripheral circuit region PCR is a PMOS transistor or an NMOS transistor.

Figure 20B:
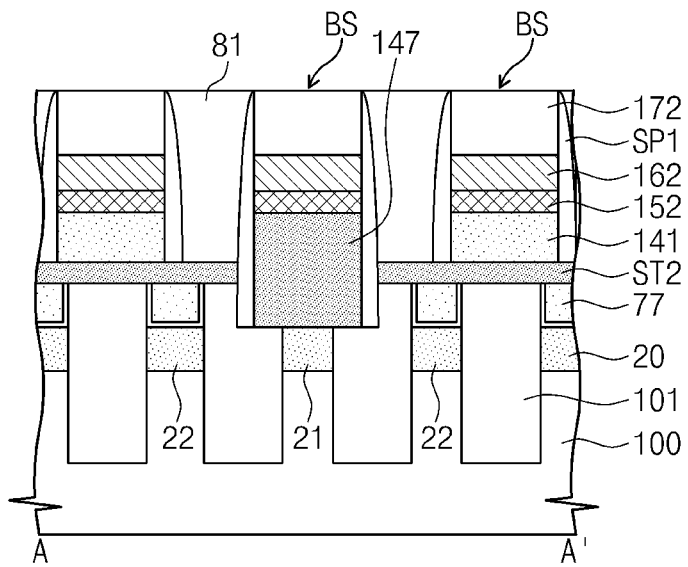
Figure 20C:
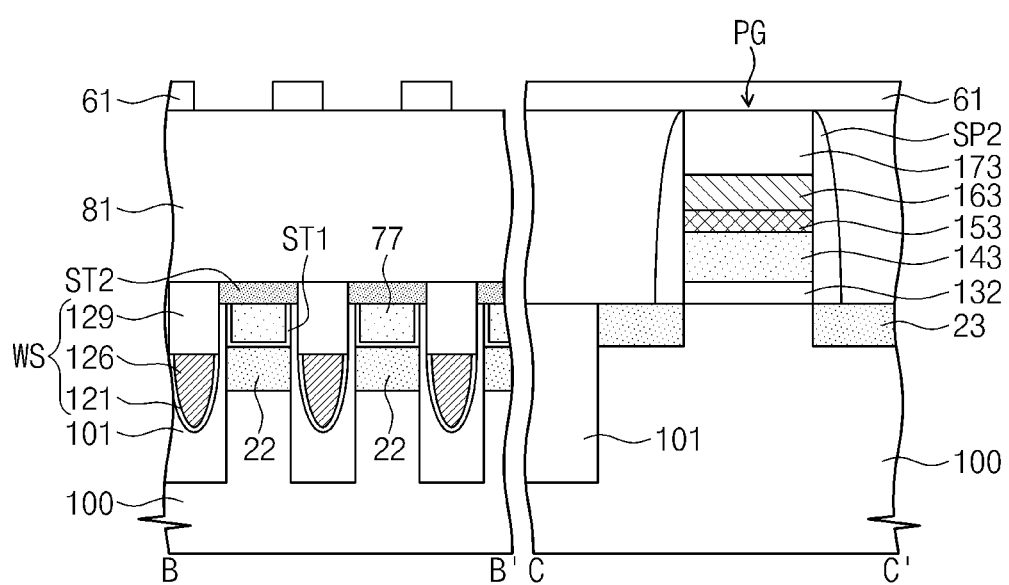

Referring to FIGS. 20A, 20B, and 20C, the first conductive patterns 147 may be formed to fill the through holes 12. In example embodiments, the first conductive patterns 147 may be a doped silicon layer. The first conductive patterns 147 may be formed by removing the mask pattern 113, forming a semiconductor layer to fill the through holes 12, and then, performing a planarization process. The first conductive patterns 147 may be doped in an in-situ manner and have the same conductivity type as the first impurity regions 21.

A barrier layer, a second conductive layer and a capping layer may be sequentially formed on the resulting structure provided with the first conductive patterns 147. The first semiconductor patterns 141, the barrier layer, the second conductive layer and the capping layer may be patterned to form conductive lines on the cell array region CAR and a peripheral gate structure PG on the peripheral circuit region PCR. The conductive lines may serve as bit line structures BS of the semiconductor device. The bit line structures BS may include a plurality of first conductive patterns 147 coupled to the first impurity regions 21, respectively, and the barrier pattern 152, the second conductive pattern 162, and the capping pattern 172 sequentially stacked on the first conductive patterns 147. The peripheral gate structure PG may include the gate insulating layer 132, the first conductive pattern 143, the barrier pattern 153, the second conductive pattern 163 and the capping pattern 173 that are sequentially stacked on the substrate 100. The formation of the bit line structures BS and the peripheral gate structure PG may include forming first spacers SP1 and second spacers SP2 on sidewalls of the bit line structures BS and the peripheral gate structure PG, respectively.

The third impurity region 23 may be formed in the substrate 100 of the peripheral circuit region PCR to be adjacent to the peripheral gate structure PG. The formation of the third impurity region 23 may include an ion implantation process to be performed on the substrate 100 exposed by the peripheral gate structure PG, and the ion implantation process may be performed using impurities having the same conductivity type as the first conductive pattern 143.

The first interlayered insulating layer 81 may be formed on the resulting structure provided with the bit line structures BS and the peripheral gate structure PG. The first interlayered insulating layer 81 may be formed to fill empty spaces between the bit line structures BS. For example, the first interlayered insulating layer 81 may include a silicon oxide layer and/or a silicon oxynitride. As the result of the planarization process, the first interlayered insulating layer 81 may be formed to expose top surfaces of the capping patterns 172 and 173. A mask pattern 61 may be formed on the first interlayered insulating layer 81. In the cell array region CAR, the mask pattern 61 may be formed to cross the bit line structures BS. In example embodiments, the mask pattern 61 may be formed to have a line shape extending parallel to the word line structures WS. The peripheral circuit region PCR may be covered with the mask pattern 61.

Figure 21A:
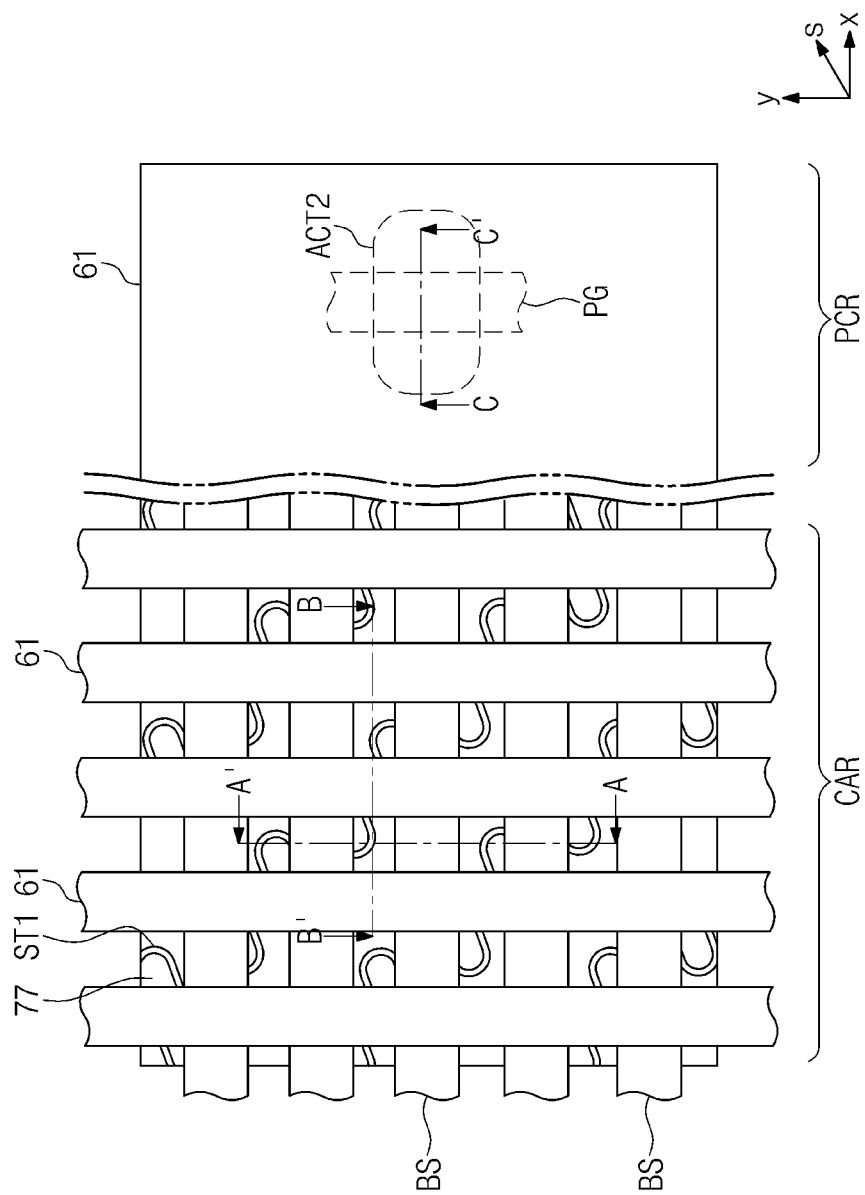
Figure 21B:
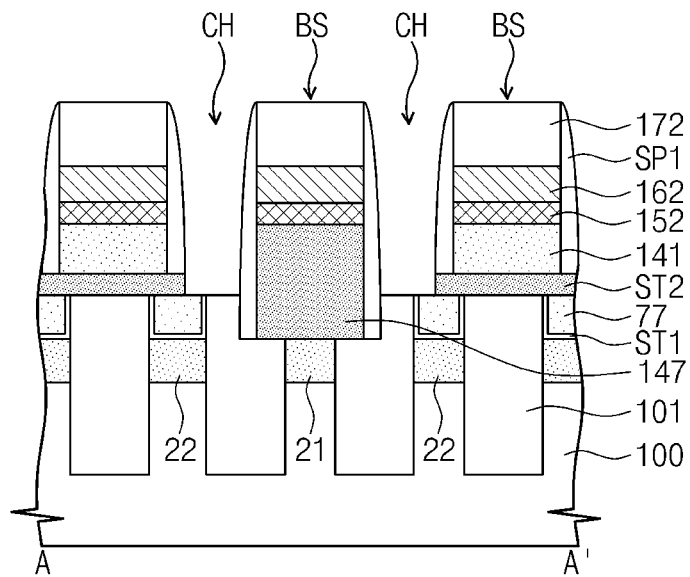
Figure 21C:
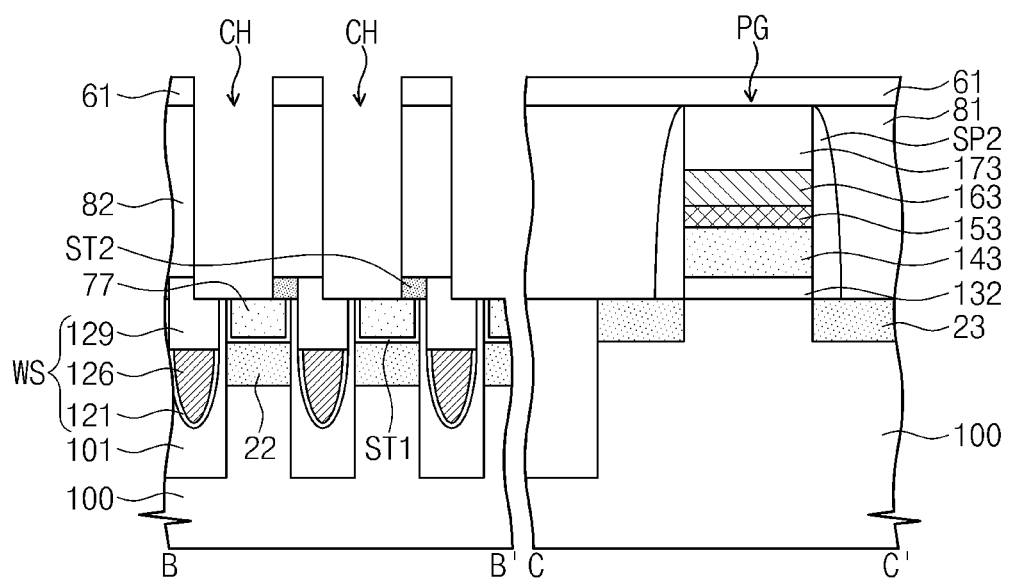

Referring to FIGS. 21A, 21B, and 21C, the first interlayered insulating layer 81 exposed by the mask pattern 61 may be etched to form preliminary contact holes CH. The formation of the preliminary contact holes CH may include an etching process, in which the second etch stop pattern ST2 is used. As the result of the etching process, the second sacrificial patterns 77 may be exposed. During the etching process, the bit line structures BS exposed by the mask pattern 61 may be protected by the capping pattern 172 and the first spacer SP1. As the result of the etching process, the first interlayered insulating layer 81 on the cell array region CAR may be separated into the first interlayered insulating patterns 82 spaced apart from each other. Alternatively, the first interlayered insulating layer 81 on the peripheral circuit region PCR may be protected by the mask pattern 61. The preliminary contact holes CH may be delimited by sidewalls of the bit line structures BS and sidewalls of the first interlayered insulating patterns 82.

Figure 22A:
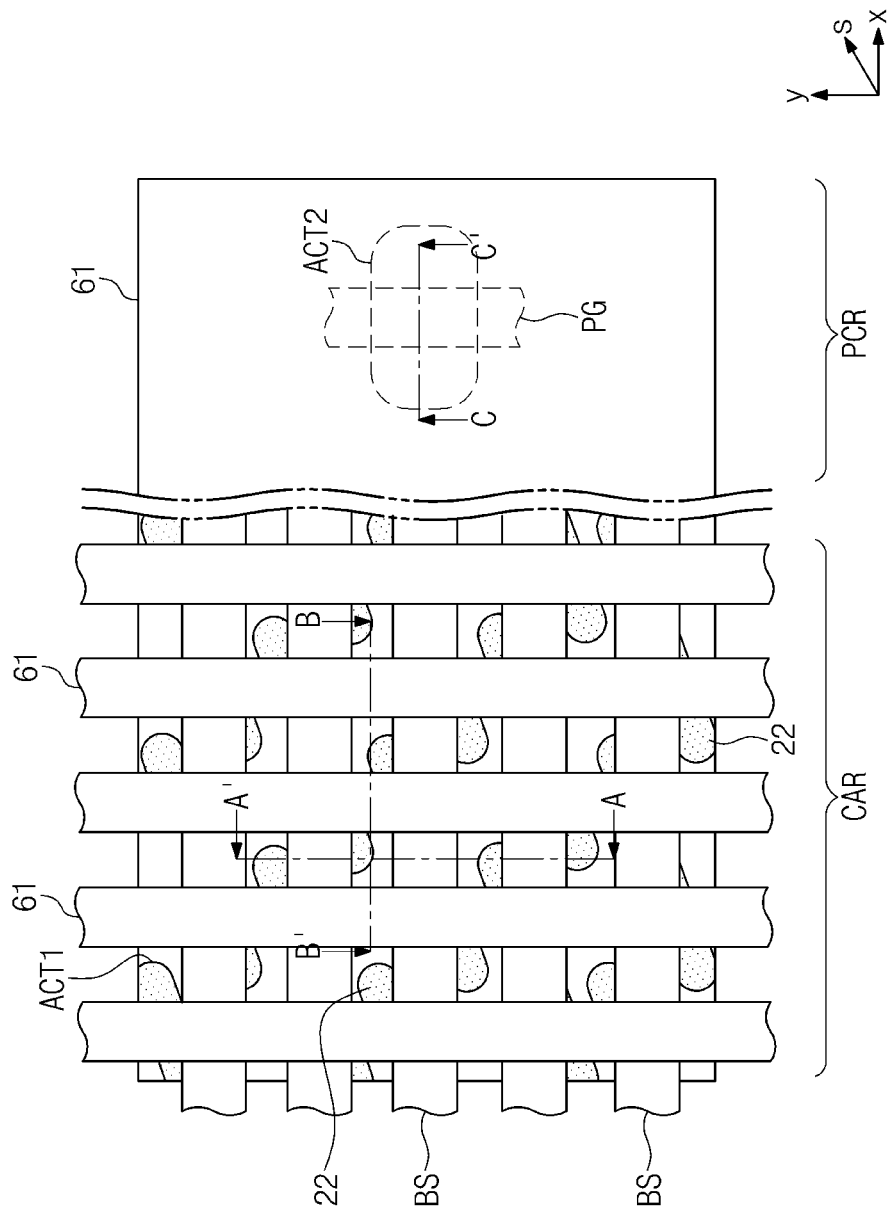
Figure 22B:
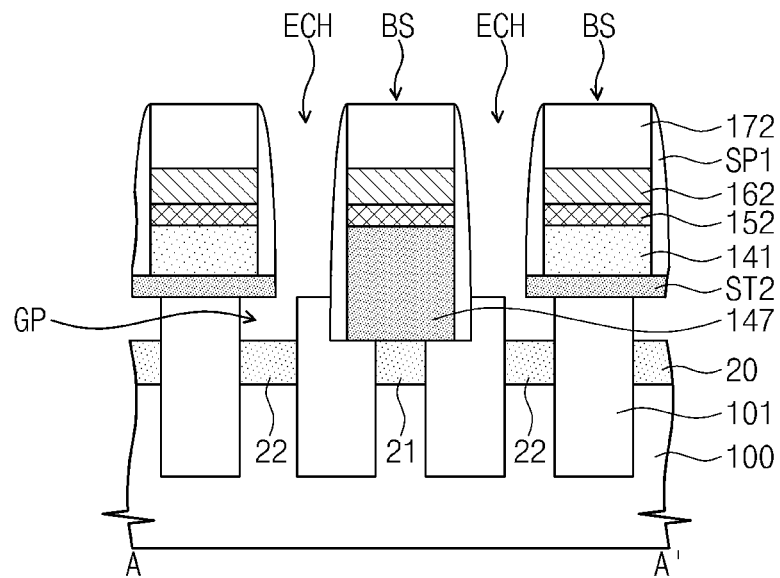
Figure 22C:
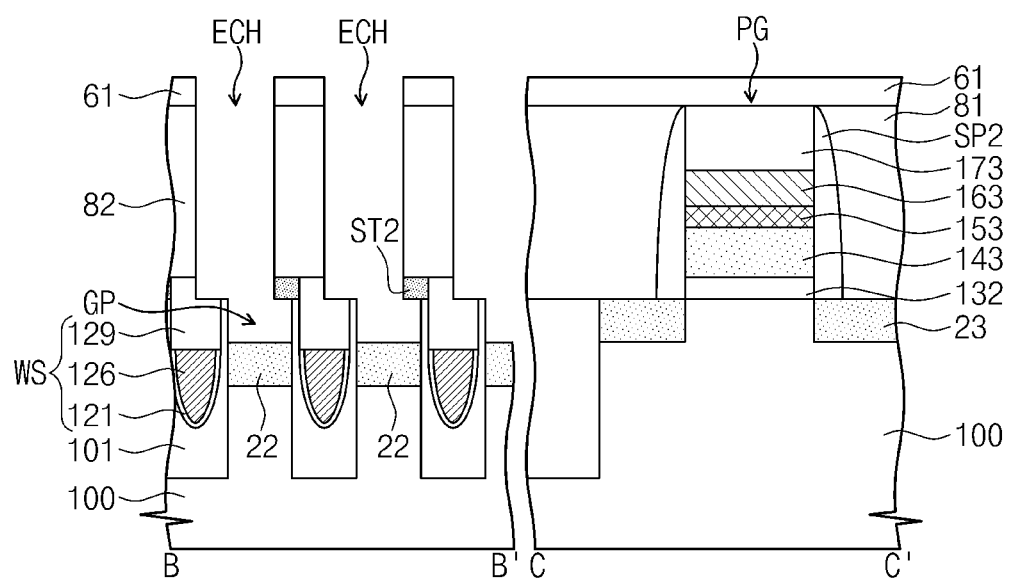

Referring to FIGS. 22A, 22B, and 22C, the second sacrificial patterns 72 exposed by the preliminary contact holes CH may be removed to form the gap regions GP exposing the second impurity regions 22. The gap regions GP may be delimited by the sidewall of the device isolation layer 101 and the top surfaces of the second impurity regions 22. As the result of the formation of the gap regions GP, the preliminary contact holes CH may extend toward the substrate 100 and form the contact holes ECH. The removal of the second sacrificial patterns 77 may include a selective etching process. The first etch stop pattern ST1 may limit (and/or prevent) the second impurity regions 22 from being damaged by etching solution or etching gas to be used in the removal of the second sacrificial patterns 77. Thereafter, the first etch stop pattern ST1 may be removed to expose the second impurity regions 22.

Figure 23A:
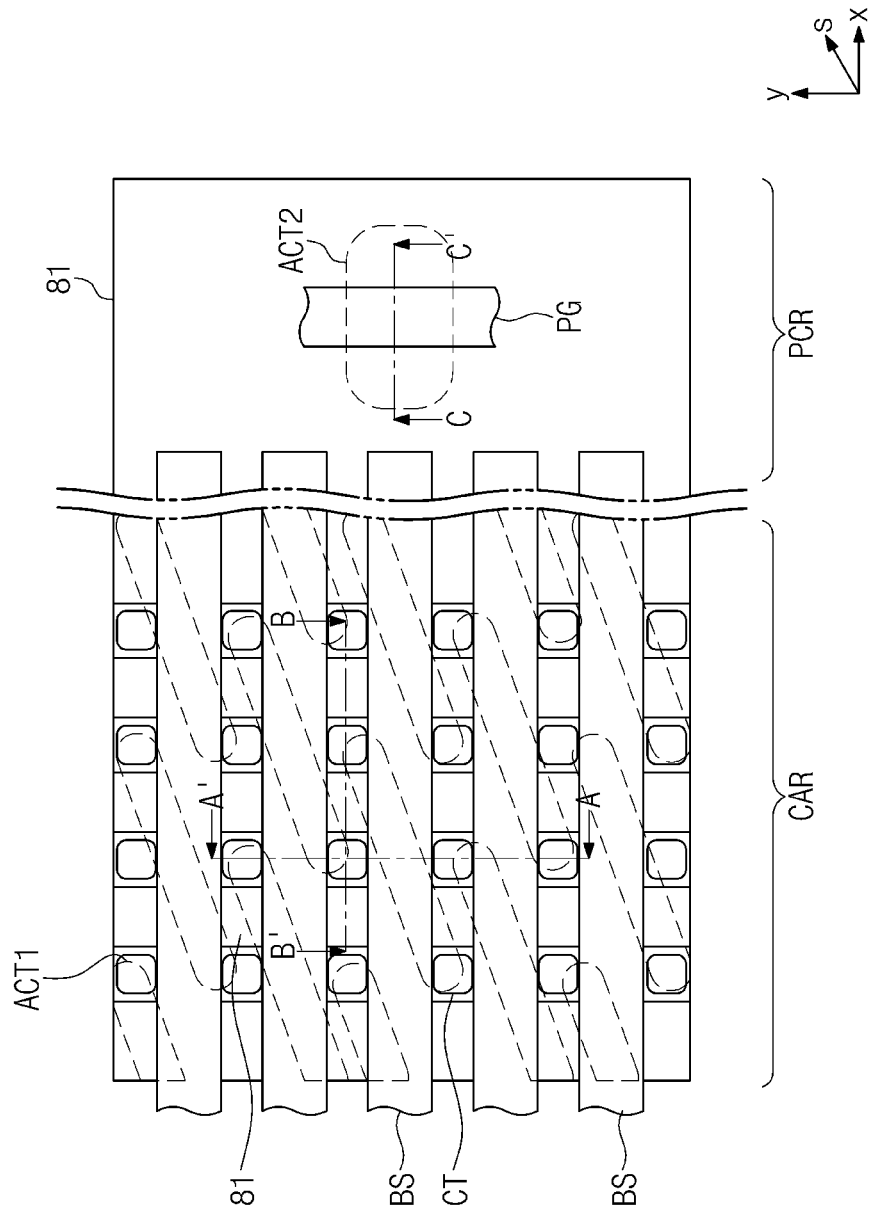
Figure 23B:
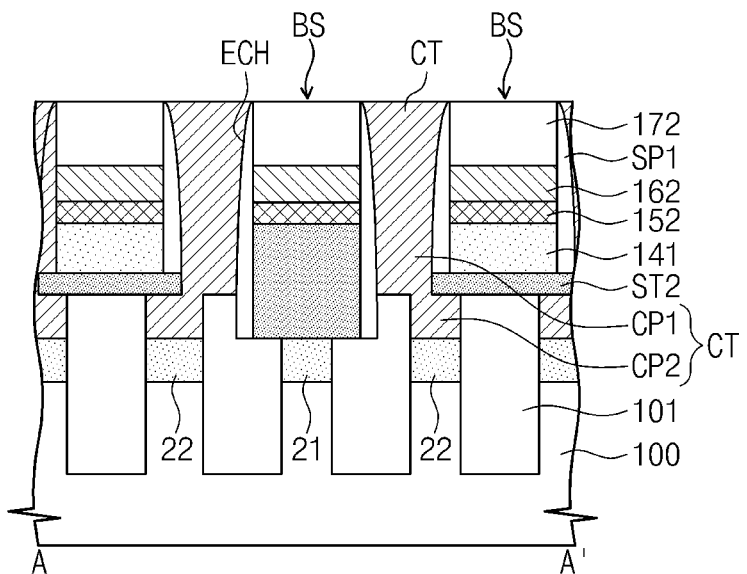
Figure 23C:
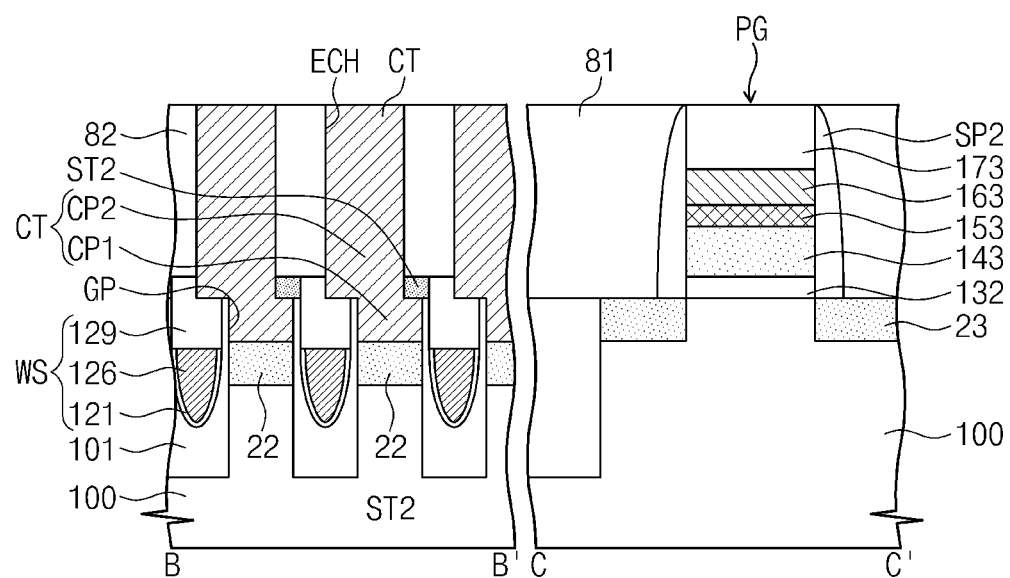

Referring to FIGS. 23A, 23B, and 23C, the contact structures CT may be formed to fill the contact holes ECH. The contact structures CT may be formed by forming a conductive layer to fill the contact holes ECH and performing an etch-back process. After the formation of the contact structures CT, the mask pattern 61 may be removed from the peripheral circuit region PCR. The contact structures CT may include at least one of a doped polysilicon layer, metals, conductive metal nitride layers, or metal-semiconductor compounds. Due to the presence of the gap regions GP, the contact structures CT may be formed to have a uniform contact area with the second impurity regions 22.

Figure 24A:
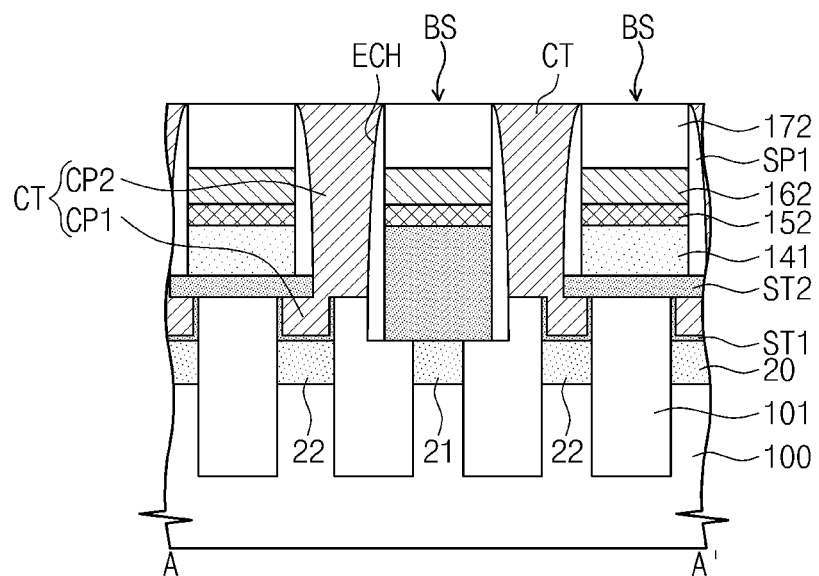
FIGS. 24A and 24B are sectional views illustrating semiconductor devices according to example embodiments of inventive concepts.
Figure 24B:
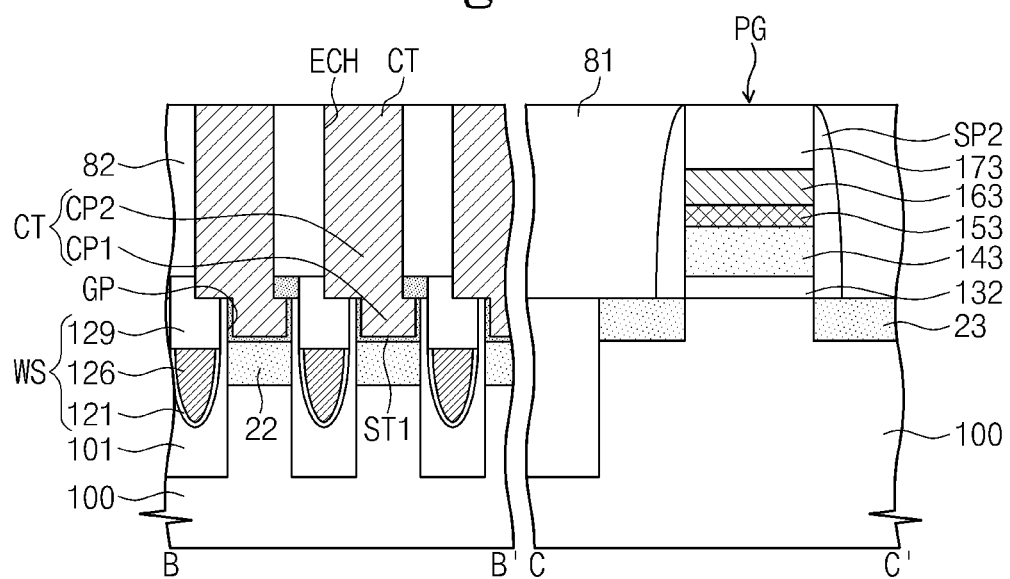

FIGS. 24A and 24B are sectional views illustrating semiconductor devices according to example embodiments of inventive concepts. Here, FIG. 24A is a sectional view taken along line A-A' of FIG. 23A, and FIG. 24B is a sectional view taken along lines B-B' and C-C' of FIG. 23A. For the sake of brevity, the elements and features of this example that are similar to those previously shown and described will not be described in much further detail.

In example embodiments, the removal of the first etch stop pattern ST1 described with reference to FIGS. 22A, 22B, and 22C may be omitted, and the first etch stop pattern ST1 may remain between the contact structures CT and the second impurity regions 22. For example, the first etch stop pattern ST1 may include at least one of metals, conductive metal nitrides, or metal-silicon compounds.

FIGS. 25A through 29A are plan views illustrating methods of fabricating a semiconductor device according to example embodiments of inventive concepts, FIGS. 25B through 29B are sectional views taken along line A-A' of FIGS. 25A through 29A, respectively, and FIGS. 25C through 29C are sectional views taken along lines B-B' and C-C' of FIGS. 25A through 29A, respectively.

Figure 25A:
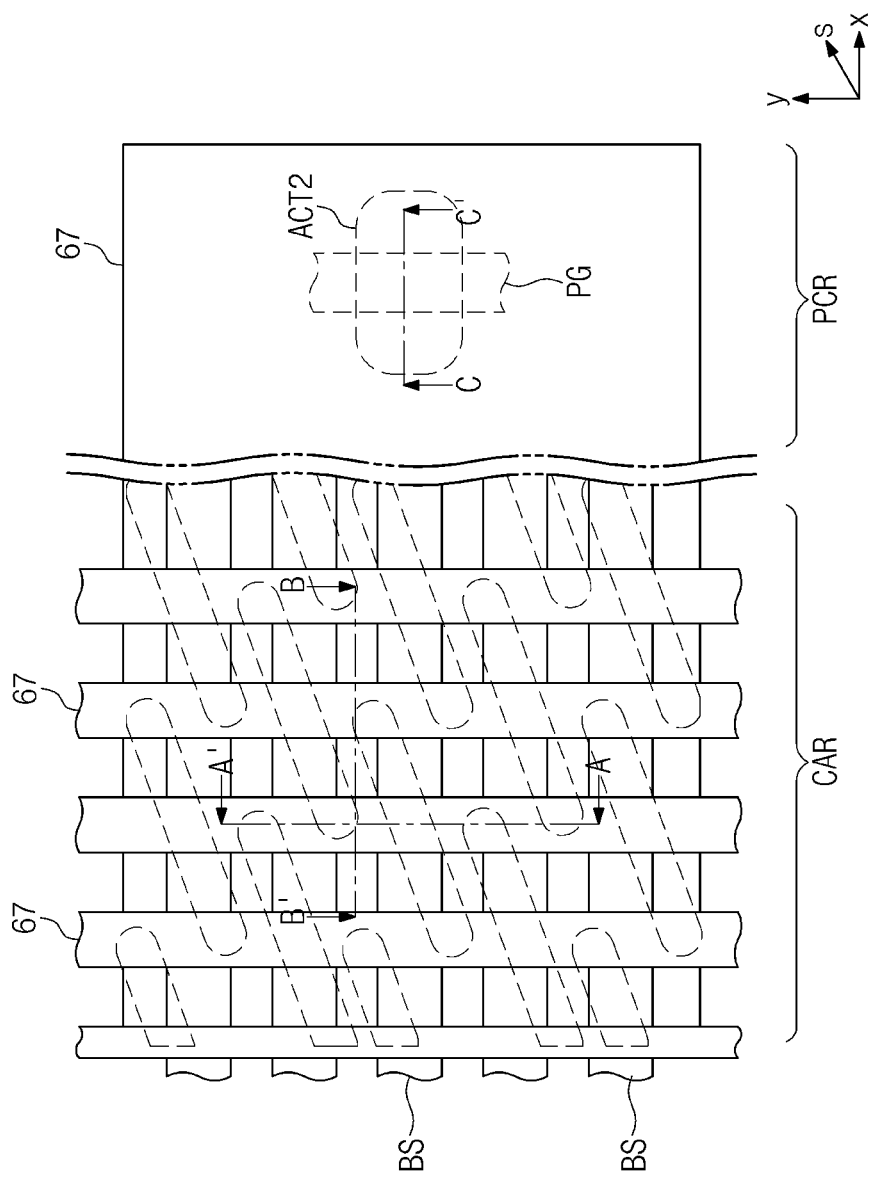
Figure 25B:
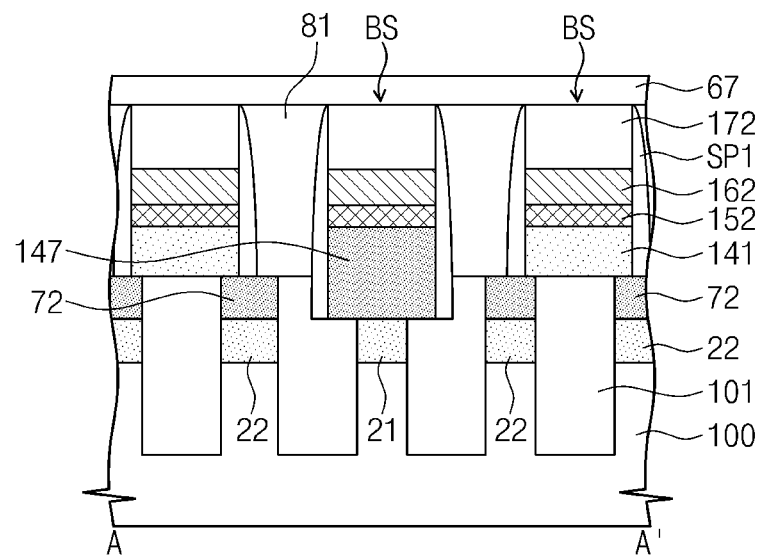
Figure 25C:
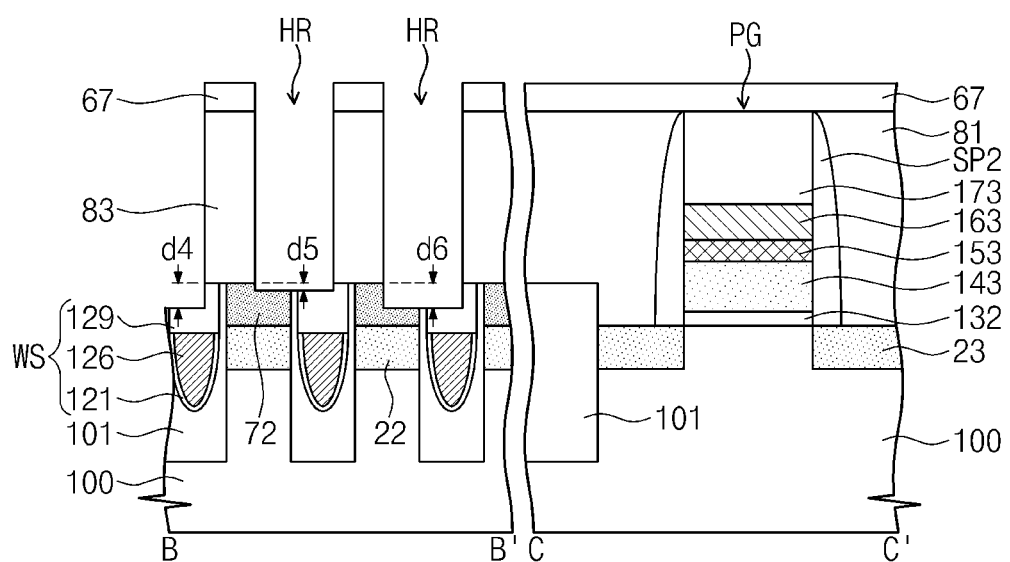

Referring to FIGS. 25A, 25B, and 25C, first interlayered insulating patterns 83 may be formed between the bit line structures BS. The formation of the first interlayered insulating patterns 83 may include forming a first interlayered insulating layer 81 to cover the bit line structures BS and the peripheral gate structure PG described with reference to FIGS. 8A, 8B, and 8C, and then, etching the first interlayered insulating layer 81 using mask patterns 67, which may be formed parallel to the word line structures WS, as an etch mask. The mask patterns 67 may cover the peripheral gate structure PG, and the first interlayered insulating layer 81 may remain on the peripheral circuit region PCR. Hole regions HR may be formed by the etching process. The hole regions HR may be delimited by sidewalls of the bit line structures BS and a sidewall of the first interlayered insulating pattern 83. At least some of the hole regions HR may be formed to have a different depth from others of the hole regions HR. For example, a distance from the top surfaces of the gate capping patterns 129 to the top surfaces of the second sacrificial patterns 72 exposed by the hole regions HR may have several different values (e.g., d4, d5, and d6, where d4>d6>d5), as shown in FIG. 25C.

Figure 26A:
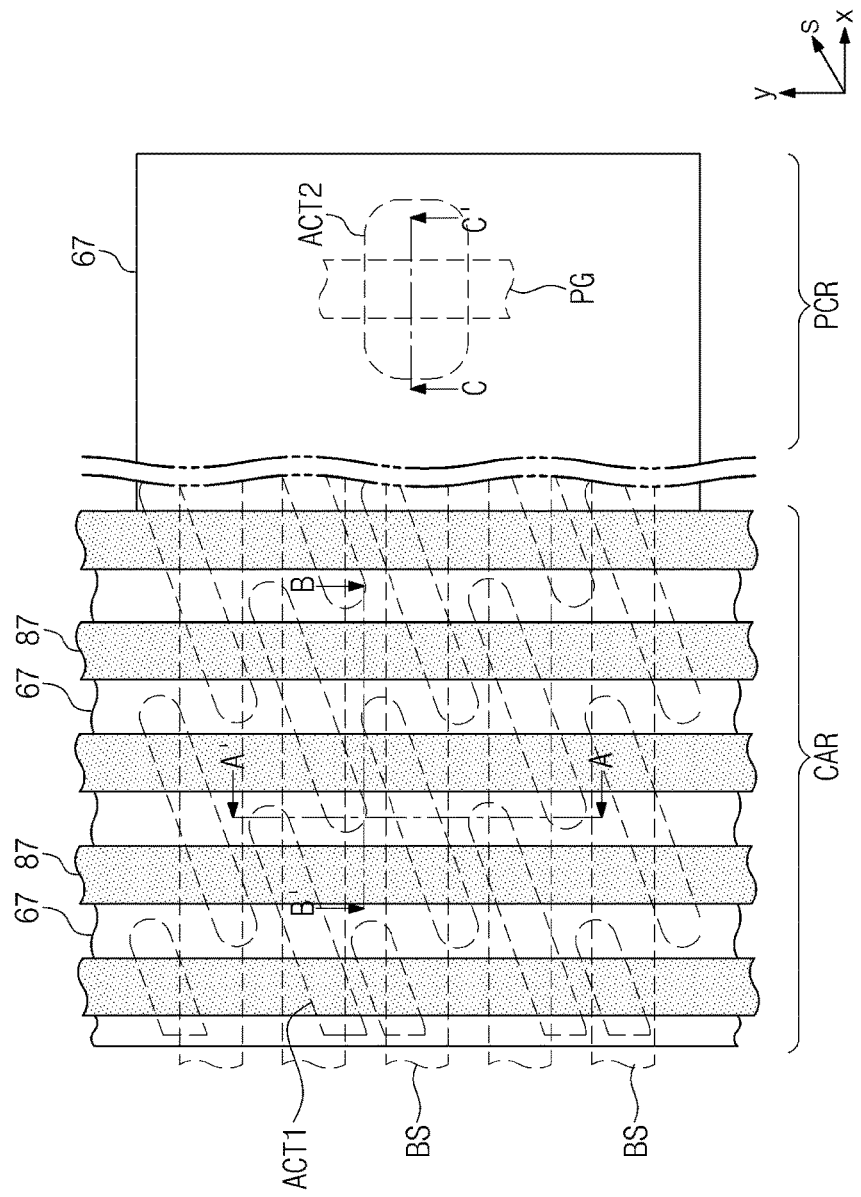
Figure 26B:
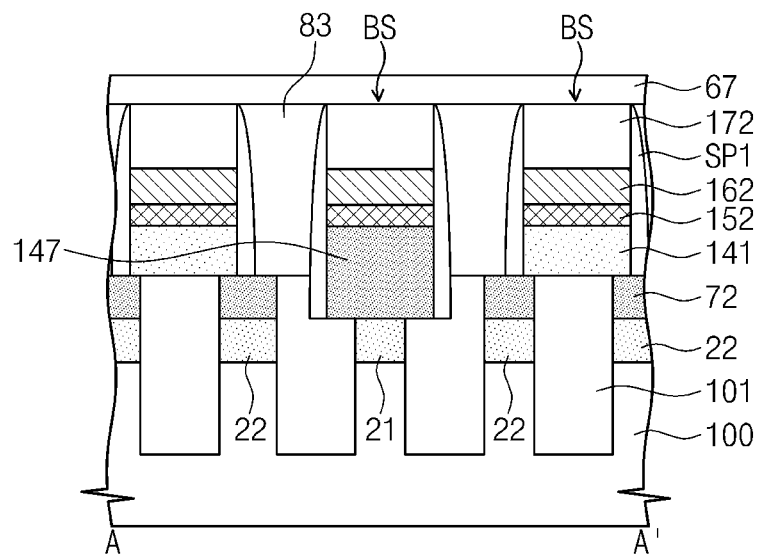
Figure 26C:
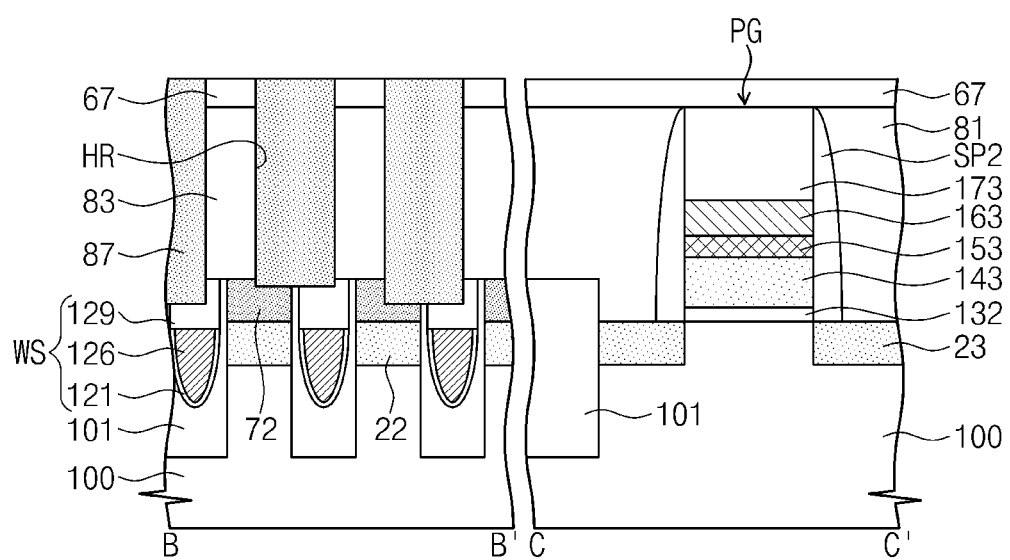

Referring to FIGS. 26A, 26B, and 26C, gap-filling patterns 87 may be formed to extend between the mask patterns 67 and fill the hole regions HR. The gap-filling patterns 87 may be formed of a material having an etch selectivity with respect to the first interlayered insulating patterns 83. For example, in the case where the first interlayered insulating patterns 83 include a silicon oxide layer, the gap-filling patterns 87 may include a silicon nitride or a silicon oxynitride. The formation of the gap-filling patterns 87 may include forming an insulating layer to fill the hole regions HR, and performing a planarization process to expose the mask patterns 67.

Figure 27A:
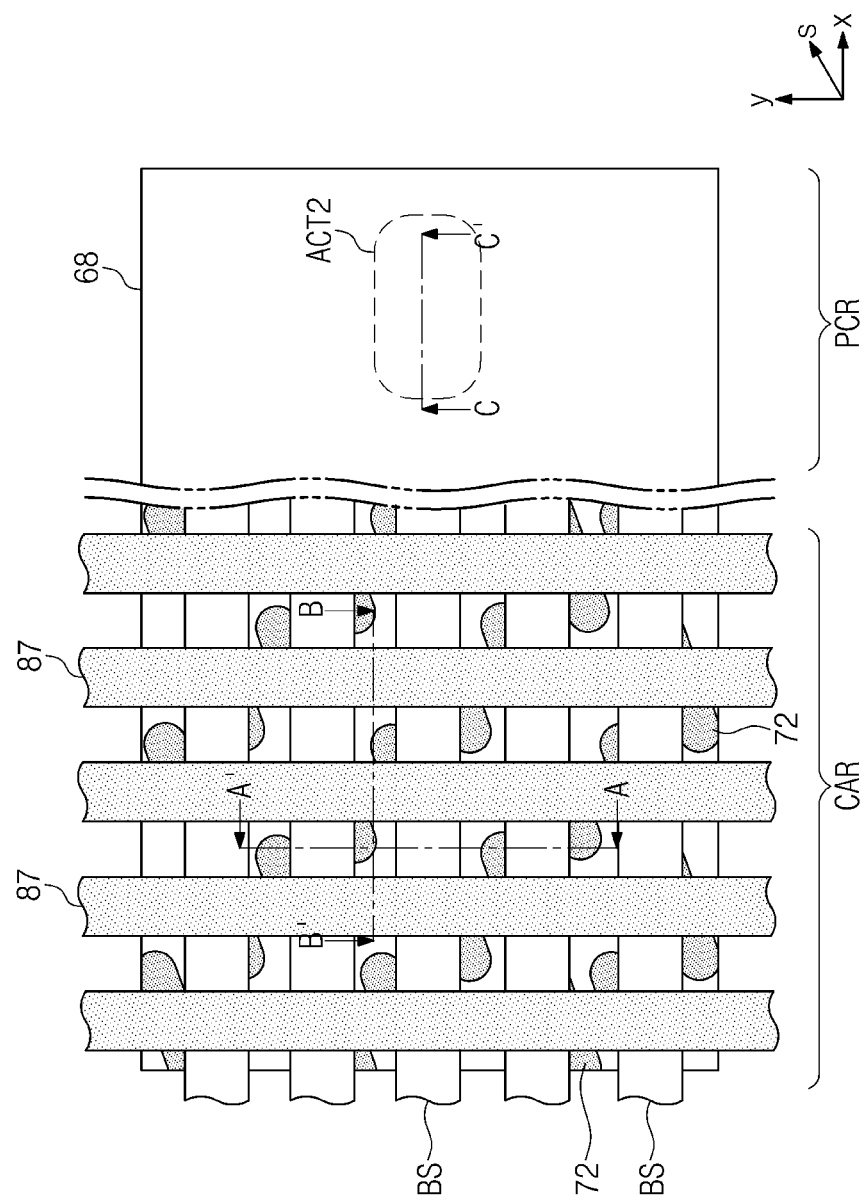
Figure 27B:
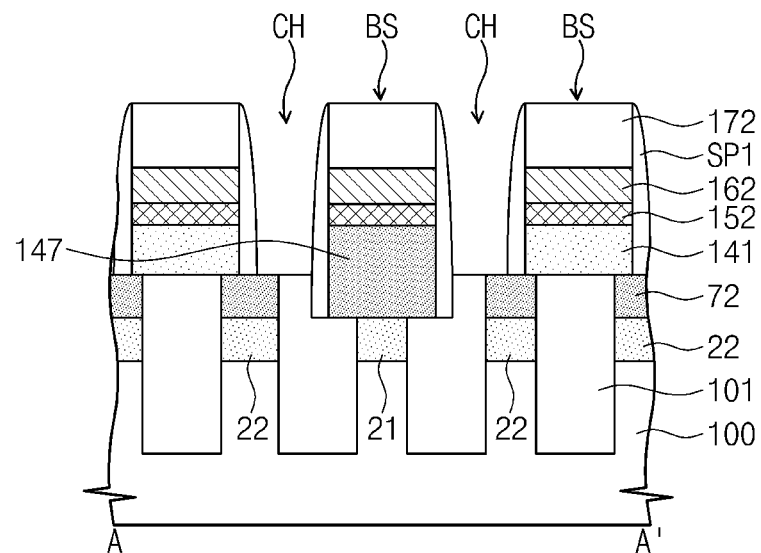
Figure 27C:
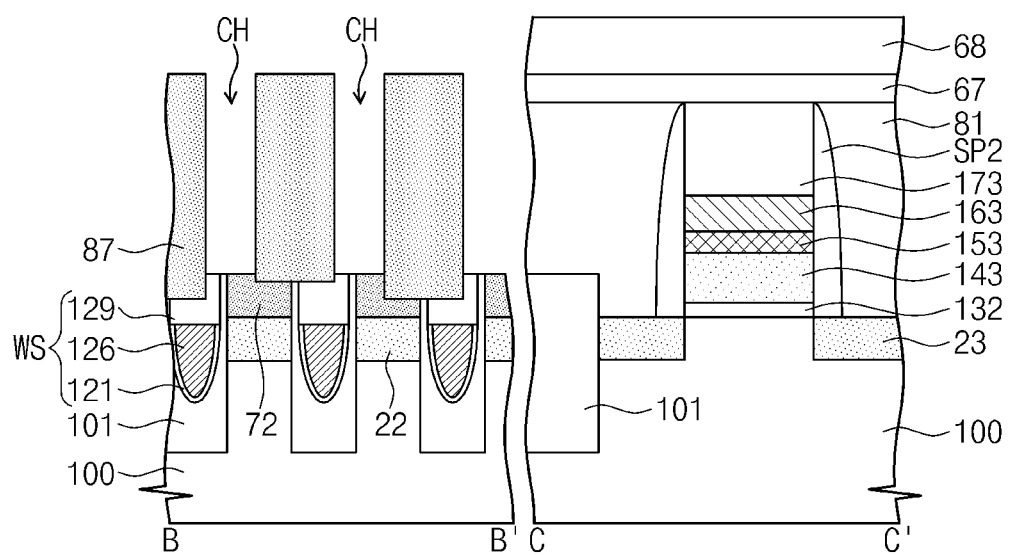

Referring to FIGS. 27A, 27B, and 27C, a mask pattern 68 may be formed on the peripheral circuit region PCR, and then, the first interlayered insulating patterns 83 may be selectively removed from the cell array region CAR. As the result of the removal of the first interlayered insulating patterns 83, preliminary contact holes CH may be formed to expose the second sacrificial patterns 72.

Figure 28B:
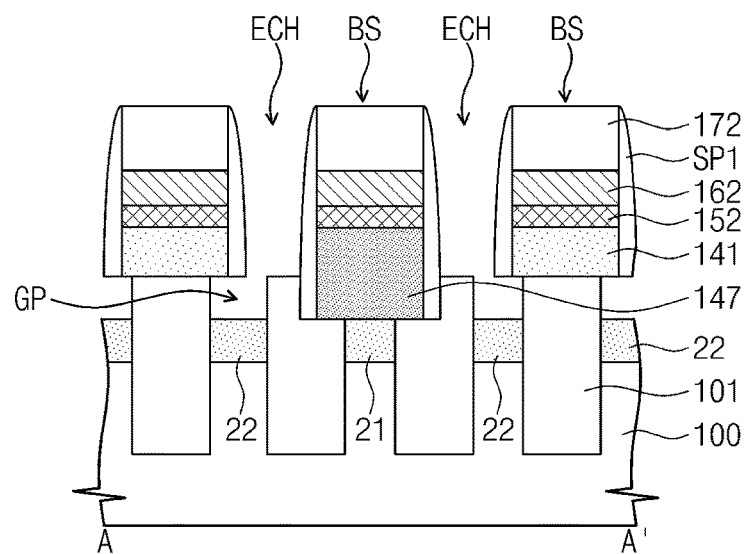
Figure 28C:
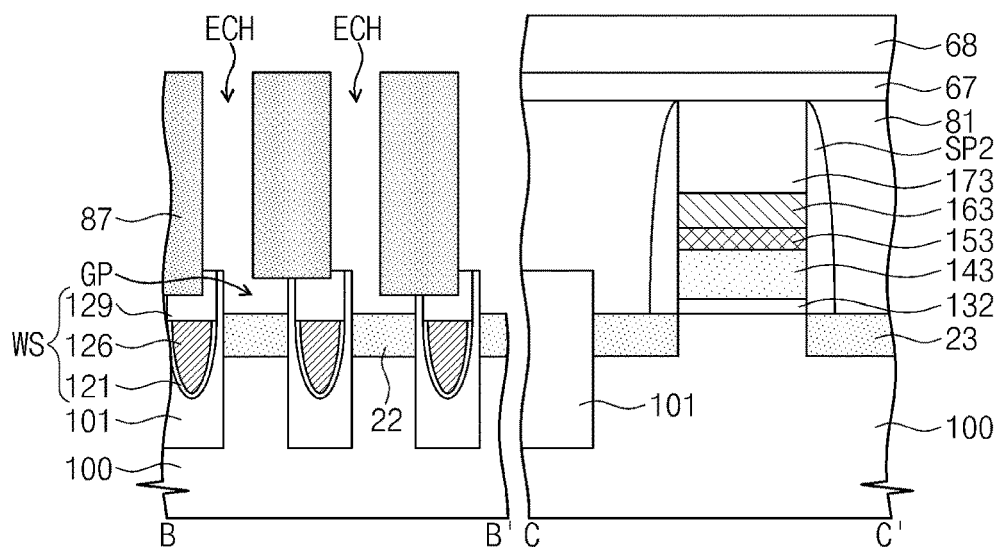

Referring to FIGS. 28A, 28B, and 28C, the second sacrificial patterns 72 exposed by the preliminary contact holes CH may be removed to form the gap regions GP exposing the second impurity regions 22. The gap regions GP may be delimited by the sidewall of the device isolation layer 101 and the top surfaces of the second impurity regions 22. As the result of the formation of the gap regions GP, the preliminary contact holes CH may extend toward the substrate 100 and form the contact holes ECH. The removal of the second sacrificial patterns 72 may include a selective etching process. For example, the selective etching process of the second sacrificial patterns 72 may be performed using an etching solution or an etching gas capable of suppressing the substrate 100 and the device isolation layer 101 from being etched and of selectively removing the second sacrificial patterns 72. For example, in the case where the second sacrificial patterns 72 include silicon-germanium, the selective removal of the second sacrificial patterns 72 may be performed using an etching solution containing peracetic acid. The etching solution may further contain hydrofluoric acid (HF) solution and deionized water. In example embodiments, in the case where the second sacrificial patterns 72 include a silicon nitride layer, the selective removal of the second sacrificial patterns 72 may be performed using an etching solution containing phosphoric acid ($H_3PO_4$).

Figure 29A:
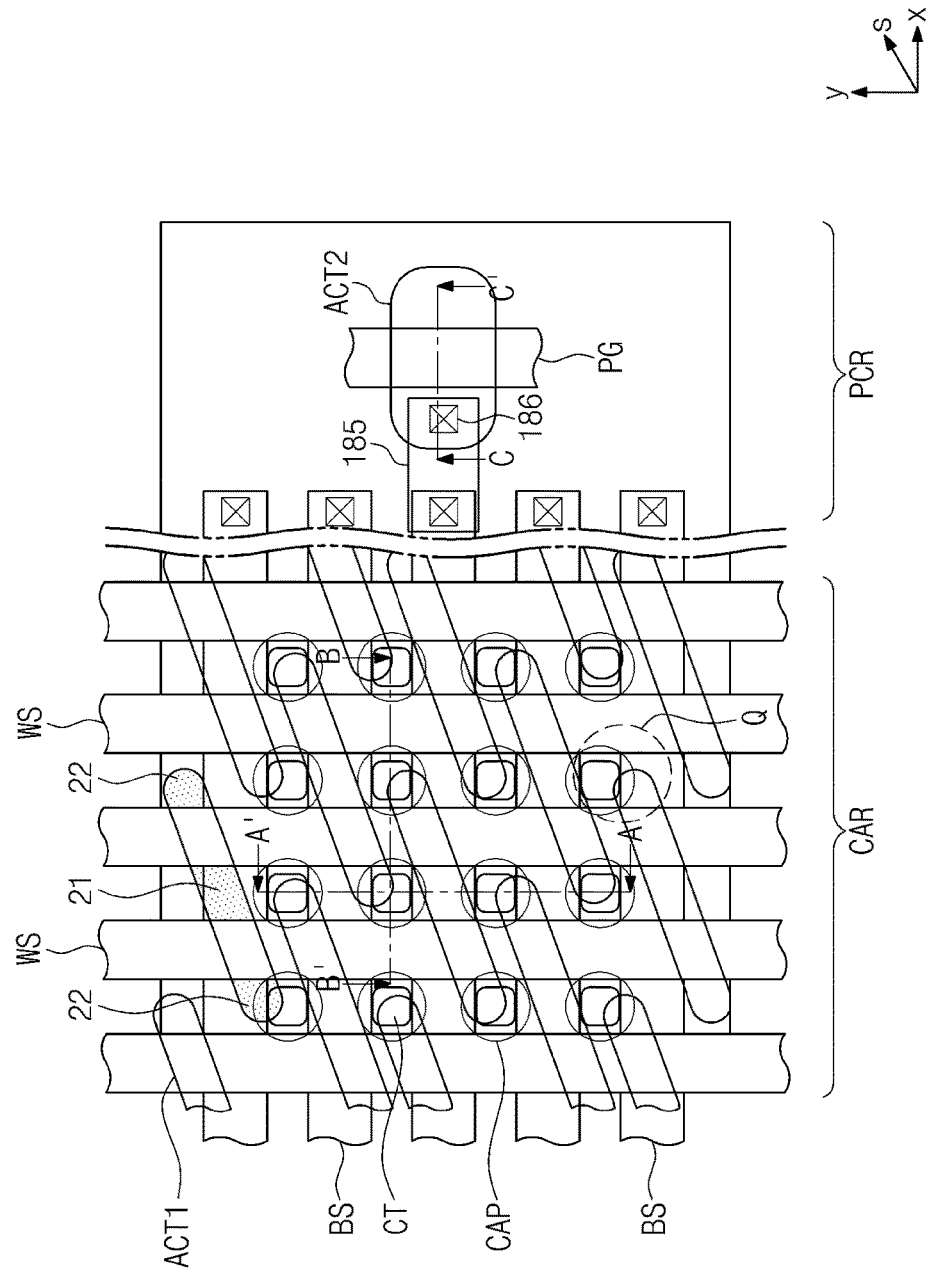
Figure 29B:
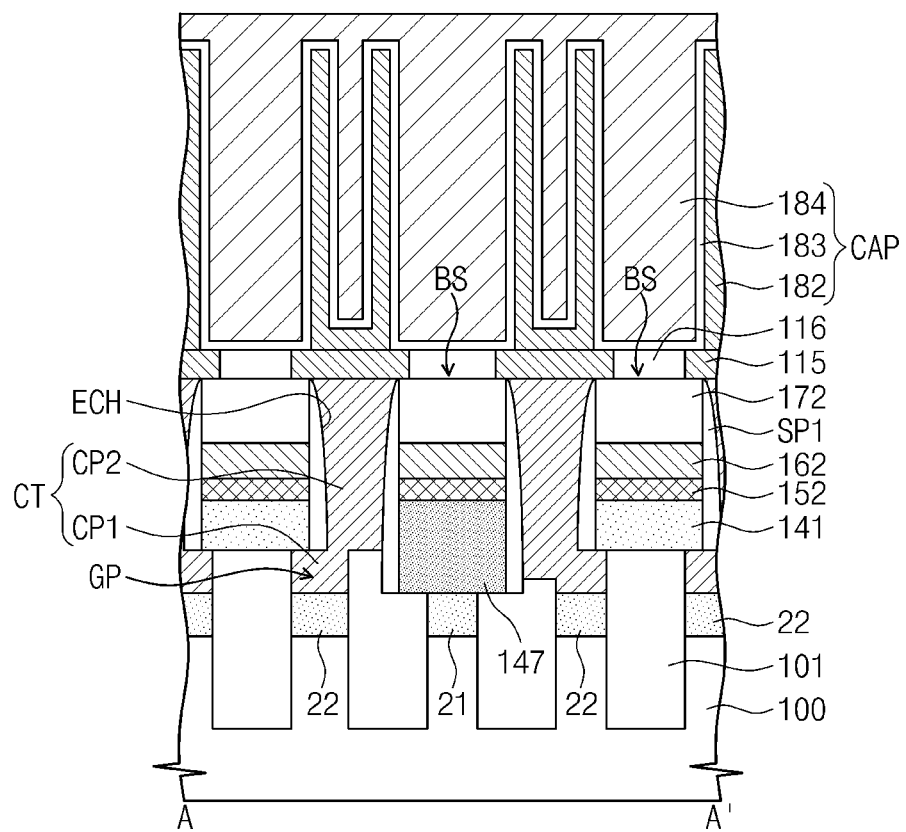
Figure 29C:
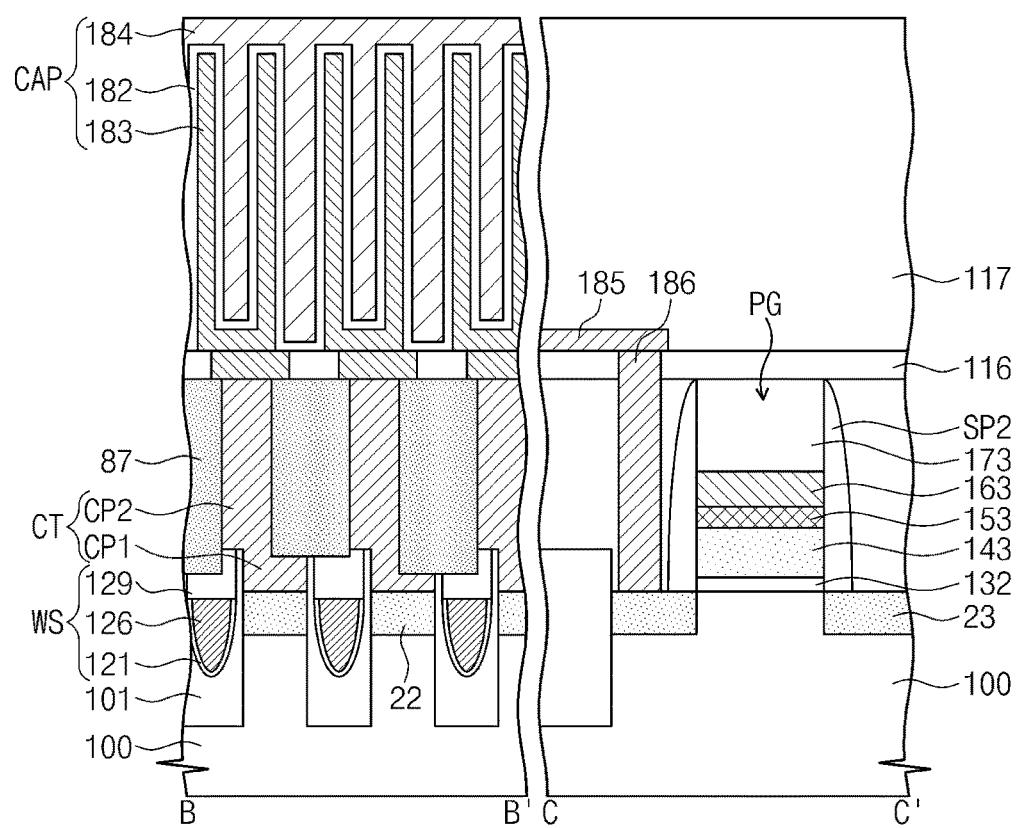

Referring to FIGS. 29A, 29B, and 29C, the contact structures CT may be formed to fill the contact holes ECH. The contact structures CT may be formed by forming a conductive layer to fill the contact holes ECH and performing an etch-back process. After the formation of the contact structures CT, the mask patterns 67 and 68 may be removed from the peripheral circuit region PCR. The contact structures CT may include at least one of a doped polysilicon layer, metals, conductive metal nitride layers, or metal-semiconductor compounds. Due to the presence of the gap regions GP, the contact structures CT may be formed to have a uniform contact area with the second impurity regions 22.

The second interlayered insulating layer 116 may be formed to cover the bit line structures BS and the peripheral gate structure PG, and the contact pads 115 may be connected to the contact structures CT through the second interlayered insulating layer 116. The contact pads 115 may be formed on a corresponding one of the contact structures CT and be separated from each other.

The peripheral contact 186 may be formed to be connected to a third impurity region 23 of the peripheral circuit region PCR. The peripheral contact 186 may be formed to connect the peripheral conductive line 185 provided on the second interlayered insulating layer 116 electrically to the third impurity region 23. The peripheral conductive line 185 may be electrically connected to the bit line structures BS, but example embodiments of inventive concepts may not be limited thereto.

The third interlayered insulating layer 117 may be formed on the second interlayered insulating layer 116, and then, the lower electrodes 182 may be formed through the third interlayered insulating layer 117 and be connected to the contact pads 115. In example embodiments, each of the lower electrodes 182 may be shaped like a bottom-closed cylinder. The dielectric layer 183 and the upper electrode 184 may be sequentially formed on the lower electrodes 182. The lower electrodes 182, the dielectric layer 183 and the upper electrode 184 may constitute the capacitors CAP serving as memory elements of the semiconductor device.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and a wafer-level processed stack package (WSP) technique. The package in which the semiconductor memory device according to example embodiments is mounted may further include at least one semiconductor device (e.g., a controller and/or a logic device) that controls the semiconductor memory device.

Figure 30:
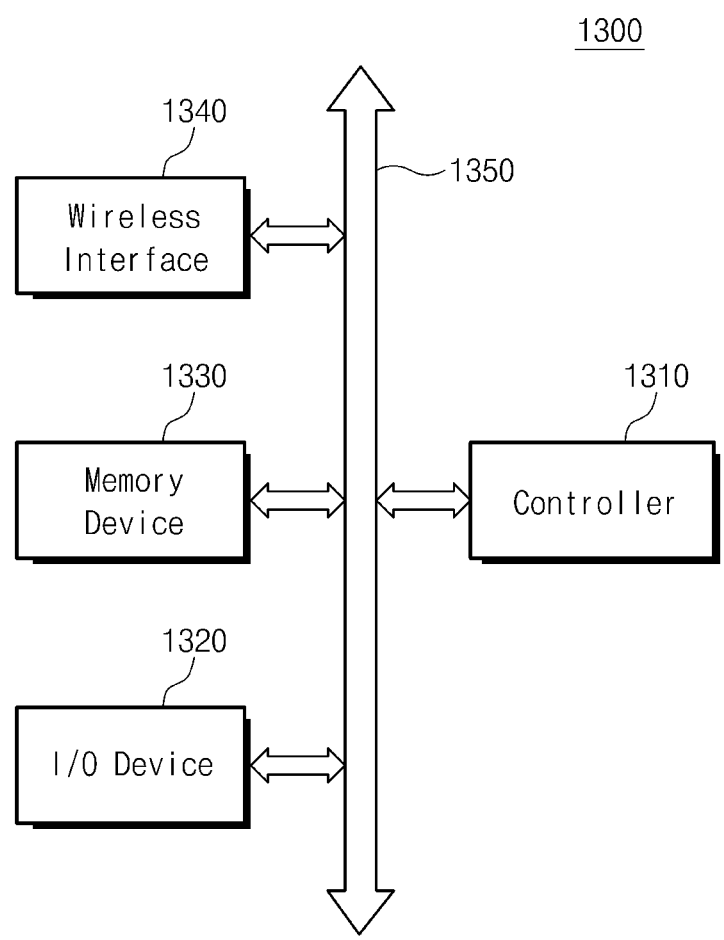
FIG. 30 is a block diagram schematically illustrating electronic devices including a semiconductor device according to example embodiments of inventive concepts.

FIG. 30 is a block diagram schematically illustrating electronic devices including a semiconductor device according to example embodiments of inventive concepts.

Referring to FIG. 30, an electronic device 1300 including a semiconductor device according to example embodiments of inventive concept may be used in one of a personal digital assistant (PDA), a laptop computer, a mobile computer, a web tablet, a wireless phone, a cell phone, a digital music player, a wire or wireless electronic device, or a complex electronic device including at least two ones thereof. The electronic device 1300 may include a controller 1310, an input/output device 1320 such as a keypad, a keyboard, a display, a memory 1330, and a wireless interface 1340 that are combined to each other through a bus 1350. The controller 1310 may include, for example, at least one microprocessor, a digital signal process, a microcontroller or the like. The memory 1330 may be configured to store a command code to be used by the controller 1310 or a user data. The memory 1330 may include a semiconductor device including a vertical channel transistor according to example embodiments of inventive concept. The electronic device 1300 may use a wireless interface 1340 configured to transmit data to or receive data from a wireless communication network using a RF signal. The wireless interface 1340 may include, for example, an antenna, a wireless transceiver and so on. The electronic system 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth.

Figure 31:
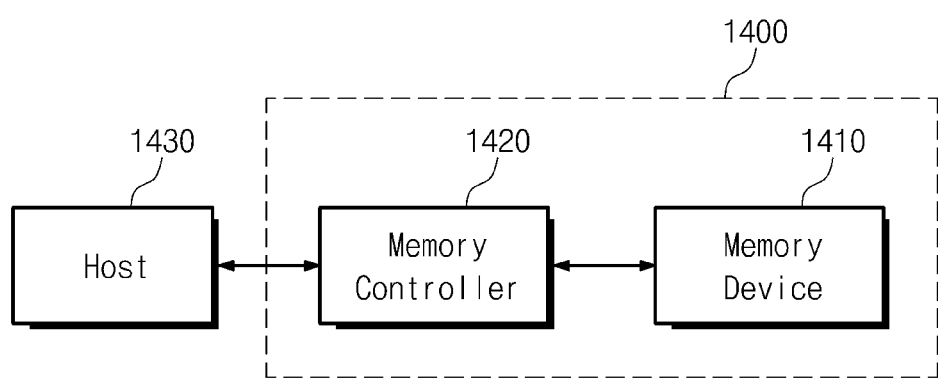
FIG. 31 is a block diagram schematically illustrating memory systems including a semiconductor device according to example embodiments of inventive concepts.

FIG. 31 is a block diagram schematically illustrating memory systems including a semiconductor device according to example embodiments of inventive concepts.

Referring to FIG. 31, a memory system including a semiconductor device according to example embodiments of inventive concept will be described. The memory system 1400 may include a memory device 1410 for storing huge amounts of data and a memory controller 1420. The memory controller 1420 controls the memory device 1410 so as to read data stored in the memory device 1410 or to write data into the memory device 1410 in response to a read/write request of a host 1430. The memory controller 1420 may include an address mapping table for mapping an address provided from the host 1430 (e.g., a mobile device or a computer system) into a physical address of the memory device 1410. The memory device 1410 may be a semiconductor device including a vertical channel transistor according to example embodiments of inventive concepts.

According to example embodiments of inventive concepts, it is possible to realize a semiconductor device with improved electric characteristics.

While some example embodiments of inventive concepts have been particularly shown and described, it will be understood by one of ordinary skill in the art that variations in form and detail may be made therein without departing from the spirit and scope of the attached claims.

What is claimed is:
1. A semiconductor device comprising:
a substrate having a device isolation layer delimiting an active region, the active region including a first impurity region and a second impurity region;
a first cell gate structure buried in the substrate and crossing the active region between the first impurity region and the second impurity region, the first cell gate structure including a gate conductive layer and a capping layer on the gate conductive layer;
a plurality of first contact structures, each of the plurality of first contact structures connected to the second impurity region; and
an interlayer insulating pattern on the device isolation layer between adjacent ones of the plurality of first contact structures, wherein a topmost surface of the capping layer is higher than a top surface of the second impurity region, wherein the capping layer includes a recessed portion; and wherein each of the plurality of first contact structures is disposed on the recessed portion.

2. The semiconductor device of claim 1, wherein a topmost surface of the device isolation layer is higher than the top surface of the second impurity region.

3. The semiconductor device of claim 2, wherein each of the plurality of first contact structures comprise:
   a first portion that fills a gap region delimited by a sidewall of the device isolation layer and the top surface of the second impurity region, and
   a second portion on the device isolation layer such that the second portion overlaps the device isolation layer in a plan view, and
   wherein the first portion and the second portion are formed of a same material.

4. The semiconductor device of claim 3, wherein a width of the second portion is wider than a width of the first portion.

5. The semiconductor device of claim 2, wherein the topmost surface of the capping layer is coplanar with the topmost surface of the device isolation layer.

6. The semiconductor device of claim 1, wherein the recessed portion is formed partially at one side of the capping layer.

7. The semiconductor device of claim 1, wherein each of the plurality of first contact structures is monolithic.

8. The semiconductor device of claim 1, wherein each of the plurality of first contact structures partially overlaps the gate conductive layer.

9. The semiconductor device of claim 8, wherein each of the plurality of first contact structures partially overlaps the device isolation layer.

10. The semiconductor device of claim 1, further comprising:
    a capacitor connected to the first contact structure; and
    a bit line structure connected to the first impurity region and extending in a direction crossing the first cell gate structure.

11. The semiconductor device of claim 10, wherein the bit line structure comprises a conductive pattern on the first impurity region.

12. The semiconductor device of claim 1, wherein a width of each of the plurality of first contact structures below the topmost surface of the capping layer is wider than a width of each of the plurality of first contact structures above the topmost surface of the capping layer.

* * * * *